(12) United States Patent
Takaku

(10) Patent No.: US 9,601,705 B2
(45) Date of Patent: Mar. 21, 2017

(54) MATERIAL FOR ORGANIC ELECTROLUMINESCENCE ELEMENT AND ORGANIC ELECTROLUMINESCENCE ELEMENT USING THE SAME, AND METHOD FOR MANUFACTURING ORGANIC ELECTROLUMINESCENCE ELEMENT

(75) Inventor: Koji Takaku, Ashigarakami-gun (JP)

(73) Assignee: UDC Ireland Limited, Dublin (IE)

( * ) Notice: Subject to any disclaimer, the term of this patent is extended or adjusted under 35 U.S.C. 154(b) by 1163 days.

(21) Appl. No.: 13/638,737

(22) PCT Filed: Mar. 30, 2011

(86) PCT No.: PCT/JP2011/058055
§ 371 (c)(1),
(2), (4) Date: Oct. 1, 2012

(87) PCT Pub. No.: WO2011/125756
PCT Pub. Date: Oct. 13, 2011

(65) Prior Publication Data
US 2013/0033174 A1    Feb. 7, 2013

(30) Foreign Application Priority Data

Mar. 31, 2010   (JP) .................................. 2010-084541

(51) Int. Cl.

| H01L 51/54 | (2006.01) |
|---|---|
| C09K 11/06 | (2006.01) |
| H01L 51/00 | (2006.01) |
| H05B 33/10 | (2006.01) |
| H01L 51/52 | (2006.01) |
| H01L 51/50 | (2006.01) |

(52) U.S. Cl.
CPC .......... *H01L 51/0087* (2013.01); *C09K 11/06* (2013.01); *H01L 51/0076* (2013.01); *H01L 51/5293* (2013.01); *H05B 33/10* (2013.01); *C09K 2211/1007* (2013.01); *C09K 2211/1011* (2013.01); *C09K 2211/1029* (2013.01); *C09K 2211/1044* (2013.01); *C09K 2211/1048* (2013.01); *C09K 2211/185* (2013.01); *H01L 51/5016* (2013.01)

(58) Field of Classification Search
CPC .................................................. H01L 51/0076
See application file for complete search history.

(56) References Cited

U.S. PATENT DOCUMENTS

| 2002/0038860 | A1 | 4/2002 | Tsuboyama et al. |
| 2003/0034722 | A1* | 2/2003 | Tsuboyama et al. .. C09K 11/06 313/311 |
| 2006/0182992 | A1 | 8/2006 | Nii et al. |
| 2006/0204787 | A1 | 9/2006 | Sano et al. |
| 2009/0128008 | A1 | 5/2009 | Ise et al. |
| 2009/0174324 | A1 | 7/2009 | Nii et al. |
| 2009/0261721 | A1 | 10/2009 | Murakami et al. |

FOREIGN PATENT DOCUMENTS

| EP | 2 460 788 A1 | 6/2012 |
| JP | 10-321371 A | 12/1998 |
| JP | 2002-043056 A | 2/2002 |
| JP | 2005-082702 A | 3/2005 |
| JP | 2005-099248 A | 4/2005 |
| JP | 2005-099481 A | 4/2005 |
| JP | 2005-310733 A | 11/2005 |
| JP | 2007-019462 A | 1/2007 |
| JP | 2007-096255 A | 4/2007 |
| JP | 2007-133279 A | 5/2007 |
| JP | 2009-283891 A | 12/2009 |
| JP | 2011-046699 A | 3/2011 |
| WO | WO 2011/030883 A1 * | 3/2011 |

OTHER PUBLICATIONS

Lussem, G., et al., "Liquid Crystalline Materials for Light-emitting Diodes," Polymers for Advanced Technologies, Jul. 1998, pp. 443-460, vol. 9, No. 7.

* cited by examiner

*Primary Examiner* — Marie R. Yamnitzky
(74) *Attorney, Agent, or Firm* — Riverside Law LLP

(57) ABSTRACT

A material for organic electroluminescence element, including: a phosphorescent compound; and a discotic liquid-crystalline host compound, wherein the phosphorescent compound has an aspect ratio of molecule core diameter to molecule core thickness (molecule core diameter/molecule core thickness) of at least 3, and wherein a size ratio of the molecular radius of the phosphorescent compound to the molecular radius of the discotic liquid-crystalline host compound (molecular radius of the phosphorescent compound/molecular radius of the discotic liquid-crystalline host compound) is 0.8 to 1.2.

11 Claims, 1 Drawing Sheet

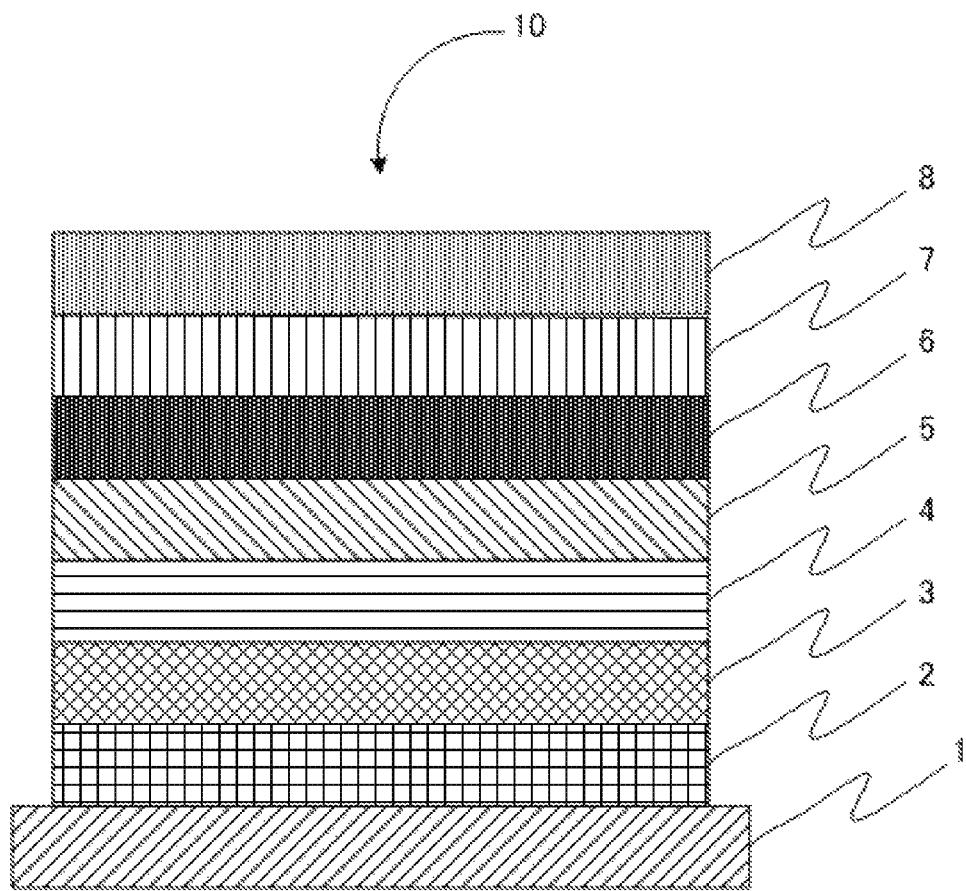

MATERIAL FOR ORGANIC ELECTROLUMINESCENCE ELEMENT AND ORGANIC ELECTROLUMINESCENCE ELEMENT USING THE SAME, AND METHOD FOR MANUFACTURING ORGANIC ELECTROLUMINESCENCE ELEMENT

CROSS REFERENCE TO RELATED APPLICATIONS

This application is a National Stage of International Application No. PCT/JP2011/058055, filed on Mar. 30, 2011, which claims priority from Japanese Patent Application No. 2010-084541, filed on Mar. 31, 2010, the contents of all of which are incorporated herein by reference in their entirety.

TECHNICAL FIELD

The present invention relates to a material for organic electroluminescence element, an organic electroluminescence element (may also be referred to as "organic electric field light-emitting element" or "organic EL element") using the same, and a method for manufacturing an organic electroluminescence element.

BACKGROUND ART

An organic electroluminescence element is a self-luminous display device and used for display or lighting. A display using an organic electroluminescence element is advantageous in terms of display performance such as high visibility and low viewing-angle dependency compared to conventional CRT or LCD. The display is also advantageous because it may be lighter and thinner.

In addition to advantages of reduced weight and thickness, there is a possibility that lighting of a shape which has not been able to be implemented may be implemented with an organic electroluminescence element.

As described above, an organic electroluminescence element has excellent features including those above. However, in general, layers constituting an organic electroluminescence element have a refractive index higher than air. For example, organic layers such as light-emitting layer in an organic electroluminescence element have a refractive index of 1.6 to 2.1. Thus, light emitted tends to be reflected totally at an interface. The light extraction efficiency is less than 20%, and most of the light is lost.

For example, a generally known organic electroluminescence element is configured with an organic layer allocated between a pair of electrode layers on a substrate. This organic layer includes a light-emitting layer, and the organic electroluminescence element extracts light emitted from this light-emitting layer and emits the light from a light extracting surface. In this case, it is not possible to extract the total reflection component, which is a light of the critical angle or more at the light-emitting surface or an interface between the electrode layer and the organic layer. Thus, there is a problem of low light extraction efficiency.

In order to solve such a problem, a method to improve light extraction efficiency has been proposed by employing a liquid-crystalline host material to control the shape of a light-emitting compound itself and orientation of the light-emitting compound (Non-patent literature 1).

In this proposal, however, a rod-like fluorescent material is used in order to increase polarization emission ratio, and Forster energy transfer (fluorescent resonance energy transfer) and reabsorption of emitted light occur due to uniaxial orientation thereof, which causes a problem of decreased light emission efficiency. Also, electrical exciton formation efficiency of the fluorescent material is low at about 25%. As a result, these is also a problem that external quantum efficiency cannot be improved.

To solve these problems, PTLs 1 to 3 propose a light-emitting element in which a phosphorescent material that no reduction of light emission efficiency due to Forster energy transfer occurs in principle is used as a phosphorescent light-emitting compound, which is oriented with a liquid-crystalline host material.

In these proposals, however, there is a problem that polarized emission ratio and luminescent quantum yield decrease.

Accordingly, it is the current situation that prompt development of an organic electroluminescence element which supports high luminous efficiency, high polarized emission ratio, high external quantum efficiency and high luminescent quantum yield at the same time is strongly desired.

CITATION LIST

Patent Literatures

PTL 1 Japanese Patent Application Laid-Open (JP-A) No 10-321371
PTL 2 JP-A 2002-43056
PTL 3 JP-A 2011-046699

Non-Patent Literature

NPL 1 Polymers for Advanced Technologies, 9, 443-460 (1998)

SUMMARY OF INVENTION

Technical Problem

The present invention aims at solving the above conventional problems and achieves the following objects. That is, the present invention aims at providing: a material for organic electroluminescence element which supports high luminous efficiency, high polarized emission ratio, high external quantum efficiency and high luminescent quantum yield at the same time; an organic electroluminescence element using the same; and a method for manufacturing an organic electroluminescence element.

Solution to Problem

The Means for Solving the Problems are as Follows:
<1> A material for organic electroluminescence element, including:
a phosphorescent compound; and
a discotic liquid-crystalline host compound,
wherein the phosphorescent compound has an aspect ratio of molecule core diameter to molecule core thickness (molecule core diameter/molecule core thickness) of at least 3, and
wherein a size ratio of a molecular radius of the phosphorescent compound to a molecular radius of the discotic liquid-crystalline host compound (molecular radius of the phosphorescent compound/molecular radius of the discotic liquid-crystalline host compound) is 0.8 to 1.2.

<2> The material for organic electroluminescence element according to <1>, wherein the phosphorescent compound is a platinum complex.

<3> The material for organic electroluminescence element according to any one of <1> to <2>, wherein the discotic liquid-crystalline host compound is represented by General Formula (1):

General Formula (1)

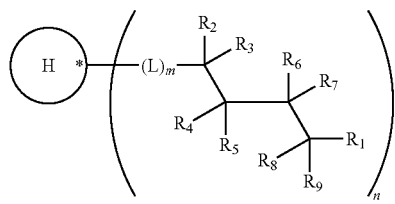

where, in General Formula (1), H represents a mother nucleus portion of liquid crystal; L represents a divalent linking group; $R_1$ to $R_9$ represent a hydrogen atom or a substituent; n represents an integer of 1 to 12; and m represents an integer of 0 to 3.

<4> The material for organic electroluminescence element according to any one of <1> to <3>, wherein the discotic liquid-crystalline host compound develops a discotic-nematic liquid-crystalline phase.

<5> The material for organic electroluminescence element according to any one of <1> to <4>, wherein the phosphorescent compound is at least any one represented by any one selected from Structural Formulae (1) to (5):

Structural Formula (1)

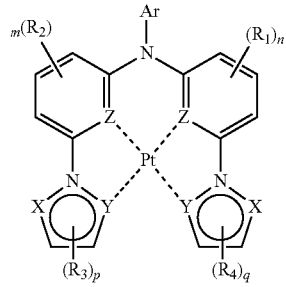

where, in Structural Formula (1), each of X, Y and Z represents a carbon atom or a nitrogen atom; any one of Z and Y is a nitrogen atom, and X is a carbon atom when Y is a nitrogen atom; each of m, n, p and q represents an integer of 0 to 3; $R_1$ to $R_4$ represent any one of an alkyl group, an aryl group, an alkoxy group, an aryloxy group, a fluorine atom, a cyano group, a silyl group and a heterocyclic group; when m, n, p or q is two or more, neighboring $R_1$, $R_2$, $R_3$ or $R_4$ may respectively connect to each other to form a ring structure; and Ar represents a substituted or unsubstituted aryl group, Structural Formula (2)

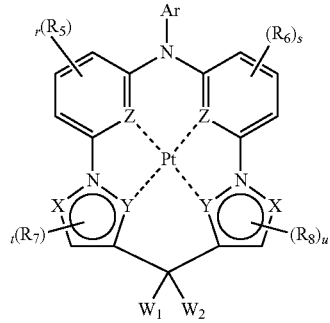

where, in Structural Formula (2), each of X, Y and Z represents any one of a carbon atom and a nitrogen atom; any one of Z and Y is a nitrogen atom, and X is a carbon atom when Y is a nitrogen atom; each of r, s, t and u represents an integer of 0 to 3; $R_5$ to $R_8$ represent any one of an alkyl group, an aryl group, an alkoxy group, an aryloxy group, a fluorine atom, a cyano group, a silyl group and a heterocyclic group; when r, s, t or u is two or more, neighboring $R_5$, $R_6$, $R_7$ or $R_5$ may respectively connect to each other to form a ring structure; and $W_1$ and $W_2$ represent an alkyl group and may bind with each other to form a ring structure, Structural Formula (3)

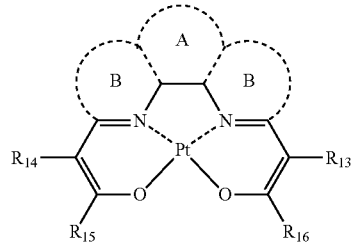

where, in Structural Formula (3), A and B represent a ring structure; when A forms a ring, B may or may not form a ring; when A does not form a ring, B forms a ring; A represents any one of an aromatic ring and a hetero ring, and B represents any one of a hetero ring and a heteroaryl; $R_{13}$ to $R_{16}$ represent any one of a hydrogen atom, an alkyl group, an aryl group, a silyl group and a heterocyclic ring; and $R_{14}$ and $R_{15}$, or $R_{13}$ and $R_{16}$, respectively, may bind with each other to form a ring structure;

Structural Formula (4)

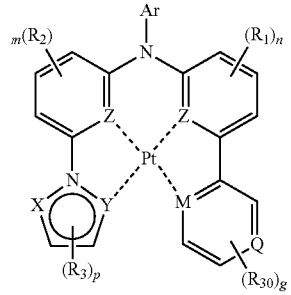

where, in Structural Formula (4), $R_1$ to $R_3$, X, Y, Z, Ar, m, n and p are synonymous to those in Structural Formula (1); M and Q independently represent any one of a carbon atom and a nitrogen atom; $R_{30}$ represents any one of an alkyl group, an aryl group, an alkoxy group, an aryloxy group, a fluorine atom, a cyano group, a silyl group and a heterocyclic group; and g represents an integer of 0 to 3, Structural Formula (5)

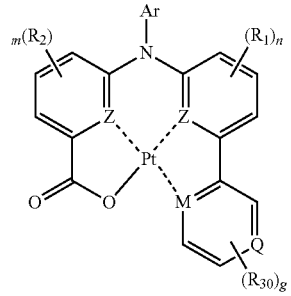

where, in Structural Formula (5), $R_1$ to $R_2$, Z, Ar, m and n are synonymous to those in Structural Formula (1), and M, Q, $R_{30}$ and g are synonymous to those in Structural Formula (4).

<6> The material for organic electroluminescence element according to any one of <1> to <5>, wherein the phosphorescent compound is represented by Structural Formula (6):

Structural Formula (6)

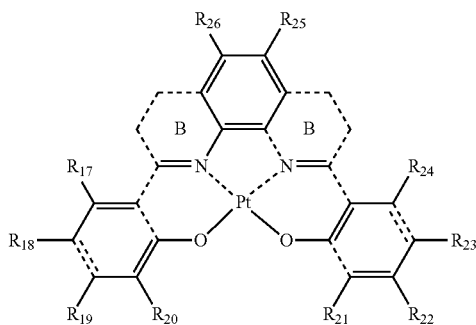

where, in Structural Formula (6), B may form any one of an aromatic ring and non-aromatic six-membered ring; $R_{17}$ to $R_{26}$ represent any one of an alkyl group, an aryl group, an alkoxy group, an aryloxy group, a fluorine atom, a cyano group, a silyl group and a heterocyclic group; $R_{17}$ and $R_{18}$, or $R_{18}$ and $R_{19}$, or $R_{19}$ and $R_{20}$, or $R_{21}$ and $R_{22}$, or $R_{22}$ and $R_{23}$, or $R_{23}$ and $R_{24}$, or $R_{25}$ and $R_{26}$, respectively, may bind with each other to form a ring structure.

<7> An organic electroluminescence element, including:
an anode,
a cathode, and
a light-emitting layer between the anode and the cathode,
wherein the light-emitting layer includes the material for organic electroluminescence element according to any one of <1> to <6>,
wherein the phosphorescent compound has a transition dipole moment oriented horizontally with respect to the anode.

<8> The organic electroluminescence element according to <7>, wherein the light-emitting layer includes a fluorine atom containing compound with an amount of 0.0001% by mass to 10% by mass.

<9> The organic electroluminescence element according to <8>, wherein the fluorine atom containing compound includes 3 or more side-chain substituents each having 4 or more fluorine atoms.

<10> The organic electroluminescence element according to any one of <8> to <9>, wherein the fluorine atom containing compound is represented by any one of Structural Formulae (A) and (B):

Structural Formula (A)

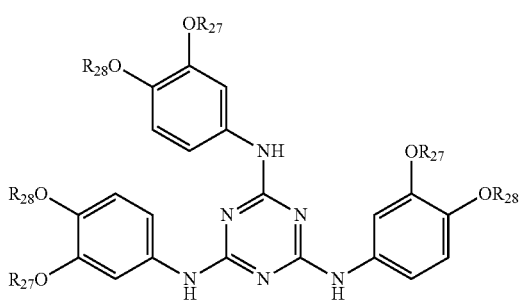

where, in Structural Formula (A), $R_{27}$ and $R_{28}$ independently represent a substituted or unsubstituted alkyl group having 4 or more fluorine atoms each having 4 or more fluorine atoms, Structural Formula (B)

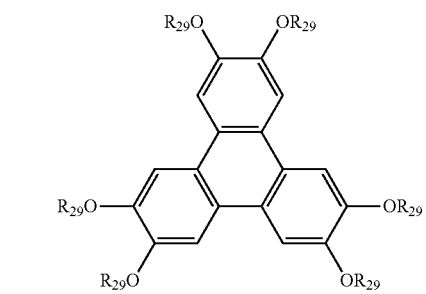

where, in Structural Formula (B), $R_{29}$ represents any one of a substituted or unsubstituted alkyl group and an acyl group each having 4 or more fluorine atoms.

<11> A method for manufacturing an organic electroluminescence element, including forming a light-emitting layer by a solution method using the material for organic electroluminescence element according to any one of <1> to <6>.

Advantageous Effects of Invention

According to the present invention, the above conventional problems are solved, the objects are achieved, and a material for organic electroluminescence element which supports high luminous efficiency, high polarized emission ratio, high external quantum efficiency and high luminescent quantum yield at the same time, an organic electroluminescence element using the same, and a method for manufacturing an organic electroluminescence element are provided.

BRIEF DESCRIPTION OF DRAWINGS

FIG. 1 is a schematic diagram showing one example of a layer structure of an organic electroluminescence element of the present invention.

DESCRIPTION OF EMBODIMENTS

Material for Organic Electroluminescence Element

The material for organic electroluminescence element of the present invention includes a phosphorescent compound and a discotic liquid-crystalline host compound, and further contains other compounds according to necessity.

<Phosphorescent Compound>

The phosphorescent compound has an aspect ratio of molecule core diameter to molecule core thickness (molecule core diameter/molecule core thickness) of at least 3, preferably 3 to 30, and particularly preferably 4 to 20.

The aspect ratio of less than 3 increases molecular fluctuation and may reduce orientation. The aspect ratio exceeding 30 may reduce extremely the solubility to a discotic liquid-crystalline host compound or reduce orientation.

The molecule core diameter means the longest molecule diameter of a chromophore (chromophore connected with conjugated system, chromogenic skeleton).

The molecule core diameter is defined based on theoretical calculation as follows. The theoretical calculation here is performed using density functional approach; specifically, structural optimization calculation is performed using GAUSSIAN 03 (Gaussian, Inc. of the United States) with basis function of 6-31G* and exchange-correlation function of B3LYP/LANL2DZ. Using an optimized structure obtained by the structural optimization calculation, a length of a ball-and-stick image having the longest molecular length is defined as a molecule core diameter of the phosphorescent compound.

The molecule core thickness means a thickness of the molecule when the chromophore is considered as a planar surface.

The molecule core thickness is also calculated by a method similar to the molecule core diameter, and the molecule core thickness is defined as a length in a thickness direction of the molecule in a ball-and-stick image.

The phosphorescent compound has a molecular radius of preferably 0.40 nm to 3.0 nm, more preferably 0.80 nm to 2.5 nm, and particularly preferably 1.20 nm to 2.0 nm.

When the molecular radius is less than 0.40 nm, orientation or luminescence intensity in a liquid crystal is reduced, or emission wavelength may not be controlled to be within a visible range. When the molecular radius exceeds 3.0 nm, reduced orientation or reduced compatibility to liquid crystal during film formation may occur.

The molecular radius of a phosphorescent compound is defined as a radius of the molecule as a whole including side chains regarded as a disk.

Similarly to the molecule core diameter, the molecular radius is defined based on theoretical calculation as follows. The theoretical calculation here is performed using density functional approach; specifically, structural optimization calculation is performed using GAUSSIAN 03 (Gaussian, Inc. of the United States) with basis function of 6-31G* and exchange-correlation function of B3LYP/LANL2DZ. Using an optimized structure obtained by the structural optimization calculation, the molecular radius of the phosphorescent compound is obtained.

The phosphorescent compound is not particularly restricted as long as it satisfies the aspect ratio and may be appropriately selected according to purpose. Examples thereof include a complex containing a transition metal atom or a lanthanoid atom. These may be used alone or in combination or two or more.

The complex may contain one transition metal atom in a compound, or it may be a dinuclear complex containing two or more transition metal atoms. It may contain different types of metal atoms at the same time.

As ligands of the complex, there are exemplified ligands described in "Comprehensive Coordination Chemistry" authored by G. Wilkinson, published by Pergamon Press Ltd. in 1987, "Photochemistry and Photophysics of Coordination Compounds" authored by H. Yersin, published by Springer-Verlag Co. in 1987, and 37 *Yuhki Kinzoku Kagaku-Kiso To Ouyou* (Organic Metal Chemistry—Devices and Applications) authored by Akio Yamamoto, published by Shokabo Publishing Co., Ltd. in 1982.

Examples of the ligand include a halogen ligand, an aromatic carbon ring ligand, a nitrogen-containing heterocyclic ligand, a diketone ligand, a carboxylic acid ligand, an alcoholate ligand, a carbon monoxide ligand, an isonitryl ligand, and a cyano ligand. Among these, the nitrogen-containing heterocyclic ligand is particularly preferable.

Examples of the halogen ligand include a chlorine ligand.

Examples of the aromatic carbon ring ligand include a cyclopentadienyl anion, a benzene anion, and a naphthyl anion.

Examples of the nitrogen-containing heterocyclic ligand include phenylpyridine, benzoquinoline, quinolinol, bipyridyl, and phenanthroline.

Examples of the diketone ligand include acetylacetone.

Examples of the carboxylic acid ligand include an acetic acid ligand.

Examples of the alcoholate ligand include a phenolate ligand.

Examples of the transition metal atom include ruthenium, rhodium, palladium, tungsten, rhenium, osmium, iridium and platinum. Among these, platinum is particularly preferable, and a platinum complex is preferable as the phosphorescent compound. As the platinum complex, a platinum (platinum complex) having quadridantate ligand that is a flat coordination geometry is preferable, and a platinum complex having a salen-type, a porphyrin-type, a six-membered ring—five-membered ring—carbon linkage—five-membered ring—six-membered ring type or a five-membered ring—six-membered ring—N linkage—six-membered ring—five-membered ring type is more preferable.

The platinum complex is preferably selected from the phosphorescent compounds represented by Structural Formulae (1) to (5) below.

Structural Formula (1)

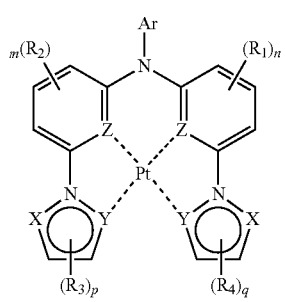

In Structural Formula (1), each of X, Y and Z represents a carbon atom or a nitrogen atom. Either Z or Y is a nitrogen atom, and X is a carbon atom when Y is a nitrogen atom.

Each of m, n, p and q represents an integer of 0 to 3. Among these, m is preferably 0 to 2, and more preferably 0 to 1; n is preferably 0 to 2, and more preferably 0 to 1; p is preferably 0 to 2, and more preferably 0 to 1; and q is preferably 0 to 2, and more preferably 0 to 1.

$R_1$ to $R_4$ represent an alkyl group, an aryl group, an alkoxy group, an aryloxy group, a fluorine atom, a cyano group, a silyl group or a heterocyclic group. Preferably, $R_1$ to $R_2$ represent an alkyl group, an aryl group, a fluorine atom, a cyano group or a silyl group, and $R_3$ to $R_4$ represent an alkyl group or an aryl group.

The alkyl group represents a substituted or unsubstituted alkyl group having 1 to 20 carbon atoms, and it may be of a straight-chain, branched or cyclic structure. As the alkyl group, the number of carbon atoms is preferably 1 to 12; specific examples thereof include a methyl group, an octyl group, a decyl group, a dodecyl group, a t-butyl group, a t-amyl group and an s-butyl group.

The aryl group represents a substituted or unsubstituted aryl group having 6 to 10 carbon atoms, and it may be condensed. Examples thereof include a phenyl group, a toluoyl group and a naphthyl group.

The alkoxy group represents a substituted or unsubstituted alkoxy group having 1 to 20 carbon atoms, and it may be of a straight-chain, branched or cyclic structure. As the alkoxy group, the number of carbon atoms is preferably 1 to 12; specific examples thereof include a methoxy group, an octyloxy group, a decyloxy group, a dodecyloxy group, an s-octyloxy group and a benzyloxy group.

The aryloxy group represents a substituted or unsubstituted aryloxy group having 6 to 10 carbon atoms; and it may be condensed. Examples thereof include a phenyloxy group, a toluoyloxy group and a naphthyloxy group.

The silyl group represents a silyl group substituted by substituents having 3 to 24 carbon atoms, which may be any one of a trialkylsilyl group, an aryldialkylsilyl group, an alkyldiarylsilyl group, and a triarylsilyl group. The silyl group preferably has 3 to 18 carbon atoms, and specific examples thereof include trimethylsilyl group, t-butyldimethylsilyl group, triphenylsilyl group and t-butyldiphenylsilyl group.

Among these, a straight-chain alkyl group and the substituents having an alkyl group as a substituent are preferable in view of aspect ratio.

When m, n, p or q is two or more, neighboring $R_1$, $R_2$, $R_3$ or $R_4$ may respectively connect to each other to form a ring structure.

Ar represents a substituted or unsubstituted aryl group. Examples thereof include a phenyl group, a toluoyl group and a naphthyl group.

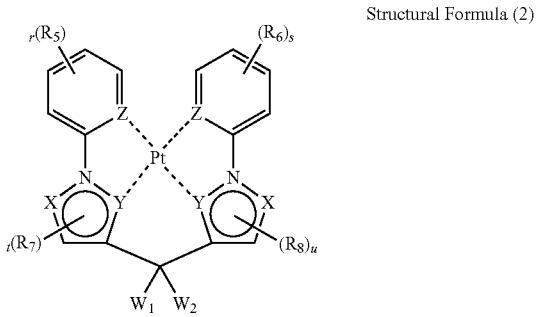

Structural Formula (2)

In Structural Formula (2), each of X, Y and Z represents a carbon atom or a nitrogen atom. Either Z or Y is a nitrogen atom, and X is a carbon atom when Y is a nitrogen atom.

Each of r, s, t and u represents an integer of 0 to 3. Among these, r is preferably 0 to 2, and more preferably 0 or 1; s is preferably 0 to 2, and more preferably 0 or 1; t is preferably 0 or 1; and u is preferably 0 or 1.

$R_5$ to $R_8$ represent an alkyl group, an aryl group, an alkoxy group, an aryloxy group, a fluorine atom, a cyano group, a silyl group or a heterocyclic group. Preferably, $R_5$ to $R_6$ represent an alkyl group, an aryl group, a fluorine atom, a cyano group or a silyl group, and $R_7$ to $R_8$ represent an alkyl group or an aryl group.

The alkyl group represents a substituted or unsubstituted alkyl group having 1 to 20 carbon atoms, and it may be of a straight-chain, branched or cyclic structure. As the alkyl group, the number of carbon atoms is preferably 1 to 12; specific examples thereof include a methyl group, an octyl group, a decyl group, a dodecyl group, a t-butyl group, a t-amyl group and an s-butyl group.

The aryl group represents a substituted or unsubstituted aryl group having 6 to 10 carbon atoms, and it may be condensed. Examples thereof include a phenyl group, a toluoyl group and a naphthyl group.

The alkoxy group represents a substituted or unsubstituted alkoxy group having 1 to 20 carbon atoms, and it may be of a straight-chain, branched or cyclic structure. As the alkoxy group, the number of carbon atoms is preferably 1 to 12; specific examples thereof include a methoxy group, an octyloxy group, a decyloxy group, a dodecyloxy group, an s-octyloxy group and a benzyloxy group.

The aryloxy group represents a substituted or unsubstituted aryloxy group having 6 to 10 carbon atoms; and it may be condensed. Examples thereof include a phenyloxy group, a toluoyloxy group and a naphthyloxy group.

The silyl group represents a silyl group substituted by substituents having 3 to 24 carbon atoms, which may be any one of a trialkylsilyl group, an aryldialkylsilyl group, an alkyldiarylsilyl group, and a triarylsilyl group. The silyl group preferably has 3 to 18 carbon atoms, and specific examples thereof include trimethylsilyl group, t-butyldimethylsilyl group, triphenylsilyl group and t-butyldiphenylsilyl group.

Among these, a straight-chain alkyl group and the substituents having a straight-chain alkyl group as a substituent are preferable in view of aspect ratio.

When r, s, t or u is two or more, neighboring $R_5$, $R_6$, $R_7$ or $R_8$ may respectively connect to each other to form a ring structure.

$W_1$ and $W_2$ represent an alkyl group having 1 to 10 carbon atoms, and they may bind with each other to form a ring structure.

Examples of the alkyl group include a methyl group, an ethyl group, an n-propyl group, an n-butyl group, a pentyl group, and a cyclohexyl cyclic structure. Among these, a cyclohexyl cyclic structure is preferable in terms of high aspect ratio.

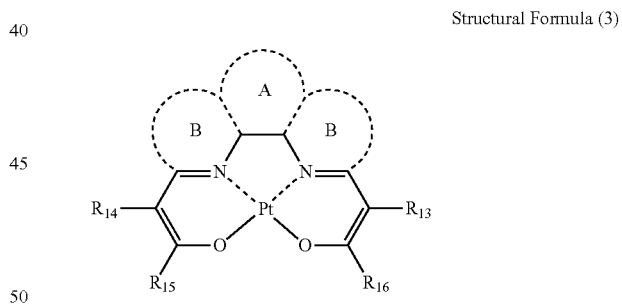

Structural Formula (3)

In Structural Formula (3), A and B represent a ring structure. When A forms a ring, B may or may not form a ring. When A does not form a ring, B forms a ring. A represents an aromatic ring or a hetero ring, and B represents a hetero ring or a heteroaryl. Preferable combinations of A and B are: A is a benzene ring, and B does not form a ring; A is a benzene ring, and B is a pyridine ring; or A does not form a ring, and B is a pyridine ring. $R_{13}$ to $R_{16}$ represent a hydrogen atom, an alkyl group, an aryl group, a silyl group or a heterocyclic ring. $R_{14}$ and $R_{15}$, or $R_{13}$ and $R_{16}$, respectively, may bind with each other to form a ring structure.

The ring structure, for example, is an aromatic ring in which $R_{13}$ and $R_{16}$, or $R_{14}$ and $R_{15}$, respectively, bind.

Among these, an aromatic ring that $R_{13}$ and $R_{16}$, or $R_{14}$ and $R_{15}$, respectively, bind is preferable in view of aspect ratio and molecular size.

Structural Formula (6) is a preferable aspect of Structural Formula (3).

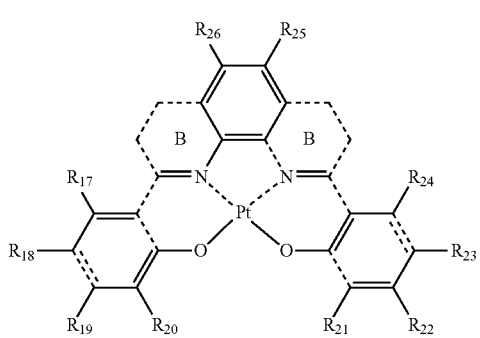

Structural Formula (6)

In Structural Formula (6), B may form any one of an aromatic ring and non-aromatic six-membered ring.

$R_{17}$ to $R_{26}$ represent an alkyl group, an aryl group, an alkoxy group, an aryloxy group, a fluorine atom, a cyano group, a silyl group or a heterocyclic group. $R_{17}$ and $R_{18}$, or $R_{18}$ and $R_{19}$, or $R_{19}$ and $R_{20}$, or $R_{21}$ and $R_{22}$, or $R_{22}$ and $R_{23}$, or $R_{23}$ and $R_{24}$, or $R_{25}$ and $R_{26}$, respectively, may bind with each other to form a ring structure.

$R_{17}$, $R_{20}$, $R_{21}$ and $R_{24}$ are preferably a hydrogen atom or an alkyl group. $R_{18}$, $R_{19}$, $R_{22}$ and $R_{23}$ represent an alkyl group, an alkoxy group, an aryl group, an aryloxy group, a fluorine atom, a cyano group or a silyl group. $R_{25}$ to $R_{26}$ represent a hydrogen atom, an alkyl group, a fluorine atom or an aromatic ring in which $R_{25}$ and $R_{26}$ bind.

The alkyl group represents a substituted or unsubstituted alkyl group having 1 to 20 carbon atoms, and it may be of a straight-chain, branched or cyclic structure. As the alkyl group, the number of carbon atoms is preferably 1 to 12; specific examples thereof include a methyl group, an octyl group, a decyl group, a dodecyl group, a t-butyl group, a t-amyl group and an s-butyl group.

The aryl group represents a substituted or unsubstituted aryl group having 6 to 10 carbon atoms, and it may be condensed. Examples thereof include a phenyl group, a toluoyl group and a naphthyl group.

The alkoxy group represents a substituted or unsubstituted alkoxy group having 1 to 20 carbon atoms, and it may be of a straight-chain, branched or cyclic structure. As the alkoxy group, the number of carbon atoms is preferably 1 to 12; specific examples thereof include a methoxy group, an octyloxy group, a decyloxy group, a dodecyloxy group, an s-octyloxy group and a benzyloxy group.

The aryloxy group represents a substituted or unsubstituted aryloxy group having 6 to 10 carbon atoms; and it may be condensed. Examples thereof include a phenyloxy group, a toluoyloxy group and a naphthyloxy group.

The silyl group represents a silyl group substituted by 3 to 24 carbon atoms, which may be any one of a trialkylsilyl group, an aryldialkylsilyl group, an alkyldiarylsilyl group, and a triarylsilyl group. The silyl group preferably has 3 to 18 carbon atoms, and specific examples thereof include trimethylsilyl group, t-butyldimethylsilyl group, triphenylsilyl group and t-butyldiphenylsilyl group.

Among these, a straight-chain alkyl group and the substituents having a straight-chain alkyl group as a substituent are preferable in view of aspect ratio.

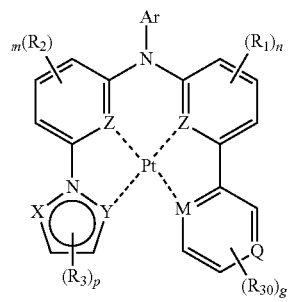

Structural Formula (4)

In Structural Formula (4), $R_1$ to $R_3$, X, Y, Z, Ar, m, n and p are synonymous to those in Structural Formula (1).

M and Q independently represent a carbon atom or a nitrogen atom. $R_{30}$ represents an alkyl group, an aryl group, an alkoxy group, an aryloxy group, a fluorine atom, a cyano group, a silyl group or a heterocyclic group.

Also, g represents an integer of 0 to 3, and preferably an integer of 0 to 2.

The alkyl group represents a substituted or unsubstituted alkyl group having 1 to 20 carbon atoms, and it may be of a straight-chain, branched or cyclic structure. As the alkyl group, the number of carbon atoms is preferably 1 to 12; specific examples thereof include a methyl group, an octyl group, a decyl group, a dodecyl group, a t-butyl group, a t-amyl group and an s-butyl group.

The aryl group represents a substituted or unsubstituted aryl group having 6 to 10 carbon atoms, and it may be condensed. Examples thereof include a phenyl group, a toluoyl group and a naphthyl group.

The alkoxy group represents a substituted or unsubstituted alkoxy group having 1 to 20 carbon atoms, and it may be of a straight-chain, branched or cyclic structure. As the alkoxy group, the number of carbon atoms is preferably 1 to 12; specific examples thereof include a methoxy group, an octyloxy group, a decyloxy group, a dodecyloxy group, an s-octyloxy group and a benzyloxy group.

The aryloxy group represents a substituted or unsubstituted aryloxy group having 6 to 10 carbon atoms; and it may be condensed. Examples thereof include a phenyloxy group, a toluoyloxy group and a naphthyloxy group.

The silyl group represents a silyl group substituted by substituents having 3 to 24 carbon atoms, which may be any one of a trialkylsilyl group, an aryldialkylsilyl group, an alkyldiarylsilyl group, and a triarylsilyl group. The silyl group preferably has 3 to 18 carbon atoms, and specific examples thereof include trimethylsilyl group, t-butyldimethylsilyl group, triphenylsilyl group and t-butyldiphenylsilyl group.

Among these, a straight-chain alkyl group and the substituents having a straight-chain alkyl group as a substituent are preferable in view of aspect ratio.

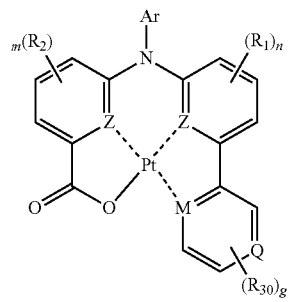

Structural Formula (5)

In Structural Formula (5), $R_1$ to $R_2$, Z, Ar, m and n are synonymous to those in Structural Formula (1), and M, Q, $R_{30}$ and g are synonymous to those in Structural Formula (4).
Among these, examples of the phosphorescent compound include, but are not limited to, the following.
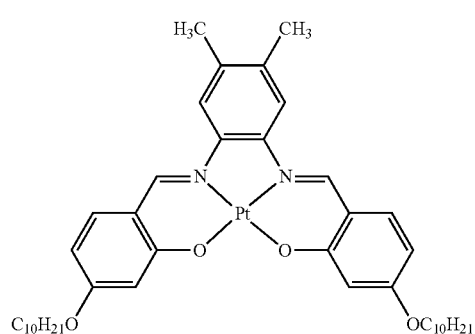
(1)
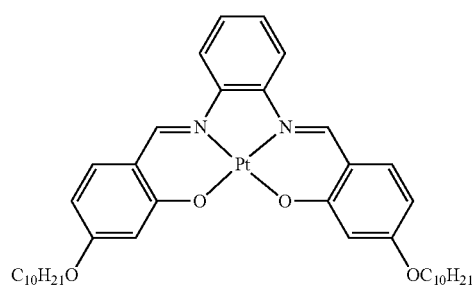
(3)
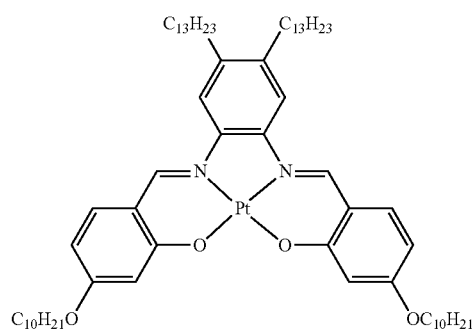
(4)
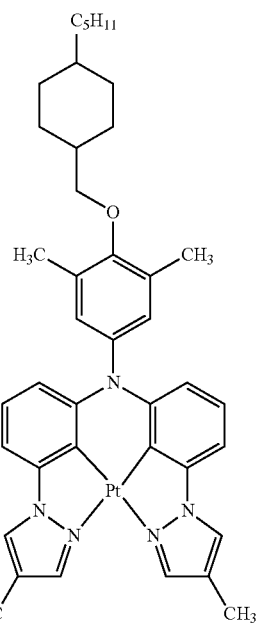
(5)
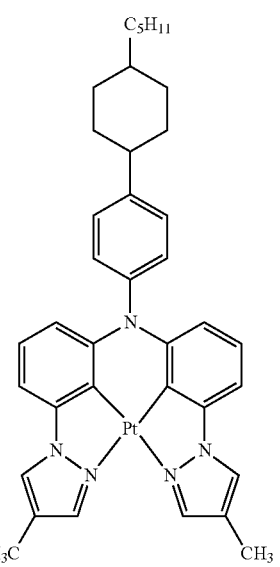
(6)
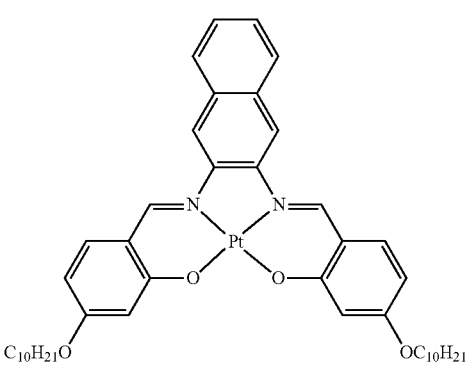
(7)

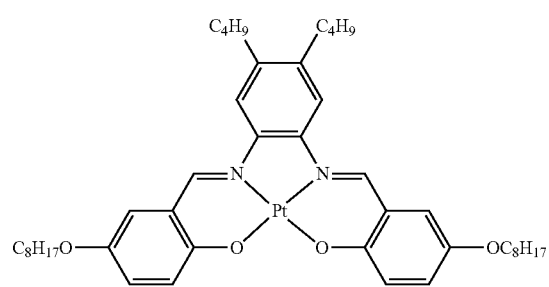
(8)
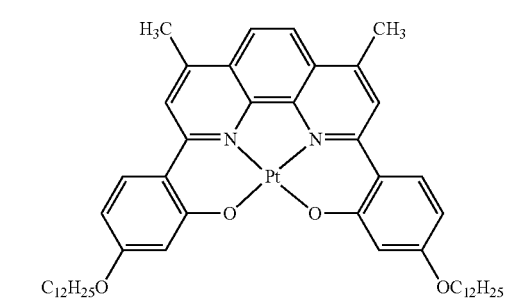
(9)
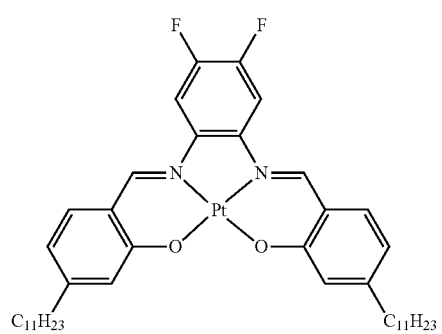
(10)
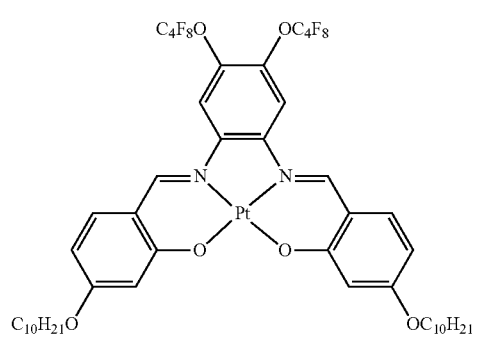
(11)
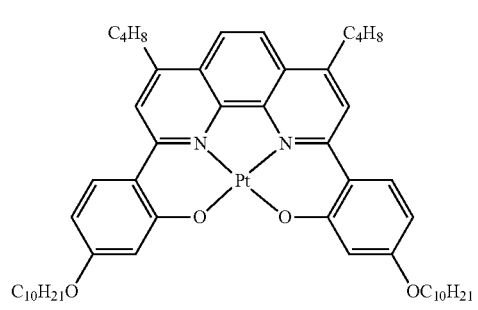
(12)
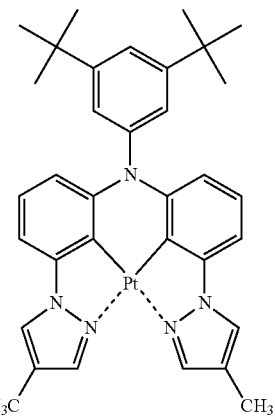
(13)
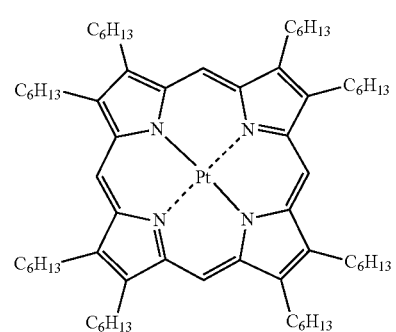
(14)
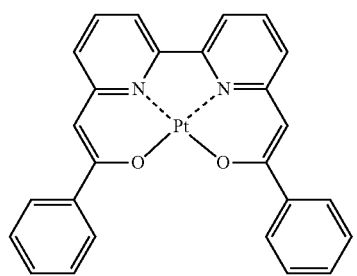
(15)
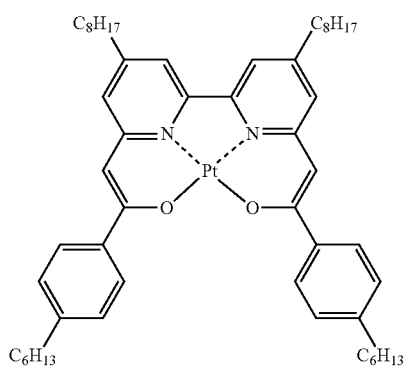
(16)

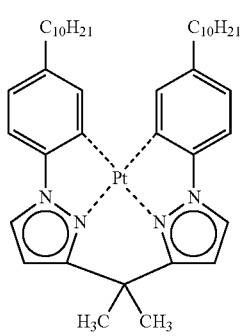
(17)
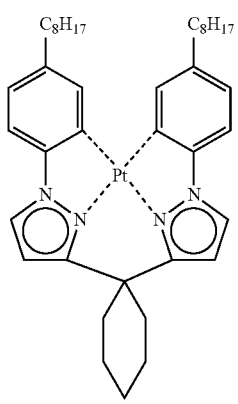
(18)
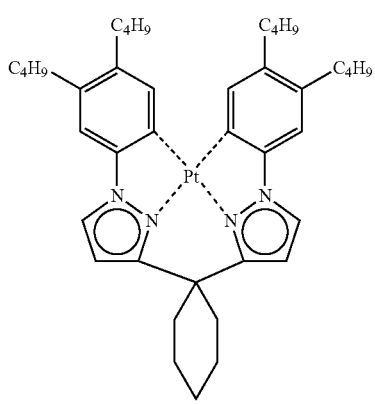
(19)
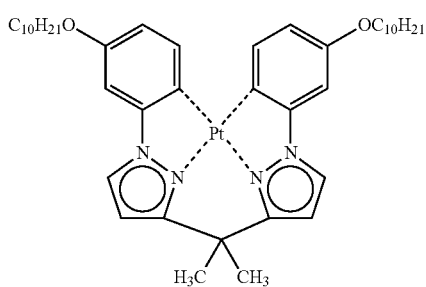
(20)
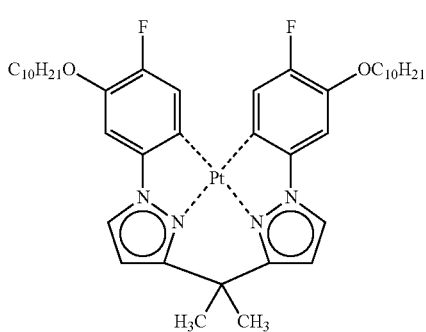
(21)
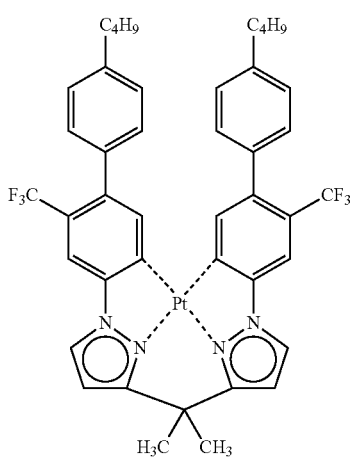
(22)
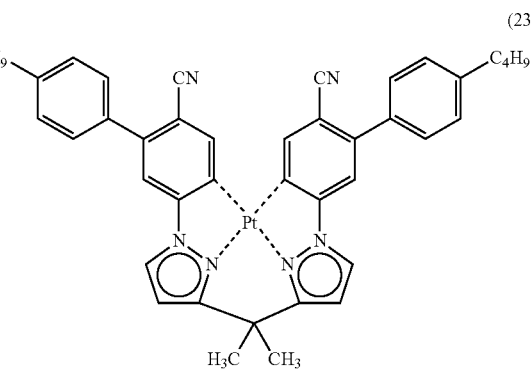
(23)
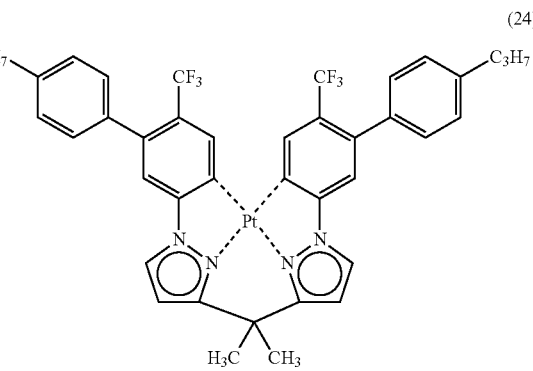
(24)

-continued

(25)
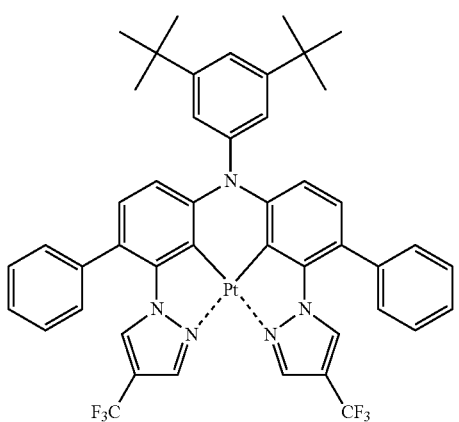

(26)
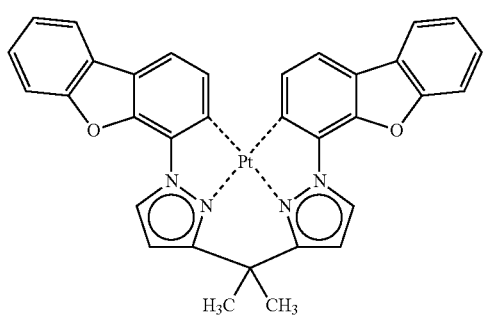

(27)
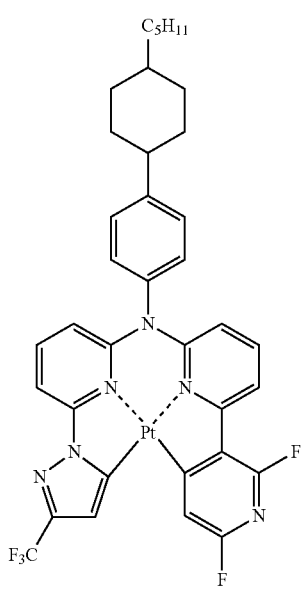

-continued

(28)
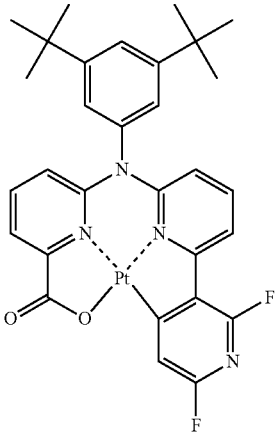

(29)
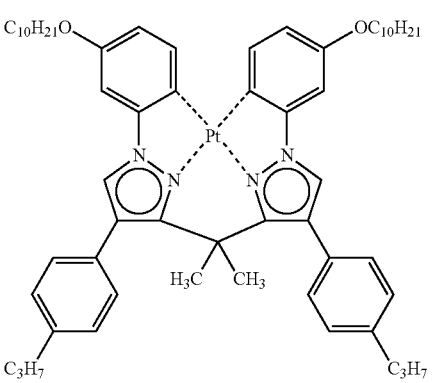

(30)
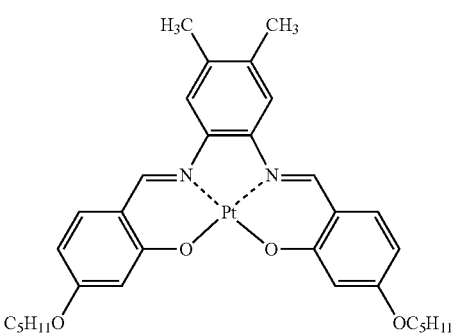

An amount of the phosphorescent compound with respect to the mass of the material for organic electroluminescence element is preferably 0.1% by mass to 30% by mass, more preferably 1% by mass to 25% by mass, and particularly preferably 5% by mass to 20% by mass.

When the amount is less than 0.1% by mass, sufficient luminance may not be obtained. When the amount exceeds 30% by mass, reduced compatibility to a discotic liquid-crystalline host compound or reduced light emission due to association or concentration quenching may occur.

<Discotic Liquid-Crystalline Host Compound>

The discotic liquid-crystalline host compound is a liquid-crystalline phase containing disk-shaped molecules having high planarity and has a negative and optically uniaxial refractive index. The discotic liquid-crystalline host compound functions as a host material contained in a light-emitting layer of an organic electroluminescence element of the present invention described hereinafter.

Examples of the liquid-crystalline phase in which the discotic liquid-crystalline host compound develops include a columnar liquid-crystalline phase and a discotic-nematic liquid-crystalline phase (ND liquid-crystalline phase). Among these, a discotic-nematic liquid-crystalline phase which exhibits favorable monodomain property is preferable.

The discotic liquid-crystalline host compound is preferably represented by General Formula (1) below.

General Formula (1)

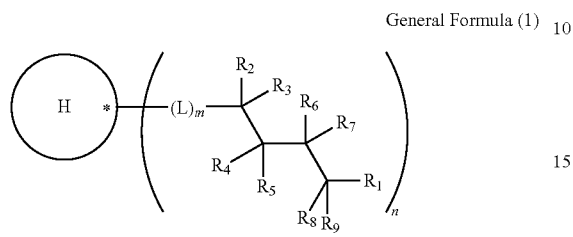

In General Formula (1), H represents a mother nucleus portion of liquid crystal; L represents a divalent linking group; and $R_1$ to $R_9$ represent a hydrogen atom or a substituent. Also, n represents 1 to 12, and m represents 0 to 3.

Also, L is a divalent linking group, and examples thereof include an arylene group, a heteroarylene group, an alicyclic hydrocarbon group, an alkenylene group, an alkynylene group, an ether group, a thioether group, an ester group (—COO— and —OCO—), a carbonyl group, an azo group (—CH=N— and —N=CH—), and an azoxy group. Among these, an arylene group, a heteroarylene group, an ether group, an ester group, a thioether group or a carbonyl group is more preferable.

$R_1$ to $R_9$ are a hydrogen atom or a substituent, and a hydrogen atom, a fluorine atom, an alkoxy group or an alkyl group is preferable.

The discotic liquid-crystalline host compound includes: benzene derivatives described in a research paper of C. Destrade et al. (Mol. Cryst., 71, p. 111 (1981)); truxene derivatives described in research papers of C. Destrade et al. (Mol. Cryst., 122, p. 141 (1985), Physics lett., A, 78, p. 82 (1990)); cyclohexane derivatives described in a research paper of B. Kohne et al. (Angew. Chem., 96, p. 70 (1984)); and aza-crown and phenylacetylene macrocycles described in a research paper of J. Zhang et al. (J. Am. Chem. Soc., 116, p. 2655 (1994)).

The discotic liquid-crystalline host compound includes a compound of a structure that a straight-chain alkyl group, an alkoxy group or a substituted benzoyloxy group radially substitutes as a side chain of the mother nucleus with respect to the mother nucleus at a center of the molecule. A molecule or a molecular assembly having rotational symmetries and being able to impart a certain orientation is preferable.

Preferably, the mother nucleus is represented by any one of General Formulae (H-1) to (H-3) below.

General Formula (H-1)

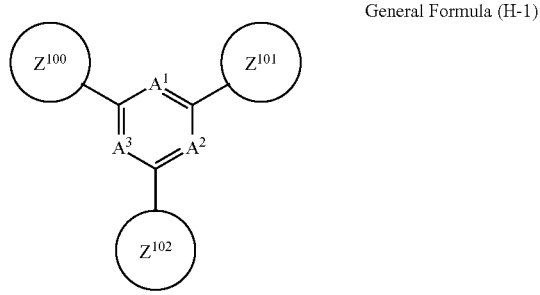

General Formula (H-2)

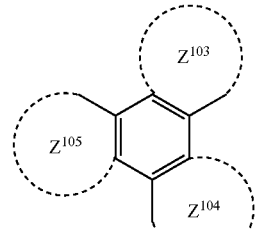

General Formula (H-3)

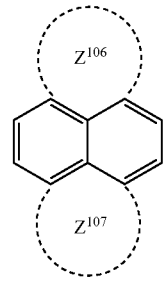

In General Formulae (H-1) to (H-3), $Z^{100}$ to $Z^{107}$ respectively represent an aromatic ring containing substituted or unsubstituted five-membered or six-membered ring. These may be further condensed with an aromatic ring. Any one of $Z^{103}$ to $Z^{105}$ and any one of $Z^{106}$ to $Z^{107}$ may not form a ring. $A^1$ to $A^3$ represent a carbon atom or a nitrogen atom.

As a material for organic electroluminescence element according to the present invention formed with the discotic liquid-crystalline host compound, the liquid-crystalline property of the host material may change through the process of forming an emissive layer for use in an organic electroluminescence element. For example, the discotic liquid-crystalline host compound may be a low-molecular discotic liquid-crystalline molecule which includes a thermally- or photo-reactive group and which loses liquid crystallinity as a result of polymerization or cross-linking due to heat or light during the formation of an emissive layer.

Examples of the discotic liquid-crystalline host compound include, but are not limited to, the following compounds.

(D1)

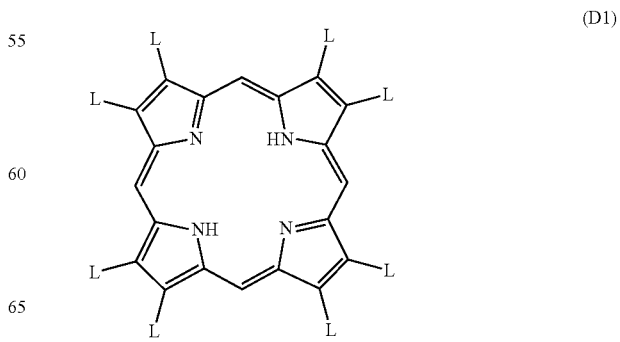

-continued
(D2)
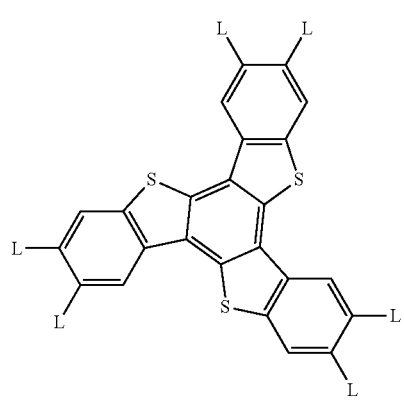
(D3)
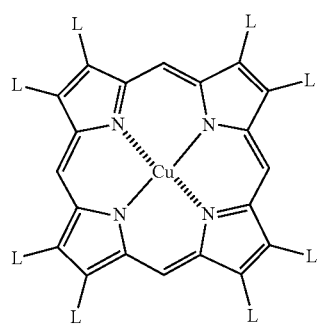
(D4)
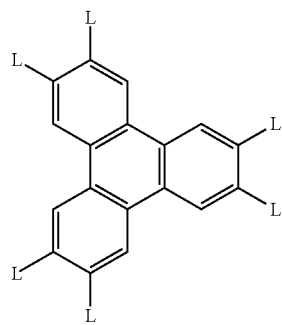
(D5)
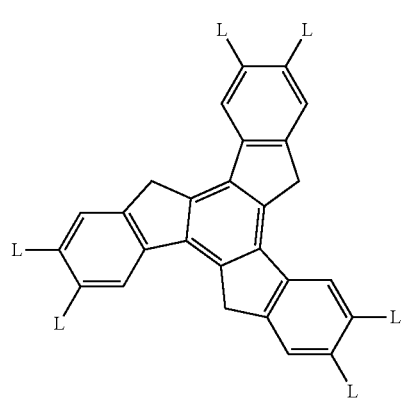
(D6)
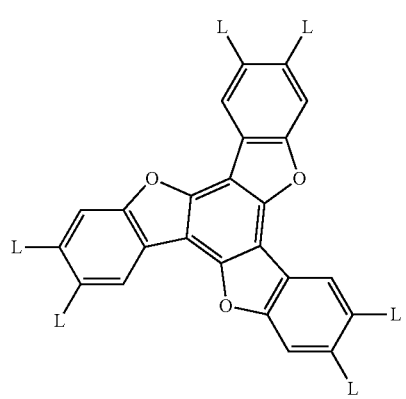
(D7)
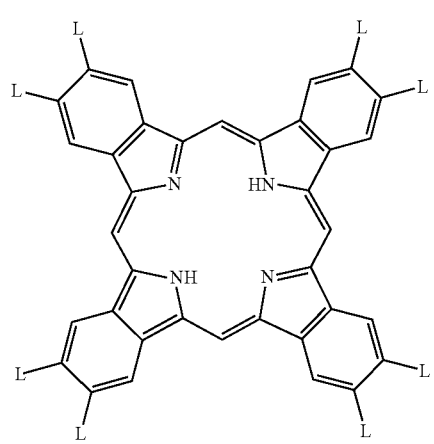
(D8)
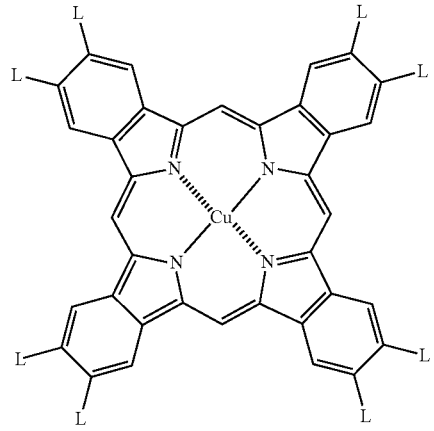
(D9)
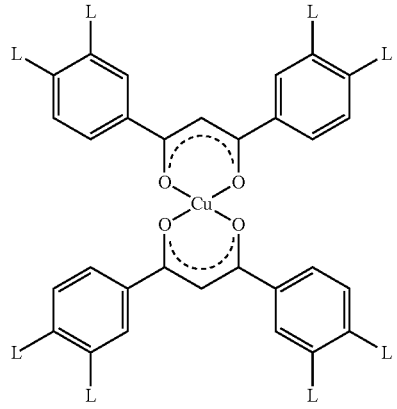

(D10)
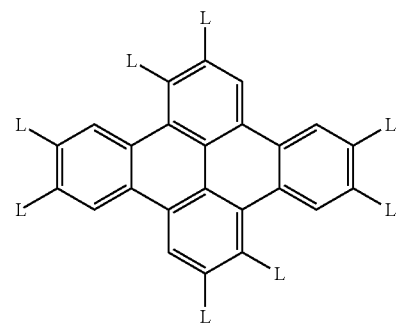
(D11)
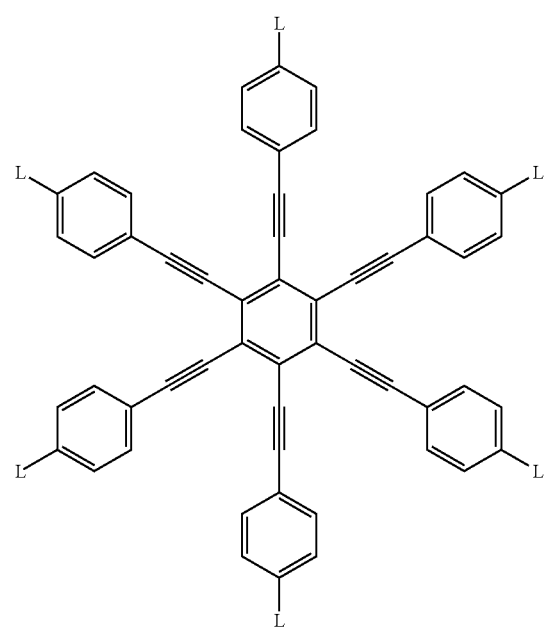
(D12)
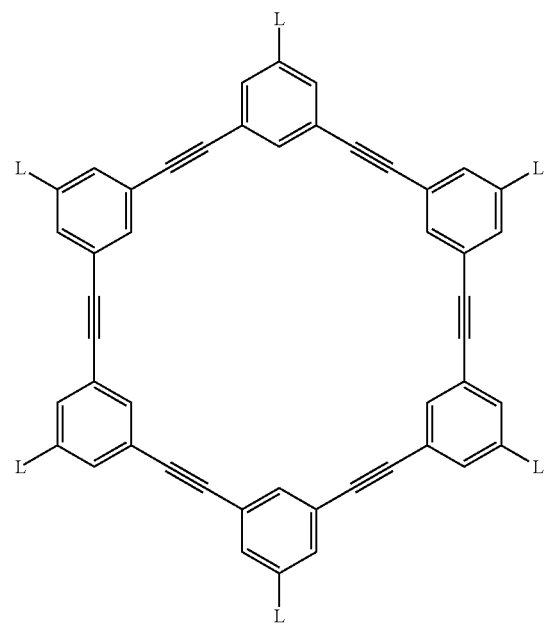
(D13)
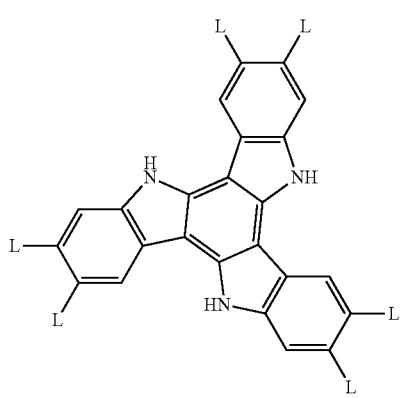
(D14)
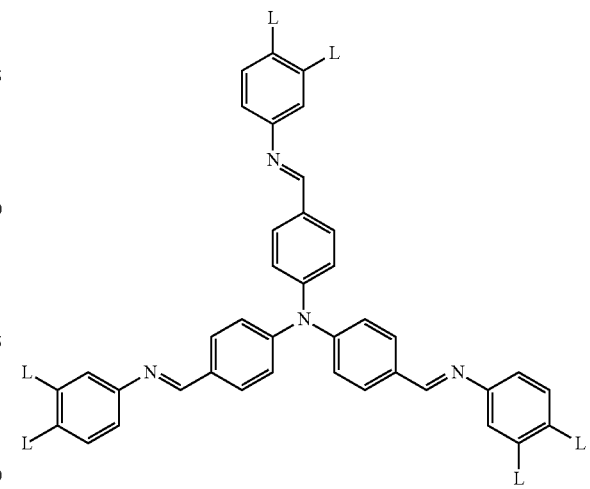
(D15)
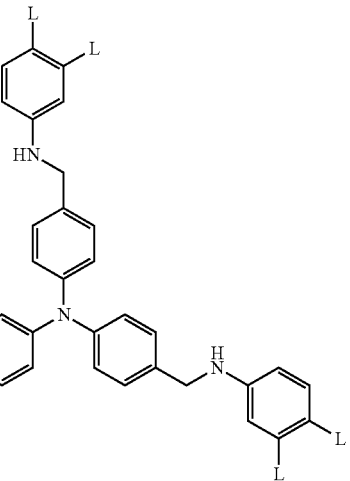

-continued

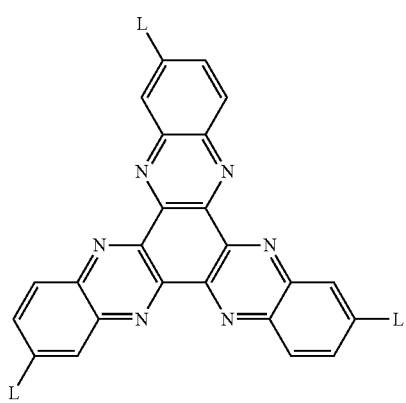
(D16)

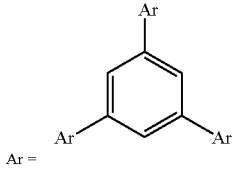
(D17)

Ar =

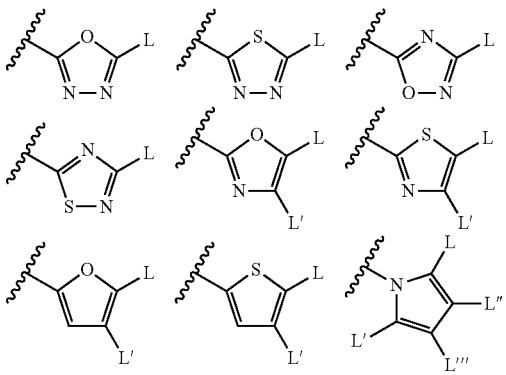

Among the compounds (D1) to (D17), (D1), (D4), (D6), (D13) and (D15) to (D17) are preferable, and (D4), (D16) and (D17) are more preferable.

In the compounds (D1) to (D17), L, L', L", L'" represent preferably an alkyl group having 4 to 18 carbon atoms, an alkoxy group having 4 to 18 carbon atoms, an arylene group having 6 to 10 carbon atoms, an acyloxy group having 5 to 19 carbon atoms, an alkoxycarbonyl group having 4 to 19 carbon atoms, an aryloxycarbonyl group having 7 to 11 carbon atoms, or a combination thereof. These may bind with each other to form a ring. The ring may be any one of an aromatic ring, an alicyclic ring, a heterocyclic ring and a heteroaromatic ring.

Examples of the alkyl group include an n-butyl group, an n-pentyl group, an n-hexyl group, an n-heptyl group, an n-octyl group, an n-nonyl group and an n-decyl group.

Examples of the alkoxy group include an n-butoxy group, an n-pentyloxy group, an n-hexyloxy group, an n-heptyloxy group, an n-octyloxy group, an n-nonyloxy group and an n-decyloxy group.

Examples of the arylene group include a phenyl group and a naphtyl group.

Examples of the acyloxy group include an octanoyloxy group, a decanoyloxy group, an undecanoyloxy group, a 2-octenoyloxy group, a 2-decenoyloxy group, a 2-undecenoyloxy group, a 2-dodecenoyloxy group, a benzoyloxy group and a 4-hexylbenzoyloxy group.

Examples of the alkoxycarbonyl group include a hexyloxycarbonyl group, an octyloxycarbonyl group and a decyloxycarbonyl group.

Examples of the aryloxycarbonyl group include a phenyloxycarbonyl group and a 4-pentylphenyloxycarbonyl group.

Among these, an alkoxy group and an acyloxy group are preferable.

An amount of the discotic liquid-crystalline host compound with respect to a mass of the material for organic electroluminescence element is preferably 70% by mass to 99.9% by mass, more preferably 75% by mass to 99% by mass, and particularly preferably 80% by mass to 95% by mass.

When the amount is less than 70% by mass, liquid crystallinity may disappear, and orientation of a phosphorescent compound may decrease. When the amount exceeds 99.9% by mass, the amount of a phosphorescent compound is less than 0.1% by mass, and thus sufficient light emission luminance may not be obtained.

The discotic liquid-crystalline host compound has a molecular radius of preferably 0.5 nm to 3 nm, more preferably 1.0 nm to 2.5 nm, and particularly preferably 1.5 nm to 2.0 nm.

When the molecular radius is less than 0.5 nm, liquid crystallinity may not develop. When the molecular radius exceeds 3 nm, performance as a host material for organic electroluminescence element may decrease.

The molecular radius of a discotic liquid-crystalline host compound is defined as a radius of the molecule as a whole including side chains regarded as a disk.

The molecular radius is defined based on theoretical calculation as follows. The theoretical calculation here is performed using density functional approach; specifically, structural optimization calculation is performed using GAUSSIAN 03 (Gaussian, Inc. of the United States) with basis function of 6-31G* and exchange-correlation function of B3LYP/LANL2DZ. Using an optimized structure obtained by the structural optimization calculation, the molecular radius of the discotic liquid-crystalline host compound is obtained.

A size ratio of the molecular radius of the phosphorescent compound to the molecular radius of the discotic liquid-crystalline host compound (molecular radius of the phosphorescent compound/molecular radius of the discotic liquid-crystalline host compound) is preferably 0.8 to 1.2, more preferably 0.85 to 1.15, and particularly preferably 0.9 to 1.1.

When the size ratio is less than 0.8 or exceeds 1.2, luminance of an organic electroluminescence element in a front direction decreases. This is presumed because mixing a phosphorescent compound decreases a degree of order (order parameter) of a discotic liquid-crystalline compound, and direction of orientation of each molecule varies after film formation even though the film is monodomain as well as the overall molecules are horizontally oriented. Here, the front direction of an organic electroluminescence element means a direction observed from a perpendicular line drawn from a substrate side to a light-emitting layer of the organic electroluminescence element which is vertically arranged.

The order parameter is preferably 0.60 or more, more preferably 0.65 or more, and particularly preferably 0.68 or more in view of luminance of the organic electroluminescence element.

The order parameter S may be obtained, for example, as follows: a polarized light in parallel with a rubbing direction and another polarizing light perpendicular to the rubbing direction are respectively irradiated, and respective absorption spectra (A∥ and A⊥) are measured using an ultraviolet and visible spectrophotometer (V-670) manufactured by JASCO Corporation. From A∥ and A⊥ at a maximum absorption wavelength, an order parameter S may be obtained based on Equations (1) and (2) below.

$$R=(2A\|-A\perp)/A\perp \qquad \text{Equation (1)}$$

$$S=(R-1)/(R+2) \qquad \text{Equation (2)}$$

<Other Compounds>

Examples of the other compounds include a fluorine atom containing group and an additive. The fluorine atom containing compound and the additives are described hereinafter.

(Organic Electroluminescence Element, Method for Manufacturing Organic Electroluminescence Element)

An organic electroluminescence element according to the present invention contains an anode, a cathode and a light-emitting layer, and further contains other layers according to necessity.

A method for manufacturing an organic electroluminescence element according to the present invention includes forming by a solution process using a material for organic electroluminescence element according to the present invention, and further contains other steps according to necessity.

An organic electroluminescence element according to the present invention may be favorably manufactured by a method for forming an organic electroluminescence element according to the present invention. Hereinafter, through an explanation of the organic electroluminescence element of the present invention, the method for manufacturing the organic electroluminescence element is explained.

<Light-Emitting Layer>

The light-emitting layer includes a material for organic electroluminescence element of the present invention, and may further include other materials according to necessity. Details of the material for organic electroluminescence element may be found above.

A phosphorescent compound included in the material for organic electroluminescence element has a transition dipole moment preferably oriented horizontally with respect to an anode. Horizontal orientation is advantageous in view of increased light-emitting component in a direction perpendicular to the anode.

The direction of the transition dipole moment is defined based on theoretical calculation as follows. The theoretical calculation here is performed using GAUSSIAN 03 (Gaussian, Inc. of the United States). A structure that generated energy is minimal in a structural optimization calculation is used for the calculation as a molecular structure, and a direction of the transition dipole moment is obtained.

—Other Materials—

Examples of other materials include a fluorine atom containing compound and an additive.

—Fluorine Atom Containing Compound—

The fluorine atom containing compound is characterized in concentrating at an air interface side in the light-emitting layer. By incorporating the fluorine atom containing compound in the light-emitting layer, the material for organic electroluminescence element may be oriented effectively in a horizontal direction with respect to the anode.

The fluorine atom containing compound includes preferably 3 or more, more preferably 3 to 18, and particularly preferably 4 to 12 side-chain substituents having 4 or more fluorine atoms.

When the number of the side-chain substituent is less than 3, liquid crystallinity may not develop, or the fluorine atom containing compound may not concentrate at an air interface side. When the number exceeds 18, solvent solubility or film formation property may decrease.

Also, each side-chain substituent preferably includes 4 or more, more preferably 6 to 30, and particularly preferably 8 to 25 fluorine atoms.

When the number of fluorine atoms is less than 4, the fluorine atom containing compound may not concentrate at an air interface side. When the number exceeds 30, solvent solubility or film formation property may decrease. The number of fluorine atoms may be determined by elemental analysis, MASS, $^1$H-NMR or $^{19}$F-NMR.

Among these, as the fluorine atom containing compound, compounds represented by Structural Formulae (A) and (B) are preferable.

Structural Formula (A)

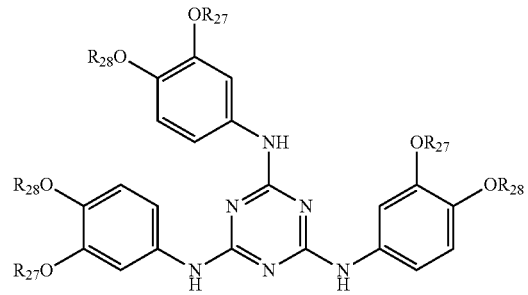

In Structural Formula (A), $R_{27}$ and $R_{28}$ independently represent a substituted or unsubstituted alkyl group having 4 or more fluorine atoms, and —$CH_2(CF_2)_4H$, —$CH_2(CF_2)_6H$, —$CH_2(CF_2)_8H$, —$(CH_2)_3C_4F_9$, and —$CH_2CF_2OCH_2CH_2C_6F_{13}$ are preferable.

Structural Formula (B)

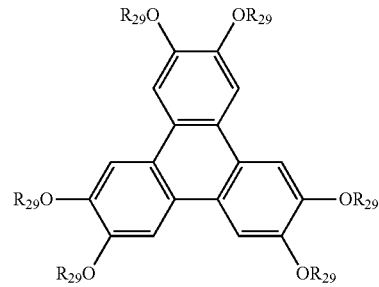

In Structural Formula (B), $R_{29}$ represents a substituted or unsubstituted alkyl group or an acyl group each having 4 or more fluorine atoms, and —$CH_2(CF_2)_4H$, —$CH_2(CF_2)_6H$, —$CH_2(CF_2)_8H$, —$(CH_2)_3C_4F_9$, and —$CH_2CH_2OCH_2CH_2C_6F_{13}$ are preferable.

An amount of the fluorine atom containing compound in the light-emitting layer is preferably 0.0001% by mass to 10% by mass, more preferably 0.001% by mass to 5% by mass, and particularly preferably 0.01% by mass to 2% by mass.

When the amount is less than 0.0001% by mass, sufficient horizontal orientation with respect to a discotic liquid-crystalline host compound may not be obtained. When the amount exceeds 10% by mass, solvent solubility, film formation property or liquid crystallinity may decrease. The amount is determined by the content ratio of a coating solution during preparation, and the amount may be measured by element analysis of the prepared film.

Also, the discotic liquid-crystalline host compound has a discotic-nematic liquid-crystalline phase-isotropic phase transition temperature of preferably 50° C. to 300° C., more preferably 70° C. to 300° C., and particularly preferably 100° C. to 300° C.

As the oriented discotic liquid-crystalline host compound, the oriented condition of molecules are preferably maintained and immobilized. Immobilization may be performed preferably by polymerization reaction or by using liquid-crystalline phase-glass transition. As the polymerization reaction, it is possible to use heat polymerization reaction or photopolymerization reaction using a polymerization initiator. However, it is preferable not to use a polymerization initiator in view of element performance, and examples thereof include heat polymerization with styryl group and sol-gel hard film method.

Examples of the polymerization initiator include: an α-carbonyl compound (disclosed in patent literatures U.S. Pat. No. 2,367,661 B and U.S. Pat. No. 2,367,670 B); an acyloin ether (disclosed in a patent literature U.S. Pat. No. 2,448,828 B); an α-hydrocarbon substituted aromatic acyloin compound (disclosed in patent literature U.S. Pat. No. 2,722,512 B); a multinuclear quinone compound (disclosed in patent literatures U.S. Pat. No. 3,046,127 B and U.S. Pat. No. 2,951,758 B); a combination of triarylimidazole dimer and p-aminophenylketone (disclosed in patent literature U.S. Pat. No. 3,549,367 B); acridine and phenazine compounds (disclosed in patent literatures JP-A 60-105667 and U.S. Pat. No. 4,239,850); and an oxadiazole compound (disclosed in patent literature U.S. Pat. No. 4,212,970).

An amount of the polymerization initiator used is preferably 0.001% by mass to 5% by mass, and more preferably 0.001% by mass to 1% by mass of the solid content of a coating solution.

<<Method for Forming Light-Emitting Layer>>

A method for forming a light-emitting layer (manufacturing method) is not particularly restricted and can be appropriately selected according to purpose, and it is preferably transfer process or solution process.

Example of the transfer process include pressure transfer, thermal transfer, laser thermal transfer and thermal pressure transfer.

A transfer substrate used for transfer is not particularly restricted and may be appropriately selected according to purpose. A substrate coated with a fluorine material or a substrate having a large contact angle is preferable.

Examples of the solution process include a coating method, a gravure printing method, a screen printing method, a flexographic printing method, an offset printing method, a reverse printing method and an inkjet printing method.

Examples of the coating method include a spin coating method, a casting method, a microgravure coating method, a bar coating method, a roll coating method, a wire bar coating method, a dip coating method, a slit coating method, a capillary coating method, a spray coating method and a nozzle coating method.

Among these, coating methods such as gravure coating method, screen printing method, flexographic method, offset printing method, reverse printing method and inkjet printing method are preferable.

If necessary, a light-emitting layer may be formed by a solution process with a coating solution that the material for organic electroluminescence element is dissolved or disperses in a solvent such as organic solvent.

Examples of the organic solvent include a hydrocarbon solvent, a ketone solvent, a halogenated hydrocarbon solvent, an alcohol solvent, an ether solvent and an ester solvent.

Examples of the hydrocarbon solvent include hexane, octane, decane, toluene, xylene, ethylbenzene, 1-methylnaphthalene and 1,2-dichlorobenzene.

Examples of the ketone solvent include acetone, methyl ethyl ketone, methyl isobutyl ketone and cyclohexanone.

Examples of the halogenated hydrocarbon solvent include dichloromethane, chloroform, tetrachloromethane, dichloroethane, trichloroethane, tetrachloroethane, chlorobenzene, dichlorobenzene and chlorotoluene.

Examples of the alcohol solvent include methanol, propanol, butanol, pentanol, hexanol, cyclohexanol, methyl cellosolve, ethyl cellosolve and ethylene glycol.

Examples of the ether solvent include dibutyl ether, tetrahydrofuran, dioxane and anisole.

Examples of the ester solvent include ethyl acetate, butyl acetate and amyl acetate.

The light-emitting layer preferably has a thickness of 10 nm to 100 nm, more preferably 15 nm to 50 nm, and particularly preferably 20 nm to 40 nm.

When the thickness is less than 10 nm, luminous efficiency may decrease because recombination of a hole and an electron is less likely to occur in the light-emitting layer. When the thickness exceeds 100 nm, driving voltage may increase. The thickness may be measured using, for example, quarts crystal (QCM) or stylus film thickness meter.

As a method for forming the light-emitting layer, the light-emitting layer may be formed, if necessary, by orienting uniaxially at least a part of the discotic liquid-crystalline host compound by irradiating light to a film for the light-emitting layer formed by the solution process. The irradiated light may be an ultraviolet light which is linearly-polarized in one direction or an electron beam. Among these, an ultraviolet light is favorably used.

Irradiation energy of the light irradiation is preferably 20 $mJ/cm^2$ to 50 $J/cm^2$, more preferably 20 $mJ/cm^2$ to 5,000 $mJ/cm^2$, and particularly preferably 100 $mJ/cm^2$ to 800 $mJ/cm^2$. It is possible to irradiate a light under heat condition in order to promote photopolymerization reaction.

<Anode>

The anode is suitably selected depending on purpose without any restriction, provided that it has functions as an electrode for providing holes to the light-emitting layer. In view of the characteristics of the organic electroluminescence element of the present invention, at least either the anode or the below-discussed cathode is preferably transparent.

A shape, structure or size of the anode is suitably selected from conventional electrode materials known in the art depending on the use of the organic electroluminescence element, and intended purpose without any restriction.

Examples of a material constituting the anode include conductive metal oxide, metal, a mixture or laminate of the metal and the conductive metal oxide, an inorganic conductive material, an organic conductive material, a laminate of ITO and the above-listed material(s).

Examples of the conductive metal oxide include antimony- or fluorine-doped tin oxide (ATO, FTO), tin oxide, zinc oxide, indium oxide, indium tin oxide (ITO), and indium zinc oxide (IZO).

Examples of the metal include gold, silver, chromium and nickel.

Examples of the inorganic conductive material include copper iodide and copper sulfide.

Examples of the organic conductive material include polyaniline, polythiophene and polypyrrole.

The method for forming the anode is suitably selected from methods known in the art without any restriction. Examples thereof include wet methods, chemical methods and physical methods.

Examples of the wet methods include printing, and coating.

Examples of the chemical methods include CVD and plasma CVD.

Examples of the physical methods include vacuum vapor deposition, sputtering and ion-plating.

In a case where patterning is performed to form the anode, the patterning may be performed by chemical etching such as photolithography, or may be performed by physical etching such as using laser. Alternatively, the patterning may be performed by vacuum deposition or sputtering using a mask, or performed by a lift-off method, or a printing method.

A thickness of the anode is not particularly restricted and may be appropriately selected according to materials. The thickness is preferably 10 nm to 10 μm, and more preferably 50 nm to 5 μm. The thickness may be measured using, for example, quarts crystal (QCM) or stylus film thickness meter.

In order to supply holes reliably to a light-emitting layer, resistance of the anode is preferably $10^3 \Omega/\square$ or less, and more preferably $10^2 \Omega/\square$ or less.

<Cathode>

The cathode is suitably selected depending on purpose without any restriction, provided that it has functions as an electrode for injecting electrons to the light-emitting layer.

A shape, structure or size of the cathode is suitably selected from conventional electrode materials known in the art depending on the use of the electroluminescence element and intended use, without any restriction.

Examples of the material constituting the cathode include an alkali metal, an alkaline earth metal, a rare-earth metal, other metals and an alloy of these metals. These may be used independently, but preferably used in combination for realizing both stability and electron-injecting properties.

Examples of the alkali metal include lithium and sodium.

Examples of the alkaline earth metal include magnesium and calcium.

Examples of the other metals include gold, silver, lead and aluminum.

Examples of the rare-earth metal include indium and ytterbium.

Examples of the alloy include a sodium-potassium alloy, a lithium-aluminum alloy and a magnesium-silver alloy.

Among these, the alkali metal and alkaline earth metal are preferable in view of their desirable electron-injecting properties, and a material including aluminum is particularly preferable in view of excellent storage property. The material including aluminum means: aluminum alone; an alloy or a mixture of aluminum and 0.01% by mass to 10% by mass of an alkali metal or an alkali earth metal (for example, a lithium-aluminum alloy and a magnesium-aluminum alloy).

The cathode is suitably formed according to methods known in the art without any restriction, and examples of the method include a wet method, a chemical method and a physical method.

Examples of the wet method include printing and coating.

Examples of the chemical method include CVD and plasma CVD.

Examples of the physical method include vacuum deposition, sputtering and ion-plating.

In a case where patterning is performed to form the cathode, the patterning may be performed by chemical etching such as photolithography, or may be performed by physical etching such as using laser. Alternatively, the patterning may be performed by vacuum deposition or sputtering using a mask, or performed by a lift-off method, or a printing method.

The cathode preferably has a thickness of 10 nm to 1,000 nm, and more preferably 20 nm to 500 nm, and particularly preferably 50 nm to 100 nm.

When the thickness is less than 50 nm, the cathode may degrade due to oxidization. When the thickness exceeds 1,000 nm, the cathode may degrade by being exposed to radiant heat during film formation. The thickness may be measured by stylus film thickness meter.

<Other Layers>

Other layers include a hole transporting layer, a hole injection layer, an electron transporting layer, an electron injection layer and a substrate.

—Hole Injection Layer and Hole Transporting Layer—

The hole injection layer and the hole transporting layer are layers having functions of receiving holes from the anode or the side of the anode and transporting the holes to the side of the cathode. The hole injection layer and hole transporting layer may each have a single-layer structure, or a multi-layer structure formed of a plurality of layer in which each layer has an identical formulation or different formulation from other layers.

A hole injection material or hole transporting material used for these layers may be a low-molecular compound or high-molecular compound, or inorganic compound.

The hole injection material and hole transporting material are suitably selected depending on purpose without any restriction, and examples thereof include pyrrole derivatives carbazole derivatives, triazole derivatives, oxazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalcone derivatives, styrylanthracene derivatives, fluorenone derivatives, hydrazone derivatives, stilbene derivatives, silazane derivatives, aromatic tertiary amine compounds, styrylamine compounds, aromatic dimethylidyne compounds, phthalocyanine compounds, porphyrin compounds, iridium complex, thiophene compounds, organic silane derivatives, carbon and molybdenum trioxide. These may be used independently or in combination.

Among these, arylamine derivatives, carbazole derivatives, iridium complex and molybdenum trioxide are preferable.

The hole injection layer or the hole transport layer may include an electron-accepting dopant.

The electron-accepting dopant may be an inorganic compound or an organic compound as long as it has electron accepting property and may oxidize an organic compound.

The inorganic compound is suitably selected depending on purpose without any restriction, and examples thereof include metal halides and metal oxides.

Examples of the metal halides include iron (II) chloride, aluminum chloride, gallium chloride, indium chloride and antimony pentachloride.

Examples of the metal oxides include vanadium pentaoxide and molybdenum trioxide.

The organic compound is suitably selected depending on purpose without any restriction, and examples thereof include: compounds having a substituent such as nitro group, halogen, cyano group and trifluoromethyl group; a quinone compound; an acid anhydride compound; and fullerene.

These electron-accepting dopants may be used independently or in combination.

An amount of the electron-accepting dopant for use may vary depending on the material, but it is preferably 0.01% by mass to 50% by mass, more preferably 0.05% by mass to 50% by mass, and particularly preferably 0.1% by mass to 30% by mass with respect to the amount of the hole transporting material or hole injection material.

An average thicknesses of the hole injection layer and the hole transporting layer, respectively, is preferably 1 nm to 500 nm, more preferably 5 nm to 200 nm, and particularly preferably 10 nm to 100 nm.

—Electron Transporting Layer—

The electron transporting layer is a layer which receives electrons from a cathode or a cathode side and transports them to an anode side. Preferably, triplet energy of the electron transporting layer is greater than that of its cathode-side adjacent layer.

A material of the electron transporting layer is not particularly restricted and may be appropriately selected according to purpose. Examples thereof include quinoline derivatives, oxadiazole derivatives, triazole derivatives, phenanthroline derivatives, perylene derivatives, pyridine derivatives, pyrimidine derivatives, quinoxaline derivatives, diphenylquinone derivatives, nitro-substituted fluorene derivatives, benzonitrile compounds and imidazopyridine derivatives.

Examples of the quinoline derivatives include: 2,9-dimethyl-4,7-diphenyl-1,10-phenanthroline (bathocuproin: BCP); a compound that BCP is doped with Li; organic metal complex having 8-quinolinol or a derivative thereof as a ligand such as tris(8-quinolinato)aluminum (Alq); and BAlq (bis-(2-methyl-8-quinolinolato)-4-(phenyl-phenolato)aluminum(III)). Among these, the compound that BCP is doped with Li and BAlq are particularly preferable.

Regarding a method for forming the electron transporting layer, the electron transporting layer may be favorably formed by methods such as deposition method, wet film forming method, electron beam method, sputtering method, reactive sputtering method, MBE (molecular beam epitaxy) method, cluster ion beam method, ion plating method, plasma polymerization method (high-frequency excitation ion plating method), molecular laminating method, LB method, printing method and transfer method.

A thickness of the electron transporting layer is not particularly restricted and may be appropriately selected according to purpose. The thickness is preferably 1 nm to 500 nm, and more preferably 10 nm to 50 nm.

The electron transporting layer may have a single-layer structure or a multi-layer structure.

—Electron Injection Layer—

The electron injection layer is a layer which receives electrons from a cathode or a cathode side and transports them to an anode side.

The electron injection layer may have a single-layer structure formed of one type or two or more types of materials, or a multi-layer structure formed of a plurality of layers in which each layer has an identical formulation or different formulation from other layers.

A thickness of the electron injection layer is not particularly restricted and may be appropriately selected according to purpose. The thickness is preferably 0.1 nm to 200 nm, more preferably 0.2 nm to 100 nm, and particularly preferably 0.5 nm to 50 nm.

—Substrate—

The organic electroluminescence element of the present invention is preferably formed on or above the substrate, and the organic electroluminescence element may be formed on the substrate so that the anode and the substrate are in contact with each other, or formed on the substrate via an intermediate layer.

A material of the substrate is suitably selected depending on purpose without any restriction, and examples thereof include inorganic materials and organic materials.

Examples of the inorganic materials include yttria stabilized zirconium (YSZ), alkali-free glass, and soda-lime glass.

Examples of the organic materials include polyethylene terephthalate, polybutylene phthalate, polyethylene naphthalate, polystyrene, polycarbonate, polyether sulfone, polyallylate, polyimide, polycycloolefin, norbornene resin and poly(chlorotrifluoroethylene).

A shape, structure or size of the substrate is suitably selected depending on the intended use and application of the resulting light-emitting element, without any restriction. Generally, the shape of the substrate is preferably a plate shape.

The structure of the substrate may be a single-layer structure or a laminate structure, and the substrate may be formed of a single member or formed of two or more members. The substrate may be clear or opaque, and when it is a clear substrate, it may be colorless or colored.

To the substrate, a moisture barrier layer (a gas barrier layer) can be provided on its surface or back surface.

Examples of the material of the moisture barrier layer (gas barrier layer) include inorganic materials such as silicon nitride and silicon oxide.

The moisture barrier layer (gas barrier layer) can be formed, for example, by high frequency sputtering.

—Electron Blocking Layer—

An electron blocking layer is a layer which prevents electrons transported from a cathode side to the light-emitting layer from passing through to an anode side. Usually, it is allocated as an organic compound layer adjacent to the light-emitting layer on an anode side thereof.

As a compound which constitutes the electron blocking layer, those listed as the hole transporting host material may be used. Also, the electron blocking layer may have a single-layer structure formed of one type or two or more types of materials, or a multi-layer structure formed of a plurality of layers in which each layer has an identical formulation or different formulation from other layers.

A method for forming an electron blocking layer is not particularly restricted, and it may be formed according to a heretofore known method. Examples thereof include a deposition method, a dry film forming method such as sputtering method, a wet film forming method, a transfer method, a printing method and an inkjet recording method.

The electron blocking layer preferably has a thickness of 1 nm to 200 nm, more preferably 1 nm to 50 nm, and particularly preferably 3 nm to 10 nm.

—Protective Layer—

The organic electroluminescence element of the present invention may be protected entirely with a protective layer.

The material contained in the protective layer is suitably selected depending on purpose without any restriction, provided that it has functions of preventing substances which degrades the element such as moisture and oxygen from penetrating into the element. Examples of such material include In, Sn, Pb, Au, Cu, Ag, Al, Ti, Ni, MgO, SiO, $SiO_2$, $Al_2O_3$, GeO, NiO, CaO, BaO, $Fe_2O_3$, $Y_2O_3$, $TiO_2$, $SiN_x$, $SiN_xO_y$, $MgF_2$, LiF, $AlF_3$, $CaF_2$, polyethylene, polypropylene, polymethylmethacrylate, polyimide, polyurea, polytetrafluoroethylene, polychlorotrifluoroethylene, polydichlorodifluoroethylene, a copolymer of chlorotrifluoroethylene and dichlorodifluoroethylene, a copolymer formed by copolymerizing a monomer mixture containing tetrafluoroethylene and at least one comonomer, a fluorine-containing copolymer having a cyclic structure in its copolymer principle chain, a water-absorbing material having water absorption of 1% or more, and a moisture-proof material having water absorption of 0.1% or less.

A method for forming the protective layer is suitably selected depending on purpose without any restriction, and examples thereof include a vacuum deposition method, a sputtering method, a reactive sputtering method, a molecular beam epitaxy (MBE) method, a cluster ion beam method, an ion-plating method, a plasma polymerization method (high frequency wave excited ion-plating), a plasma CVD method, a laser CVD method, a thermal CVD method, a gas-source CVD method, a coating method, a printing method and a transferring method.

—Sealing Container—

The organic electroluminescence element of the present invention may be entirely sealed by a sealing container. Moreover, a moisture absorbent or an inactive liquid may be injected into a space between the sealing container and the organic electroluminescence element.

The moisture absorbent is suitably selected depending on purpose without any restriction, and examples thereof include barium oxide, sodium oxide, potassium oxide, calcium oxide, sodium sulfate, calcium sulfate, magnesium sulfate, phosphorus pentoxide, calcium chloride, magnesium chloride, copper chloride, cesium fluoride, niobium fluoride, calcium bromide, vanadium bromide, molecular sieves, zeolite and magnesium oxide.

The inactive liquid is suitably selected depending on purpose without any restriction, and examples thereof include paraffins, liquid paraffins, fluorosolvents, chlorine solvents and silicone oil.

—Resin Sealing Layer—

The organic electroluminescence element may be sealed with a resin sealing layer so as to prevent the organic electroluminescence element and functions thereof from degrading due to oxygen or moisture in the atmosphere.

A material of the resin sealing layer is suitably selected depending on purpose without any restriction, and examples thereof include acrylic resins, epoxy resins, fluororesins, silicone resins, rubber-based resins and ester-based resins. Among them, the epoxy resins are particularly preferable in view of their desirable moisture proof properties. Among the epoxy resins, a thermoset epoxy resin and a photo-curable epoxy resin are preferable.

A method for forming the resin sealing layer is suitably selected depending on purpose without any restriction, and examples thereof include: a method in which a resin solution is coated; a method in which a resin sheet is pressure bonded or thermally pressure bonded; and a method of dry polymerization through deposition or sputtering.

(Layer Structure of Organic Electroluminescence Element)

FIG. 1 is a schematic diagram showing one example of a layer structure of an organic electroluminescence element of the present invention. The organic electroluminescence element 10 contains an anode 2, a hole injection layer 3, a hole transporting layer 4, a light-emitting layer 5, an electron transporting layer 6, an electron injection layer 7, and a cathode 8 formed and laminated on a substrate 1 in this order. The anode 2 and the cathode 8 are electrically connected to each other through a power source.

(Use)

Use of the organic electroluminescence element is suitably selected depending on purpose without any restriction, but it is suitably used for a display element, a display, a backlight, electrophotography, a illumination light source, a recording light source, an exposure light source, a reading light source, an indicator, a signboard, interior decoration, and optical communication.

As a method of making the organic electroluminescence display full color, for example, as described in Monthly Display, pp. 33-37 (September, 2000), a three-color light-emitting method of arranging organic EL elements emitting lights corresponding to three primary colors (blue (B), green (G) and red (R)) of colors on a substrate, a white color method of separating white color emission by an organic EL element for white color emission to three colors through a color filter, and a color-converting method of converting blue color emission by an organic EL element for blue color emission to red (R) and green (G) through a fluorescent dye layer are known.

Moreover, the organic electroluminescence element of the present invention can attain desired emission color by combining a plurality of different emission color obtained by the phosphorescent material. In a case where the organic electroluminescence element provides blue, green, or red emission, a phosphorescent material having an emission peak at around a desired wavelength can be included in a material for organic electroluminescence element or a light-emitting layer.

In a case where an organic electroluminescence element provides white emission, a blue phosphorescent compound having an emission peak at 420 nm to 500 nm, a green phosphorescent compound having an emission peak at 500 nm to 570 nm and a red phosphorescent compound having an emission peak at 570 nm to 650 nm may be included.

EXAMPLES

Examples of the present invention will be explained hereinafter, but these examples shall not be construed as limiting the scope of the present invention in any way.

Synthesis Example 1

Synthesis of Phosphorescent Compound 1

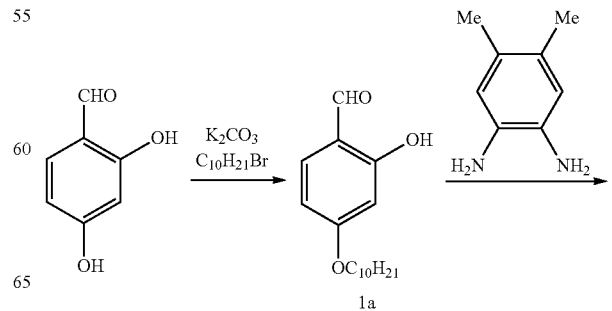

1a

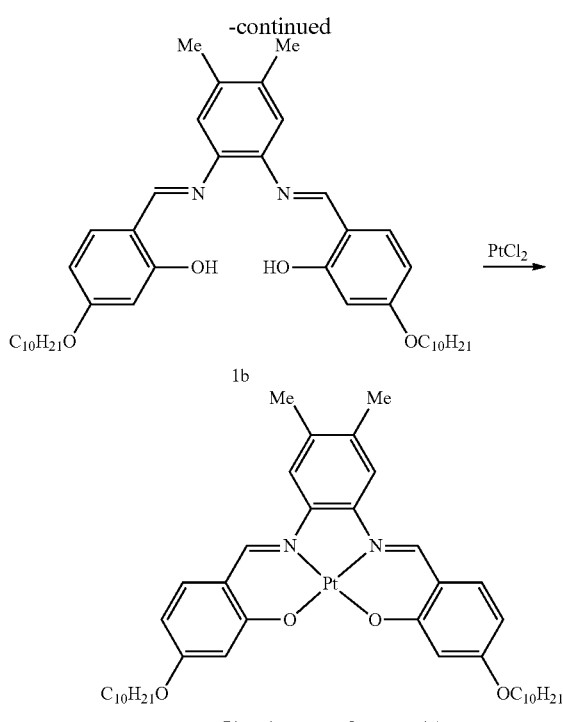

Phosphorescent Compound 1
(In the above formula, Me represents a methyl group.)

—Synthesis of Compound 1a—

In 200 mL of dimethylacetoamide (DMAc), 2,4-dihydroxybenzaldehyde (20 g), n-decylbromide (32 g) and potassium carbonate (20 g) were mixed, which was reacted at 60° C. for 4 hours. The reaction solution was filtered, and the obtained filtrate was poured and added to ethyl acetate/a saturated salt solution. An organic layer was washed with a salt solution, dried with magnesium sulfate and concentrated under a reduced pressure. A residue after concentration was purified with silica-gel column chromatography (developing solvent: ethyl acetate/hexane=1/10) to obtain Compound 1a (20.3 g).

—Synthesis of Compound 1b—

To an ethanol solution (30 mL) of Compound 1a (3 g) and 4,5-dimethyl-1,2-phenylenediamine (0.73 g), 5 drops of acetic acid was dropped with a 1-mL Komagome pipette, which was reacted at 80° C. for 6 hours. A precipitated solid was collected by filtration and recrystallized with ethanol to obtain Compound 1b (2.7 g).

—Synthesis of Phosphorescent Compound 1—

To an acetonitrile solution (30 mL) of Compound 1b (1.5 g) and sodium acetate (0.19 g), a dimethylsulfoxide (DMSO) solution (15 mL) of $PtCl_2$ (0.61 g) was dropped at 80° C., which was reacted for 7 hours. The reaction solution was concentrated under a reduced pressure. An obtained solid was washed with ethanol, purified with silica-gel column chromatography (developing solvent: chloroform/hexane=8/1) and recrystallized with ethyl acetate to obtain Phosphorescent Compound 1 (0.72 g). The compound was identified with elemental analysis, NMR and MASS spectrum. An appearance of the compound was a yellow solid.

Structural optimization calculation was performed using GAUSSIAN 03 (Gaussian, Inc. of the United States) to calculate a molecule core diameter, a molecule core thickness and a molecular radius of Phosphorescent Compound 1. As a result, an aspect ratio was 12.3, and the molecular radius was 1.91 nm.

Synthesis Example 2

Synthesis of Phosphorescent Compound 3

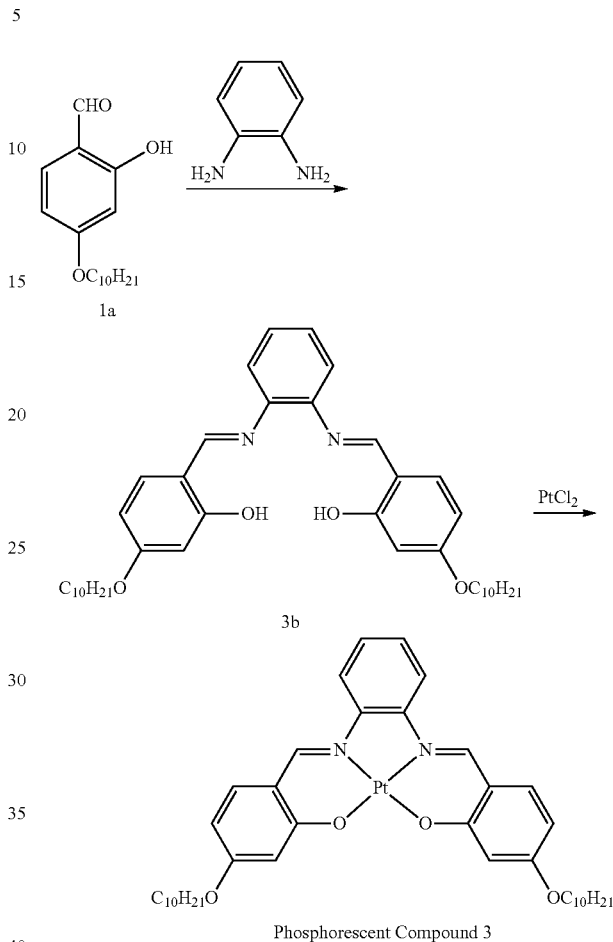

Phosphorescent Compound 3

—Synthesis of Compound 3b—

To an ethanol solution (45 mL) of Compound 1a (4.37 g) synthesized in Synthesis Example 1 and o-phenylenediamine (0.85 g), 2 drops of acetic acid was dropped with 1-mL Komagome pipette, which was reacted at 80° C. for 3 hours. A precipitated solid was collected by filtration and recrystallized with ethanol to obtain Compound 3b (3.7 g).

—Synthesis of Phosphorescent Compound 3—

To an acetonitrile solution (60 mL) of Compound 3b (3 g) and sodium acetate (0.39 g), a DMSO solution (30 mL) of $PtCl_2$ (1.27 g) was dropped at 80° C., which was reacted for 7 hours. The reaction solution was concentrated under a reduced pressure. An obtained solid was washed with ethanol, purified with silica-gel column chromatography (developing solvent: chloroform/hexane=6/1) and recrystallized with ethyl acetate to obtain Phosphorescent Compound 3 (1.8 g). The compound was identified with elemental analysis, NMR and MASS spectrum. An appearance of the compound was a yellow solid.

Structural optimization calculation was performed using GAUSSIAN 03 (Gaussian, Inc. of the United States) to calculate a molecule core diameter, a molecule core thickness and a molecular radius of Phosphorescent Compound 3. As a result, an aspect ratio was 12.3, and the molecular radius was 1.91 nm.

Synthesis Example 3

Synthesis of Phosphorescent Compound 4

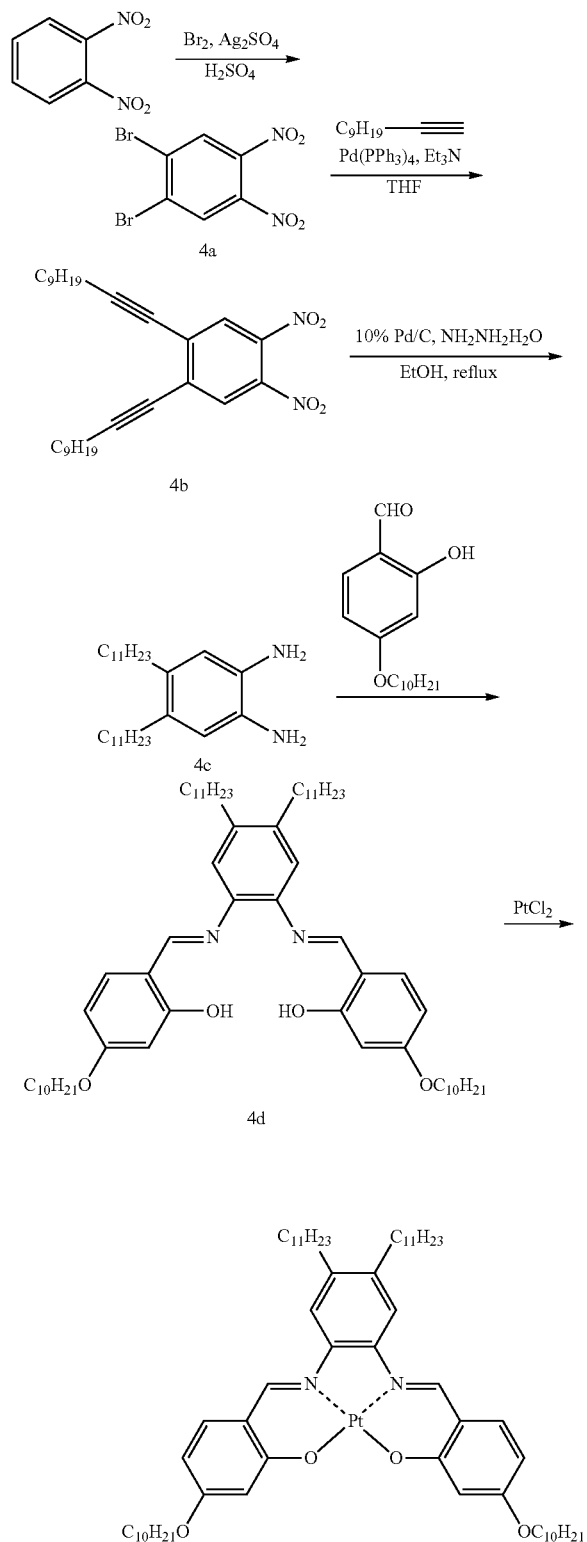

Phosphorescent Compound 4
(In the above formula, Et represents an ethyl group.)

—Synthesis of Compound 4a—

Bromine (5 mL) was dropped in a sulfuric acid solution (46 mL) of 1,2-dinitrobenzene (4.6 g) and silver sulfate (17 g), which was reacted at 100° C. for 30 minutes, then reacted at 120° C. for 30 minutes and further reacted at 180° C. for 6 hours. After the reaction was completed, the reaction solution was poured and added to ice water, and a precipitated solid was filtered. Ethyl acetate was added to an obtained filtrate. An organic layer was washed with a salt solution, dried with magnesium sulfate and concentrated under a reduced pressure. A residue after concentration was purified with silica-gel column chromatography (developing solvent: ethyl acetate/hexane=1/5) and recrystallized with hexane/ethyl acetate (6/1) to obtain Compound 4a (1.6 g).

—Synthesis of Compound 4b—

To a tetrahydrofuran (THF) solution (24 mL) of Compound 4a (0.6 g), copper iodide (35 mg) and tetrakis triphenylphosphine palladium (106 mg), triethylamine (1.27 mL) was dropped, and then 1-decyne (0.77 mL) was dropped, which was reacted at a room temperature in a nitrogen atmosphere for 12 hours. The reaction solution was poured and added to ethyl acetate/dilute hydrochloric acid (mixing ratio: ethyl acetate/dilute hydrochloric acid=1/1). An organic layer was washed with a salt solution, dried with magnesium sulfate and concentrated under a reduced pressure. A residue after concentration was purified with silica-gel column chromatography (developing solvent: ethyl acetate/hexane=1/40; 1/20 after development) to obtain Compound 4a (0.34 g).

—Synthesis of Compound 4c—

To a 10-% Pd/C (63 mg), an ethanol solution (10 mL) of Compound 4b (0.33 g) was dropped, and then water-saturated hydrazine (4.93 g) was dropped, which was reacted at 85° C. for 5 hours. The reaction solution was filtered with CELITE and concentrated under a reduced pressure. A residue after concentration was purified with silica-gel column chromatography (developing solvent: ethyl acetate/hexane=1/1) to obtain Compound 4c (0.27 g).

—Synthesis of Compound 4d—

To an ethanol solution (3 mL) of Compound 4c (0.19 g) and Compound 1a (0.15 g), one drop of acetic acid was dropped at 70° C. with a 1-mL Komagome pipette, which was reacted for 6 hours. The reaction solution was concentrated under a reduced pressure. A residue after concentration was purified with silica-gel column chromatography (developing solvent: ethyl acetate/hexane=1/6) to obtain Compound 4d (0.28 g).

—Synthesis of Phosphorescent Compound 4—

To an acetonitrile solution (7 mL) of Compound 4d (3 g) and sodium acetate (37 mg), a DMSO solution (3.5 mL) of $PtCl_2$ (62 mg) was dropped at 80° C., which was reacted for 5 hours. The reaction solution was concentrated under a reduced pressure. A residue after concentration was purified with silica-gel column chromatography (developing solvent: chloroform/hexane=1/1) to obtain Phosphorescent Compound 4 (0.22 g). The compound was identified with elemental analysis, NMR and MASS spectrum. An appearance of the compound was a yellow amorphous solid.

Structural optimization calculation was performed using GAUSSIAN 03 (Gaussian, Inc. of the United States) to calculate a molecule core diameter, a molecule core thickness and a molecular radius of Phosphorescent Compound 4. As a result, an aspect ratio was 12.3, and the molecular radius was 1.91 nm.

Synthesis Example 4

Synthesis of Phosphorescent Compound 5

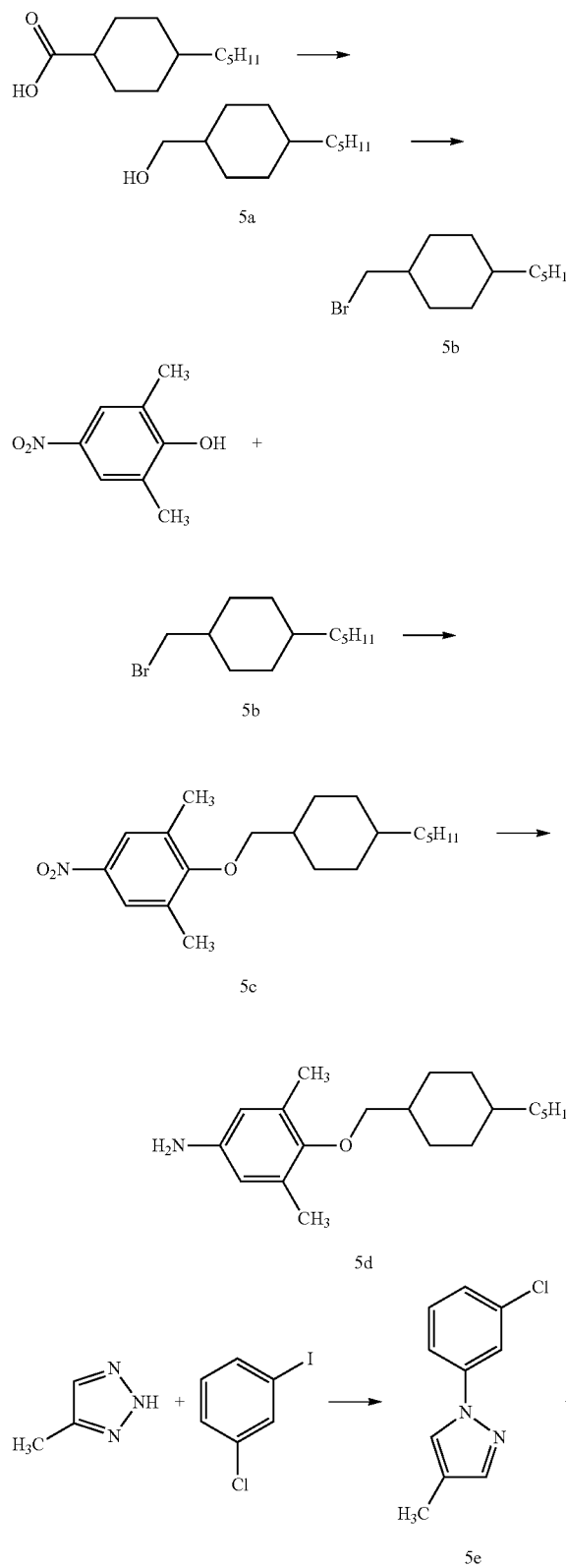

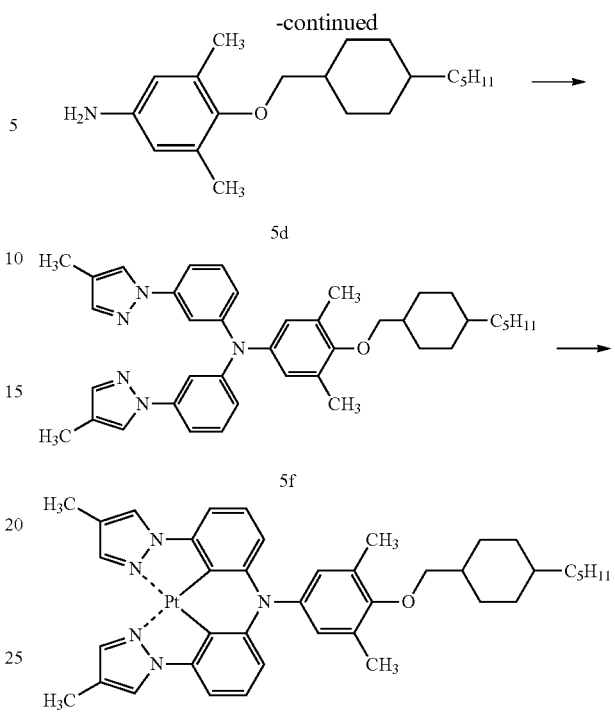

Phosphorescent Compound 5

—Synthesis of Compound 5a—

A 1-M THF solution (130 mL) of LAH (lithium aluminum hydride) was mixed with 100 mL of THF, to which a THF solution (80 mL) of trans-4-pentylcyclohexane carboxylic acid (23.5 g) was dropped over 1.5 hours while being cooled in ice. The mixture was reacted at a room temperature for 1.5 hours and then reacted at 80° C. for 2 hours. The reaction solution was poured and added to a 1-N hydrochloric acid ice water for extraction. An organic layer was washed with a salt solution, dried with magnesium sulfate and concentrated under a reduced pressure. A residue after concentration was purified with silica-gel column chromatography (developing solvent: ethyl acetate/hexane=1/40) to obtain Compound 5a (21.9 g).

—Synthesis of Compound 5b—

To an acetonitrile solution (360 mL) of Compound 5a (21.9 g), phosphorus tribromide (16.8 mL) was dropped at a room temperature, which was reacted at 45° C. for 7 hours. The reaction solution was cooled to a room temperature and then added with potassium bromide (50 g) over 15 minutes. Further, pyridine (30 mL) was dropped to the reaction solution, which was reacted at 80° C. for 3 hours. The reaction solution was poured and added to ethyl acetate/ice water (mixing ratio: ethyl acetate/ice water=1/1). An organic layer was washed with a salt solution, dried with magnesium sulfate and concentrated under a reduced pressure. A residue after concentration was purified with silica-gel column chromatography (developing solvent: hexane) to obtain Compound 5b (25.1 g).

—Synthesis of Compound 5c—

Potassium carbonate (20.2 g) was added to an NMP solution (240 mL) of Compound 5b (24.1 g) and 2,6-dimethyl-4-nitrophenol (17.9 g), which was reacted at 90° C. for 3.5 hours and then reacted at 100° C. for 2.5 hours. The reaction solution was further reacted at 130° C. for 2 hours, to which a 1-N hydrochloric acid solution/ethyl acetate (mixture ratio: 1-N hydrochloric acid solution/ethyl acetate=1/1). An organic layer was washed with a salt solution, dried with magnesium sulfate and concentrated under a reduced pressure. A residue after concentration was purified with silica-gel column chromatography (developing solvent: hexane, ethyl acetate/hexane=1/10 after development), and an obtained coarse body was washed with methanol to obtain Compound 5c (23.7 g).

—Synthesis of Compound 5d—

Reduced iron (27.8 g), ammonium chloride (2.7 g), isopropyl alcohol (290 mL) and water (29 mL) were placed in a three-necked flask, and the mixture was stirred with a mechanical stirrer (300 rpm) at 95° C. Into the flask, a small amount of concentrated hydrochloric acid was dropped for activation, and then Compound 5c (23.7 g) was slowly added. The mixture was agitated for 3 hours under reflux heating, and the reaction solution was filtered with CELITE. The filtrate was poured and added to an aqueous solution of ethyl acetate/sodium hydrogen carbonate (mixing ratio: ethyl acetate/sodium hydrogen carbonate=1/1). An organic layer was washed with a salt solution, dried with magnesium sulfate and concentrated under a reduced pressure. A residue after concentration was purified with silica-gel column chromatography (developing solvent: ethyl acetate/hexane=1/10, 1/5 after development) to obtain Compound 5d (21.3 g).

—Synthesis of Compound 5e—

A DMAc solution (100 mL) of 4-methylpyrazole (5.0 g), 1-chloro-3-iodobenzene (9.68 g), Cu$_2$O (0.29 g), cesium carbonate (26.46 g) and salicylaldehyde oxime (manufactured by Kanto Chemical Co., Inc.) (1.11 g) was reacted at 140° C. in a nitrogen atmosphere for 5 hours. Ethyl acetate was added to the reaction solution, and filtered with CELITE. The filtrate was poured and added to a saturated salt solution for separation. An organic layer was washed with a salt solution, dried with magnesium sulfate and concentrated under a reduced pressure. A residue after concentration was purified with silica-gel column chromatography (developing solvent: ethyl acetate/hexane=1/7) to obtain Compound 5e (6.35 g).

—Synthesis of Compound 5f—

A toluene solution (10 mL) of Compound 5e (1.0 g), Compound 5d (0.72 g), potassium t-butoxide (1.13 g), Pd(dba)$_2$ (27 mg) and 2-(di-t-butylphosphine)biphenyl (manufactured by Wako Pure Chemical Industries, Ltd.) (56.4 mg) was reacted at 110° C. in a nitrogen atmosphere for 6 hours. The reaction solution was added with ethyl acetate and water and separated. An organic layer was washed with a salt solution, dried with magnesium sulfate and concentrated under a reduced pressure. A residue after concentration was purified with silica-gel column chromatography (developing solvent: ethyl acetate/hexane=1/9) to obtain Compound 5f (0.65 g).

—Synthesis of Phosphorescent Compound 5—

A benzonitrile solution (3 mL) of Compound 5f (0.4 g) and PtCl$_2$ (0.17 g) was reacted at 190° C. in a nitrogen atmosphere for 24 hours. After reaction, benzonitrile was distilled away at a reduced pressure. A residue after concentration was purified with silica-gel column chromatography (developing solvent: chloroform/hexane=7/1). An obtained solid was washed with ethanol and then ethyl acetate to obtain Phosphorescent Compound 5 (0.3 g). The compound was identified with elemental analysis, NMR and MASS spectrum.

Structural optimization calculation was performed using GAUSSIAN 03 (Gaussian, Inc. of the United States) to calculate a molecule core diameter, a molecule core thickness and a molecular radius of Phosphorescent Compound 5. As a result, an aspect ratio was 3.1, and the molecular radius was 1.93 nm.

Synthesis Example 5

Synthesis of Phosphorescent Compound 6

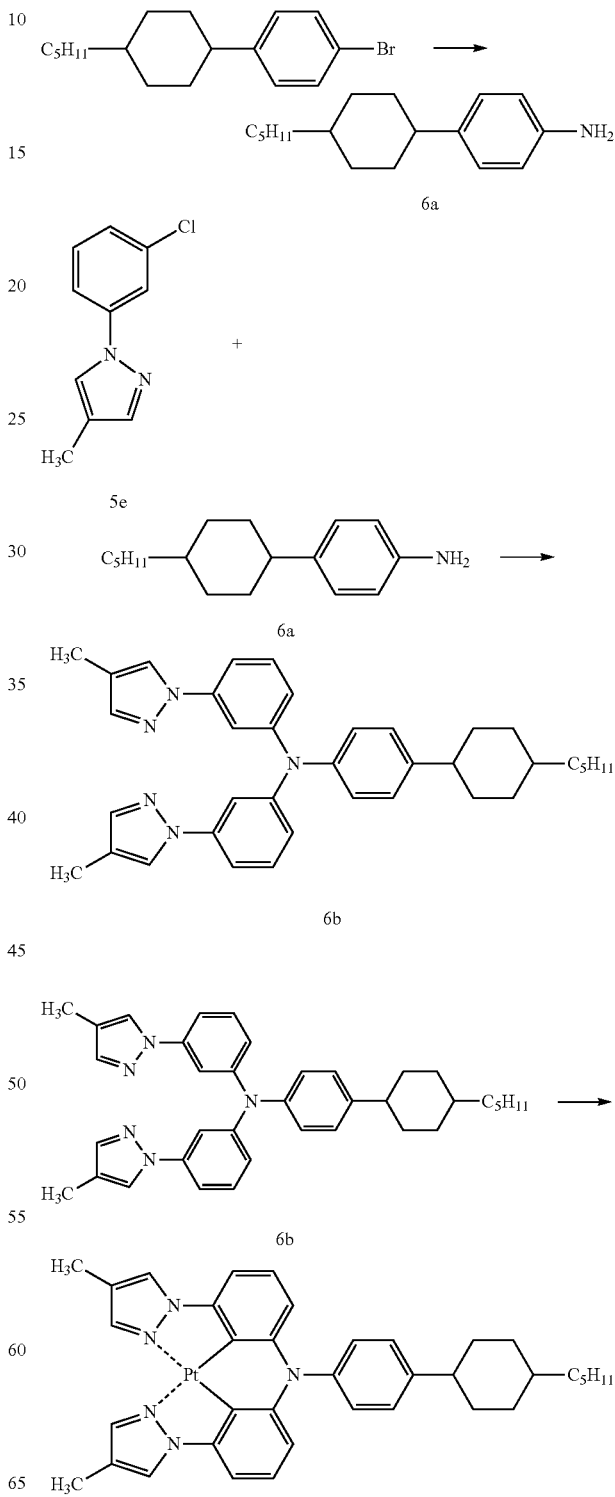

Phosphorescent Compound 6

47

—Synthesis of Compound 6a—

A THF solution (40 mL) of p-(trans-4-pentylcyclohexyl)bromobenzene (Tokyo Chemical Industry Co., Ltd.) (0.135 g), Pd(dba)$_2$ (0.15 g), lithium chloride (0.33 g) and zinc bis[bis(trimethylsilyl)amide] (manufactured by Aldrich Japan Inc.) (3 g) was reacted at 50° C. in a nitrogen atmosphere for 6 hours. The reaction solution was added with ethyl acetate, which was poured and added to a 1-N hydrochloric acid solution. The solution was neutralized with potassium carbonate and then separated. An organic layer was dried with magnesium sulfate and concentrated under a reduced pressure. A residue after concentration was purified with silica-gel column chromatography (developing solvent: ethyl acetate/hexane=1/3.5) to obtain Compound 6a (3.1 g).

—Synthesis of Compound 6b—

A toluene solution (10 mL) of Compound 5e (1.0 g), Compound 6a (0.58 g), potassium t-butoxide (1.13 g), Pd(dba)$_2$ (27 mg) and 2-(di-t-butylphosphine)biphenyl (manufactured by Wako Pure Chemical Industries, Ltd.) (56.4 mg) was reacted at 110° C. in a nitrogen atmosphere for 6 hours. The reaction solution was added with ethyl acetate and water for separation. An organic layer was washed with a salt solution, dried with magnesium sulfate and concentrated under a reduced pressure. A residue after concentration was purified with silica-gel column chromatography (developing solvent: ethyl acetate/hexane=1/9) to obtain Compound 6b (0.57 g).

—Synthesis of Phosphorescent Compound 6—

A benzonitrile solution (3 mL) of Compound 6b (0.3 g) and PtCl$_2$ (0.14 g) was reacted at 190° C. in a nitrogen atmosphere for 24 hours. After reaction, benzonitrile was distilled away at a reduced pressure. A residue after concentration was purified with silica-gel column chromatography (developing solvent: chloroform/hexane=7/1). An obtained solid was washed with ethanol and then ethyl acetate to obtain Phosphorescent Compound 6 (0.27 g). The compound was identified with elemental analysis, NMR and MASS spectrum.

Structural optimization calculation was performed using GAUSSIAN 03 (Gaussian, Inc. of the United States) to calculate a molecule core diameter, a molecule core thickness and a molecular radius of Phosphorescent Compound 6. As a result, an aspect ratio was 3.1, and the molecular radius was 1.74 nm.

Synthesis Example 6

Synthesis of Phosphorescent Compound 30

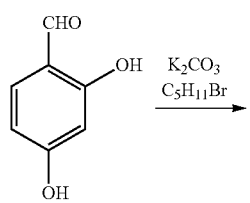

—Synthesis of Phosphorescent Compound 30—

Phosphorescent Compound 30 was synthesized in the same manner as the synthesis of Compound 1a in Synthesis Example 1 except that n-decylbromide in synthesis of Compound 1a of Synthesis Example 1 was replaced by n-pentylbromide. The obtained compound was identified with elemental analysis, NMR and MASS spectrum.

Structural optimization calculation was performed using GAUSSIAN 03 (Gaussian, Inc. of the United States) to calculate a molecule core diameter, a molecule core thickness and a molecular radius of Phosphorescent Compound 30. As a result, an aspect ratio was 12.3, and the molecular radius was 1.28 nm.

Synthesis Example 7

Synthesis of Phosphorescent Compound 16

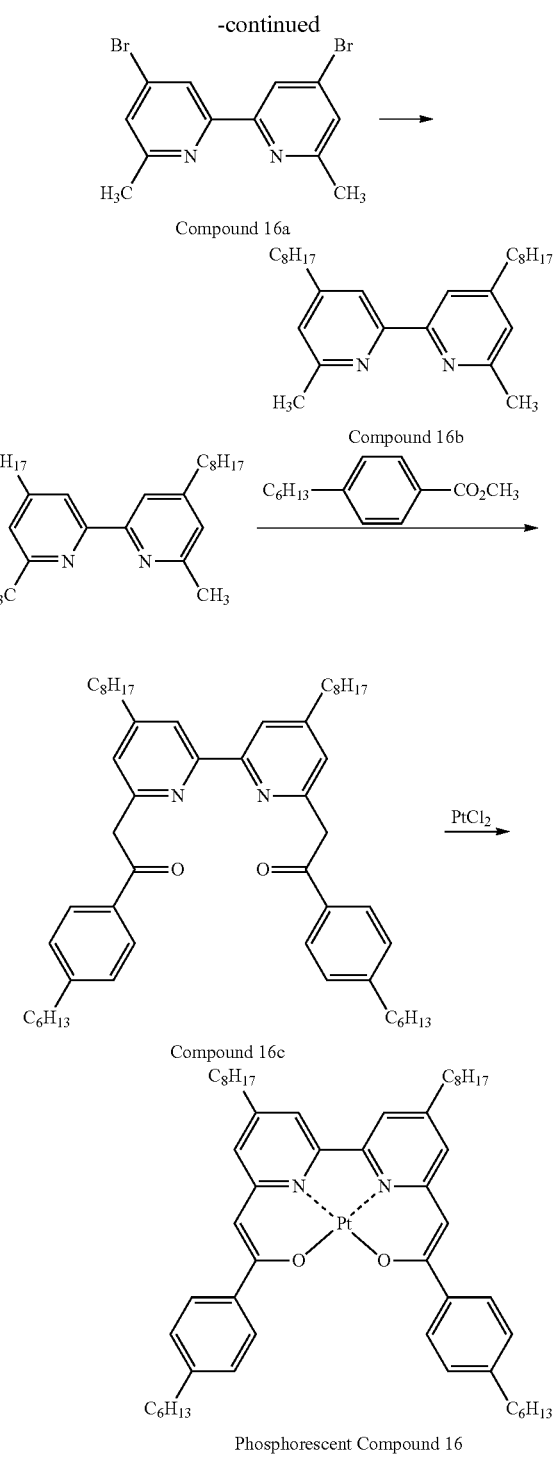

Compound 16a

Compound 16b

Compound 16c

Phosphorescent Compound 16

—Synthesis of Compound 16a—

Compound 16a was synthesized in accordance with a method described in Helvetica Chimica Acta, 1992, vol. 75, No. 5, p. 1578-1592.

—Synthesis of Compound 16b—

Compound 16b was synthesized in accordance with a method described in Dalton Transactions, 2003, No. 1, p. 153-159.

—Synthesis of Compound 16c—

To a diethyl ether solution (200 mL) of Compound 16b (3.2 g), an LDA/THF solution (18 mL) was dropped at −50° C. and stirred, then methyl-4-hexylbenzoate (7.8 g) was added at −10° C., and the mixture was stirred for 6 hours. The solution was poured and added to ice water. The mixture was added with chloroform and a 1-N hydrochloric solution and separated. An organic layer was dried with magnesium sulfate and concentrated under a reduced pressure. A residue after concentration was purified with silica-gel column chromatography to obtain Compound 16c (6.7 g).

—Synthesis of Phosphorescent Compound 16—

A benzonitrile solution (30 mL) of Compound 16c (3 g) and $PtCl_2$ (1 g) was reacted at 190° C. in a nitrogen atmosphere for 24 hours. After reaction, benzonitrile was distilled away at a reduced pressure. A residue after concentration was purified with silica-gel column chromatography. An obtained solid was washed with ethanol and then ethyl acetate to obtain Phosphorescent Compound 16 (2.7 g). The compound was identified with elemental analysis, NMR and MASS spectrum.

Structural optimization calculation was performed using GAUSSIAN 03 (Gaussian, Inc. of the United States) to calculate a molecule core diameter, a molecule core thickness and a molecular radius of Phosphorescent Compound 16. As a result, an aspect ratio was 5.5, and the molecular radius was 1.39 nm.

Synthesis Example 8

Synthesis of Phosphorescent Compound 23

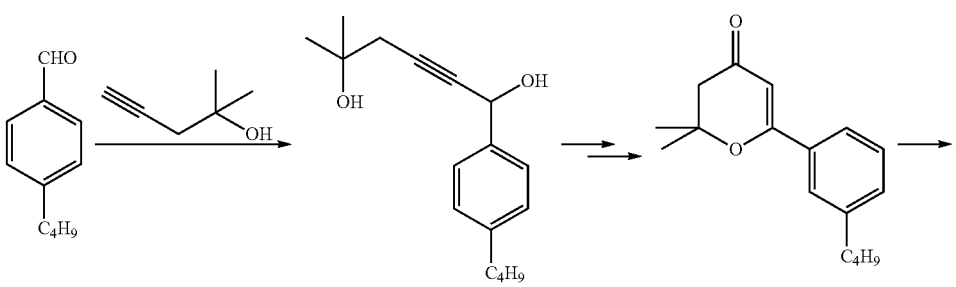

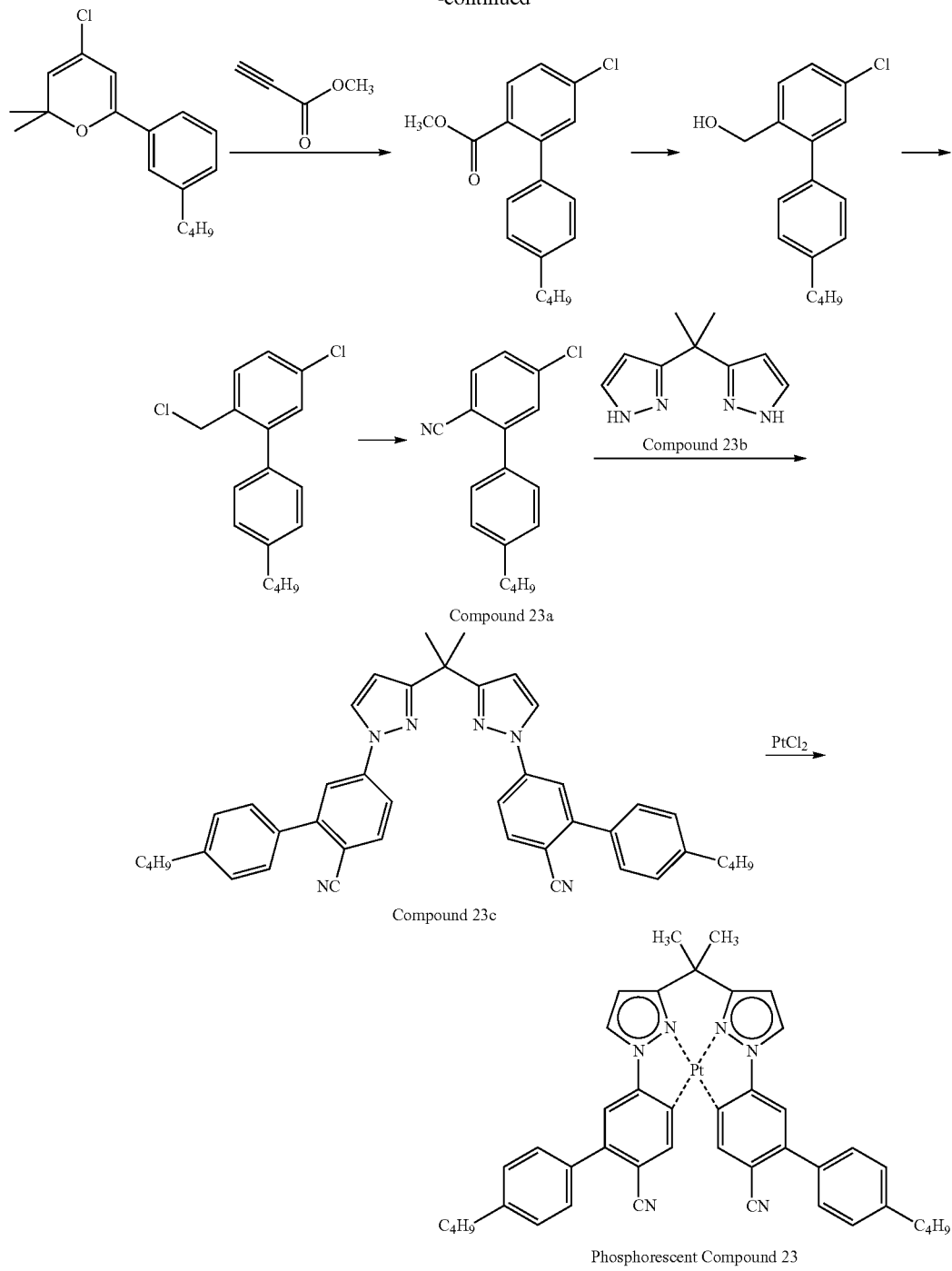

Phosphorescent Compound 23

—Synthesis of Compound 23a—

Compound 23a was synthesized in accordance with a method described in Helvetica Chimica Acta, 1991, vol. 74, No. 1, p. 27-46, Journal of Medicinal Chemistry, 1998, vol. 41, No. 19, p. 3582-3595 and International Publication No. WO 2006/37982.

—Synthesis of Compound 23c—

A DMAc solution (100 mL) of Compound 23a (22.4 g), Compound 23b (manufactured by Wako Pure Chemical Industries, Ltd.) (3.6 g), Cu2O (0.29 g), cesium carbonate (26.46 g) and salicylaldehyde oxime (manufactured by Kanto Chemical Co., Inc.) (1.11 g) was reacted at 140° C. in a nitrogen atmosphere for 5 hours. Ethyl acetate was added to the reaction solution, and filtered with CELITE. A saturated salt solution was poured and added to the filtrate for separation. An organic layer was washed with a salt solution, dried with magnesium sulfate and concentrated under a reduced pressure. A residue after concentration was purified with silica-gel column chromatography (developing solvent: ethyl acetate/hexane=1/7) to obtain Compound 23c (7.4 g).

—Synthesis of Phosphorescent Compound 23—

A benzonitrile solution (3 mL) of Compound 23c (2.4 g) and $PtCl_2$ (1 g) was reacted at 190° C. in a nitrogen atmosphere for 24 hours. After reaction, benzonitrile was distilled away at a reduced pressure. A residue after concentration was purified with silica-gel column chromatography. An obtained solid was washed with ethanol and then ethyl acetate to obtain Phosphorescent Compound 23 (1.1 g).

The compound was identified with elemental analysis, NMR and MASS spectrum.

Structural optimization calculation was performed using GAUSSIAN 03 (Gaussian, Inc. of the United States) to calculate a molecule core diameter, a molecule core thickness and a molecular radius of Phosphorescent Compound 23. As a result, an aspect ratio was 5.4, and the molecular radius was 1.37 nm.

Synthesis Example 9

Synthesis of Discotic Liquid-Crystalline Host Compound 1

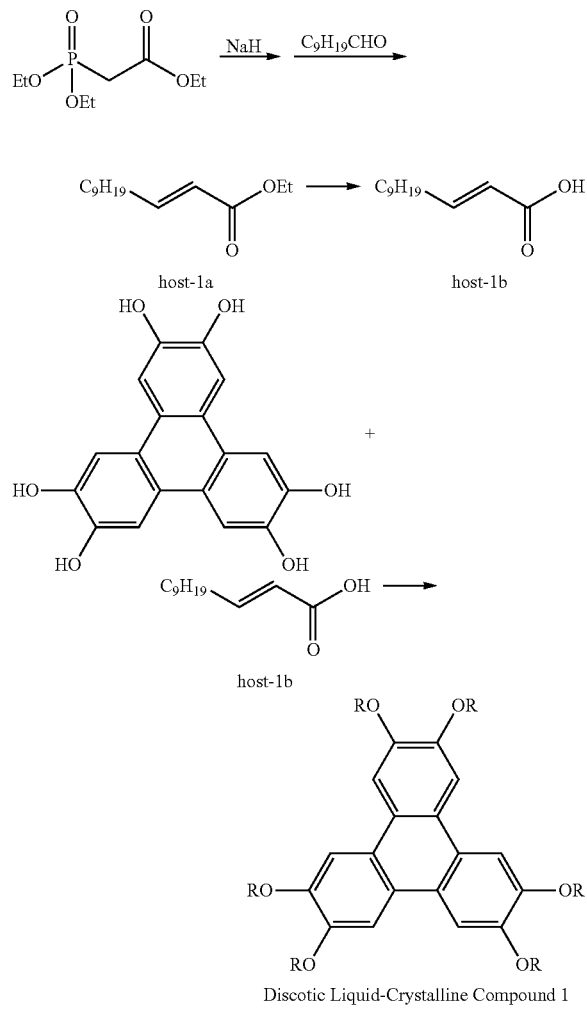

(In the above formula, Et represents an ethyl group.)

—Synthesis of Host 1a (Host-1a)—

To a 1,2-dimethoxyethane (DME) solution (200 mL) of ethyl diethyl phosphonoacetate (manufactured by Wako Pure Chemical Industries, Ltd.) (20 mL), NaH (40 g) was added while cooled in ice. After stirred at a room temperature for 10 minutes, a DME solution (60 mL) of decanal (manufactured by Wako Pure Chemical Industries, Ltd.) (18.9 mL) was dropped. The mixture was reacted at 80° C. for 3 hours, and the reaction solution was poured and added to ethyl acetate/dilute hydrochloric acid (mixing ratio: ethyl acetate/dilute hydrochloric acid=1/1). An organic layer was washed with a salt solution, dried with magnesium sulfate and concentrated under a reduced pressure. A residue after concentration was purified with silica-gel column chromatography (developing solvent: ethyl acetate/hexane=1/30) to obtain Host 1a (18.9 g).

—Synthesis of Host 1b (Host-1b)—

To a DME solution (100 mL) of Host 1a (10.6 g), an aqueous solution (40 mL) of lithium hydroxide monohydrate (4.3 g) was dropped, which was reacted at 80° C. for 5 hours. The reaction solution was poured and added to ethyl acetate/dilute hydrochloric acid (mixing ratio: ethyl acetate/dilute hydrochloric acid=1/1). The organic layer was washed with a salt solution, dried with sodium sulfate and concentrated under a reduced pressure. A residue after concentration was purified with silica-gel column chromatography (developing solvent: ethyl acetate/hexane=1/3) and re-crystallized with n-hexane to obtain Host 1b (7.0 g).

—Synthesis of Discotic Liquid-Crystalline Host Compound 1—

To a THF solution (80 mL) of Host 1b (8.6 g) and diisopropylethylamine (7.9 mL), mesyl chloride (3.2 mL) was dropped at −15° C. After stirred for 1 hour, diisopropylethylamine (7.9 mL) was added to the reaction solution, to which a THF solution (80 mL) of 2,3,6,7,10,11-hexahydroxytriphenylene hydrate (2 g) was dropped. A catalyst quantity of dimethylaminopyridine was further added to the reaction solution, which was stirred at a room temperature for 6 hours. The reaction solution was poured and added to ethyl acetate/dilute hydrochloric acid (mixing ratio: ethyl acetate/dilute hydrochloric acid=1/1). An organic layer was washed with a salt solution, dried with magnesium sulfate and concentrated under a reduced pressure. A residue after concentration was purified with silica-gel column chromatography (developing solvent: ethyl acetate/hexane=1/8) and re-crystallized with ethanol/n-hexane=95/5 to obtain Discotic Liquid-Crystalline Host Compound 1 (5.0 g). The compound was identified with elemental analysis, NMR and MASS spectrum. An appearance of the compound was a white solid. Structural optimization calculation was performed using GAUSSIAN 03 (Gaussian, Inc. of the United States) to calculate a molecular radius of Discotic Liquid-Crystalline Host Compound 1. As a result, the molecular radius was 1.80 nm.

The compound was observed under a polarizing microscope for a liquid-crystalline phase, and it exhibited a liquid-crystalline phase in the following temperature region.

Col 48 Nd 79 Iso (Col: Columnar Phase; Nd: discotic-nematic phase; Iso: isotropic phase)

Synthesis Example 10

Synthesis of Discotic Liquid-Crystalline Host Compound 4

Discotic Liquid-Crystalline Host Compound 4 represented by the following structural formula was synthesized by the following steps.

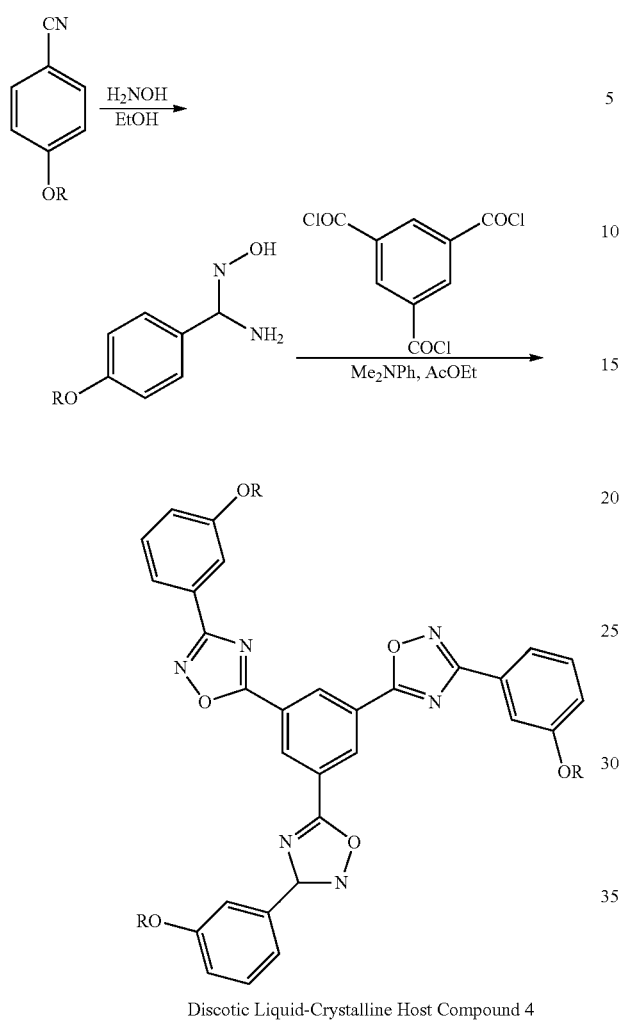

Discotic Liquid-Crystalline Host Compound 4

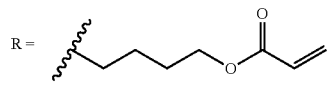

(In the above formula, Me represents a methyl group, Et represents an ethyl group, and Ph represents a phenyl group.)

In each step, a reaction was conducted with a favorable yield (60% to 80%), and 5.7 g of Discotic Liquid-Crystalline Host Compound 4 was obtained.

The compound was identified with elemental analysis, NMR and MASS spectrum. An appearance of the compound was a white solid. Structural optimization calculation was performed using GAUSSIAN 03 (Gaussian, Inc. of the United States) to calculate a molecular radius of Discotic Liquid-Crystalline Host Compound 4. As a result, the molecular radius was 1.89 nm.

The compound was observed under a polarizing microscope for a liquid-crystalline phase, and it exhibited a liquid-crystalline phase in the following temperature region.

Cr 48 Nd 116 Iso (Cr: crystalline phase; Nd: discotic-nematic phase; Iso: isotropic phase)

Synthesis Example 11

Synthesis of Discotic Liquid-Crystalline Host Compound 5

Discotic Liquid-Crystalline Host Compound 5 represented by the following structural formula was synthesized by the following steps.

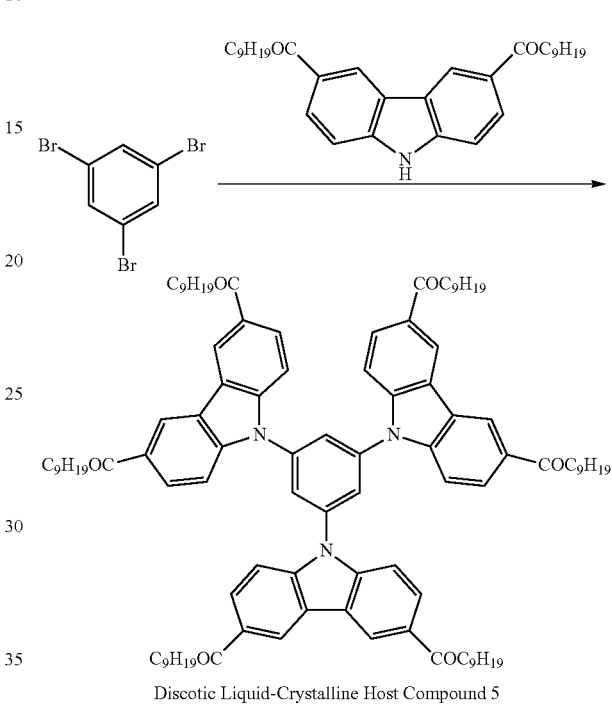

Discotic Liquid-Crystalline Host Compound 5

In each step, a reaction was conducted with a favorable yield (60% to 80%), and 3.2 g of Discotic Liquid-Crystalline Host Compound 5 was obtained.

The compound was identified with elemental analysis, NMR and MASS spectrum. An appearance of the compound was a white solid. Structural optimization calculation was performed using GAUSSIAN 03 (Gaussian, Inc. of the United States) to calculate a molecular radius of Discotic Liquid-Crystalline Host Compound 5. As a result, the molecular radius was 1.87 nm.

The compound was observed under a polarizing microscope for a liquid-crystalline phase, and it exhibited a liquid-crystalline phase in the following temperature region.

Cr 108 Col 166 Iso (Cr: crystalline phase; Col: columnar phase; Iso: isotropic phase)

Synthesis Example 12

Synthesis of Discotic Liquid-Crystalline Host Compound 6

Discotic Liquid-Crystalline Host Compound 6 represented by the following structural formula was synthesized in accordance with a method described in International Publication WO 2005/123737.

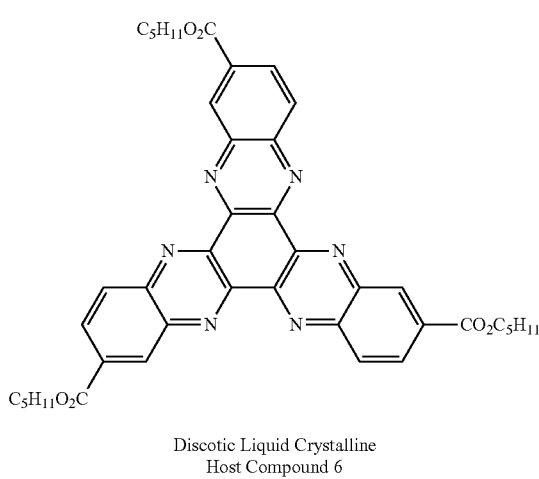

Discotic Liquid Crystalline
Host Compound 6

The compound was identified with elemental analysis, NMR and MASS spectrum. An appearance of the compound was a pale yellow solid. Structural optimization calculation was performed using GAUSSIAN 03 (Gaussian, Inc. of the United States) to calculate a molecular radius of Discotic Liquid-Crystalline Host Compound 6. As a result, the molecular radius was 1.46 nm.

The compound was observed under a polarizing microscope for a liquid-crystalline phase, and it exhibited a liquid-crystalline phase in the following temperature region.

Cr 195 Nd 177 Iso (Cr: crystalline phase; Nd: discotic-nematic phase; Iso: isotropic phase)

Example 1

Preparation of Material for Organic
Electroluminescence Element 1

Discotic Liquid-Crystalline Host Compound 1 (95 mg) and Phosphorescent Compound 1 (5 mg) were mixed and dissolved in THF, which was heated and dried at 90° C. in a nitrogen atmosphere for 20 minutes and dried at 120° C. in a vacuum sample drying oven at 120° C. at a reduced pressure for 1 hour, and thus Material for Organic Electroluminescence Element 1 was prepared. A size ratio of Phosphorescent Compound 1 and Discotic Liquid-Crystalline Host Compound 1 (molecular radius of Phosphorescent Compound 1/molecular radius of Discotic Liquid-Crystalline Host Compound 1) was calculated to be 1.06.

Examples 2 to 12

Preparation of Materials for Organic
Electroluminescence Element 2 to 12

By the same method for preparing Material for Organic Electroluminescence Element 1, Materials for Organic Electroluminescence Element 2 to 12 were prepared using discotic liquid-crystalline host compounds (95 mg) and phosphorescent compounds (5 mg) shown in Table 1 below.

Table 1 shows a size ratio of a phosphorescent compound to a discotic liquid-crystalline host compound in each material for organic electroluminescence element.

Discotic Liquid-Crystalline Host Compound 2 used in Example 6 is a compound described in JP-A 10-321371 and represented by the following structural formula below.

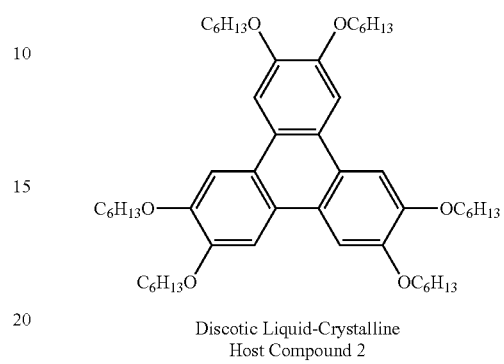

Discotic Liquid-Crystalline
Host Compound 2

Comparative Example 1

Preparation of Comparative Material for Organic
Electroluminescence Element 1

Comparative Material for Organic Electroluminescence Element 1 was prepared in the same manner as Example 1 except that Discotic Liquid-Crystalline Host Compound 1 in Example 1 was replaced by Discotic Liquid-Crystalline Host Compound 2 described in JP-A 10-321371. The size ratio of Phosphorescent Compound 1 and Discotic Liquid-Crystalline Host Compound 2 was calculated to be 1.55.

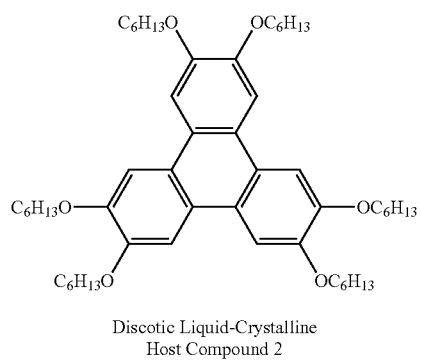

Discotic Liquid-Crystalline
Host Compound 2

Comparative Example 2

Preparation of Comparative Material for Organic
Electroluminescence Element 2

Comparative Material for Organic Electroluminescence Element 2 was prepared in the same manner as Example 1 except that Phosphorescent Compound 1 in Example 1 was replaced by Comparative Phosphorescent Compound 1 described in JP-A 10-321371. The size ratio of Comparative Phosphorescent Compound 1 and Discotic Liquid-Crystalline Host Compound 1 was calculated to be 0.34.

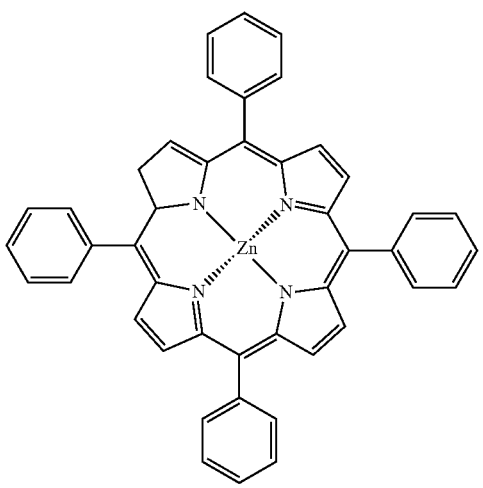

Comparative Phosphorescent
Compound 1

Comparative Example 3

Preparation of Comparative Material for Organic Electroluminescence Element 3

Comparative Material for Organic Electroluminescence Element 3 was prepared in the same manner as Example 1 except that Phosphorescent Compound 1 in Example 1 was replaced by Comparative Phosphorescent Compound 2 described in JP-A 2002-43056. The size ratio of Comparative Phosphorescent Compound 2 and Discotic Liquid-Crystalline Host Compound 1 was calculated to be 0.43.

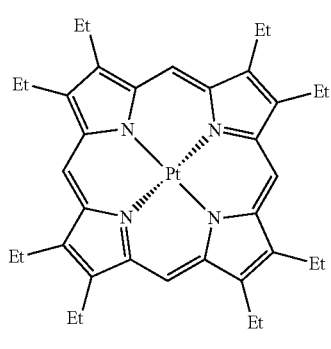

Comparative Phosphorescent
Compound 2

Comparative Example 4

Preparation of Comparative Material for Organic Electroluminescence Element 4

Comparative Material for Organic Electroluminescence Element 4 was prepared in the same manner as Comparative Example 2 except that Discotic Liquid-Crystalline Host Compound 1 in Comparative Example 2 was replaced by Discotic Liquid-Crystalline Host Compound 2 represented in the above structural formula. The size ratio of Comparative Phosphorescent Compound 1 and Discotic Liquid-Crystalline Host Compound 2 was calculated to be 0.56.

Comparative Example 5

Preparation of Comparative Material for Organic Electroluminescence Element 5

Comparative Material for Organic Electroluminescence Element 5 was prepared in the same manner as Comparative Example 3 except that Discotic Liquid-Crystalline Host Compound 1 in Comparative Example 3 was replaced by Discotic Liquid-Crystalline Host Compound 3 described in JP-A 2002-43056. The size ratio of Comparative Phosphorescent Compound 2 and Discotic Liquid-Crystalline Host Compound 3 was calculated to be 0.57.

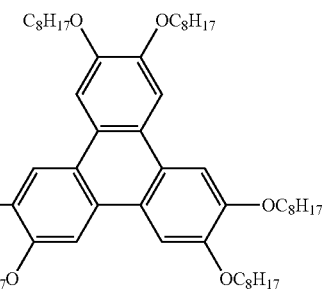

Discotic Liquid-Crystalline
Host Compound 3

Comparative Example 6

Preparation of Comparative Material for Organic Electroluminescence Element 6

Comparative Material for Organic Electroluminescence Element 6 was prepared in the same manner as Example 1 except that Phosphorescent Compound 1 in Example 1 was replaced by Comparative Phosphorescent Compound 3 represented by the following structural formula. The size ratio of Comparative Phosphorescent Compound 3 and Discotic Liquid-Crystalline Host Compound 1 was calculated to be 0.86.

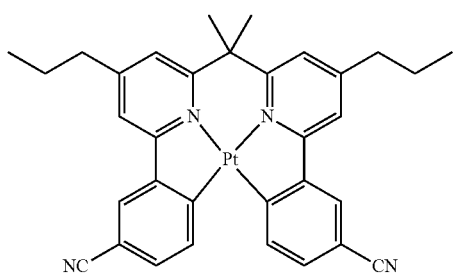

Comparative Phosphorescent
Compound 3

Comparative Example 7

Preparation of Comparative Material for Organic Electroluminescence Element 7

Comparative Material for Organic Electroluminescence Element 7 was prepared in the same manner as Example 1 except that Discotic Liquid-Crystalline Host Compound 1 in Example 1 was replaced by Non-Liquid-Crystalline Host Compound 1 (NPD) represented by the following structural formula. The size ratio of Phosphorescent Compound 1 and Non-Liquid-Crystalline Host Compound 1 was calculated to be 1.05.

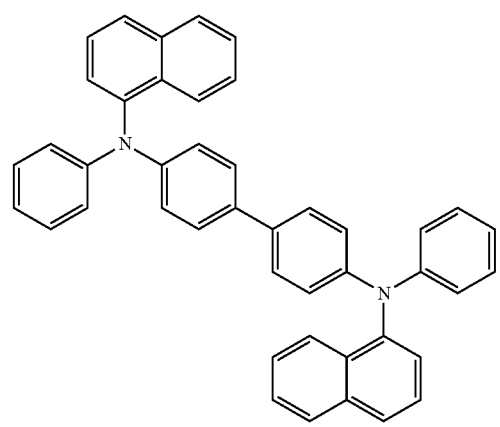

Non-Liquid-Crystaline
Host Compound 1
(NPD)

Comparative Example 8

Preparation of Comparative Material for Organic Electroluminescence Element 8

Comparative Material for Organic Electroluminescence Element 8 was prepared in the same manner as Example 1 except that Phosphorescent Compound 1 in Example 1 was replaced by Comparative Phosphorescent Compound 4 represented by the following structural formula. The size ratio of Comparative Phosphorescent Compound 4 and Discotic Liquid-Crystalline Host Compound 1 was calculated to be 0.77.

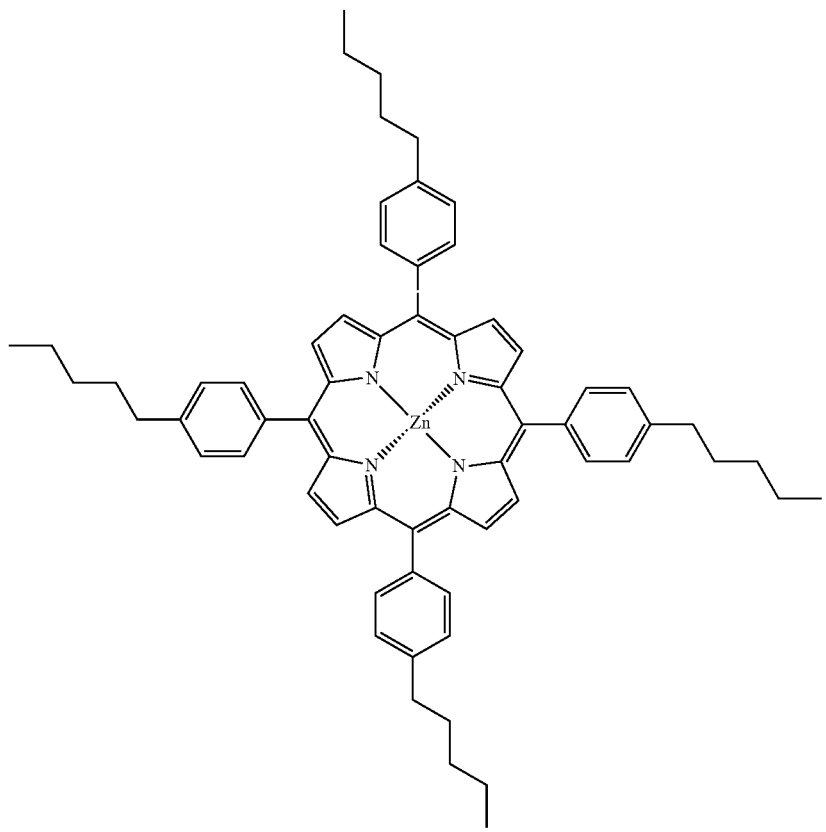

Comparative Phosphorescent
Compound 4

Comparative Example 9

Preparation of Comparative Material for Organic Electroluminescence Element 9

Comparative Material for Organic Electroluminescence Element 9 was prepared in the same manner as Comparative Example 1 except that Phosphorescent Compound 1 in Comparative Example 1 was replaced by Comparative Phosphorescent Compound 5 represented by the following structural formula. The size ratio of Comparative Phosphorescent Compound 5 and Discotic Liquid-Crystalline Host Compound 2 was calculated to be 1.23.

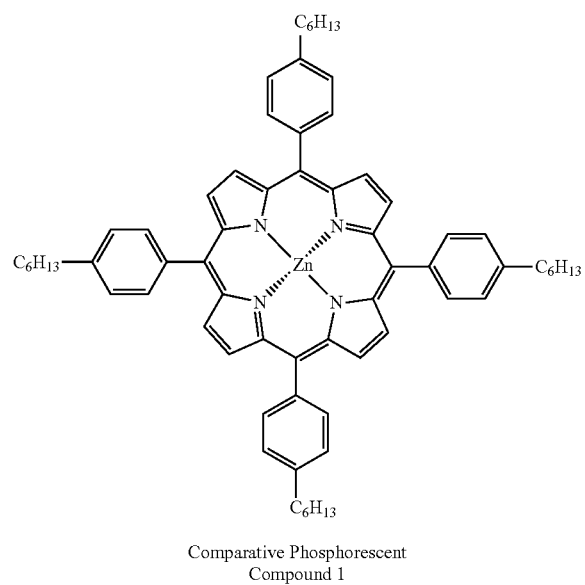

Comparative Phosphorescent Compound 1

(Evaluation of Materials for Organic Electroluminescence Element 1 to 12 and Comparative Materials for Organic Electroluminescence Element 1 to 9)

—Preparation of Evaluation Cells—

Material for Organic Electroluminescence Element 1 was injected at 120° C. in a liquid crystal cell manufactured by Sun Trading Co., Ltd. and sealed with an epoxy resin. The cell was annealed at 100° C. and gradually cooled, and thus Evaluation Cell 1 was prepared. The liquid crystal cell manufactured by Sun Trading Co., Ltd. is a liquid crystal cell that a rubbing-treated vertically-oriented polyimide alignment film JALS-682 (manufactured by JSR Corporation) is attached to a glass plate having a thickness of 1.1 mm with an ITO transparent electrode, having a cell gap of 8 μm and with epoxy resin sealing. Evaluation Cells 2 to 12 were prepared in the same manner for Materials for Organic Electroluminescence Element 2 to 12.

—Preparation of Comparative Evaluation Cells—

Comparative Evaluation Cells 1 to 9 were prepared in the same manner except that Material for Organic Electroluminescence Element 1 was replaced by Comparative Materials for Organic Electroluminescence Element 1 to 9.

<Measurement of Order Parameter>

Evaluation Cell 1 thus prepared was irradiated with polarized lights, which are in parallel with and perpendicular to, respectively, the rubbing direction, and the respective absorption spectra ($A\|$ and $A\perp$) were measured using an ultraviolet and visible spectrophotometer (V-670) manufactured by JASCO Corporation. From $A\|$ and $A\perp$ at a maximum absorption wavelength, an order parameter S was obtained based on Equations (1) and (2) below. The results are shown in Table 1. The same measurements were performed for Evaluation Cells 2 to 12 and Comparative Evaluation Cells 1 to 9.

$$R=(2A\|-A\perp)/A\perp \quad \text{Equation (1)}$$

$$S=(R-1)/(R+2) \quad \text{Equation (2)}$$

<Measurement of Polarized Emission Ratio>

An excitation light (ultraviolet-visible (UV-VIS) fiber light source L10290, manufactured by Hamamatsu Photonics K. K.) was irradiated at an angle of 45° on thus prepared Liquid Crystal Cell 1, and polarized emission was measured by a fluorophotometer with a polarizer (compact fiber-optic fluorescent spectroscopy USB4000-FL manufactured by Ocean Optics Inc.) arranged at an angle of 90° (normal direction with respect to the substrate). The result is shown in Table 1. Measurements were made similarly for Evaluation Cells 2 to 12 and Comparative Evaluation Cells 1 to 9.

TABLE 1

|  | Material for organic electroluminescence element | Phosphorescent compound | Aspect ratio | Discotic liquid-crystalline host compound | Size ratio | Order parameter | Polarized emission ratio |
|---|---|---|---|---|---|---|---|
| Ex. 1 | 1 | 1 | 12.3 | 1 | 1.06 | 0.7 | 3.8 |
| Ex. 2 | 2 | 3 | 12.3 | 1 | 1.06 | 0.62 | 2.8 |
| Ex. 3 | 3 | 4 | 12.3 | 1 | 1.06 | 0.66 | 3.2 |
| Ex. 4 | 4 | 5 | 3.1 | 1 | 1.07 | 0.55 | 2.2 |
| Ex. 5 | 5 | 6 | 3.1 | 1 | 0.96 | 0.58 | 2.4 |
| Ex. 6 | 6 | 30 | 12.3 | 2 | 1.04 | 0.69 | 3.7 |
| Ex. 7 | 7 | 1 | 12.3 | 4 | 1.01 | 0.74 | 4.0 |
| Ex. 8 | 8 | 5 | 3.1 | 4 | 1.02 | 0.72 | 3.8 |
| Ex. 9 | 9 | 1 | 12.3 | 5 | 1.02 | 0.73 | 3.9 |
| Ex. 10 | 10 | 6 | 3.1 | 5 | 0.93 | 0.71 | 3.8 |
| Ex. 11 | 11 | 16 | 5.5 | 6 | 0.96 | 0.62 | 2.8 |
| Ex. 12 | 12 | 23 | 5.4 | 6 | 0.92 | 0.64 | 3.1 |
| Comp. Ex. 1 | Comp. 1 | 1 | 12.3 | 2 | 1.55 | 0.38 | 1.4 |
| Comp. Ex. 2 | Comp. 2 | Comp. 1 | 9.6 | 1 | 0.34 | 0.41 | 1.5 |
| Comp. Ex. 3 | Comp. 3 | Comp. 2 | 4.2 | 1 | 0.43 | 0.42 | 1.5 |
| Comp. Ex. 4 | Comp. 4 | Comp. 1 | 9.6 | 2 | 0.56 | 0.35 | 1.2 |
| Comp. Ex. 5 | Comp. 5 | Comp. 2 | 4.2 | 3 | 0.57 | 0.37 | 1.3 |
| Comp. Ex. 6 | Comp. 6 | Comp. 3 | 2.9 | 1 | 0.86 | 0.4 | 1.4 |

TABLE 1-continued

|  | Material for organic electro-luminescence element | Phosphorescent compound | Aspect ratio | Discotic liquid-crystalline host compound | Size ratio | Order parameter | Polarized emission ratio |
|---|---|---|---|---|---|---|---|
| Comp. Ex. 7 | Comp. 7 | 1 | 12.3 | NLC1 | 1.05 | 0 | 1 |
| Comp. Ex. 8 | Comp. 8 | Comp. 4 | 4.2 | 1 | 0.77 | 0.44 | 1.6 |
| Comp. Ex. 9 | Comp. 9 | Comp. 5 | 4.2 | 2 | 1.23 | 0.4 | 1.4 |

(In the column of material for organic electroluminescence element, "Comp." denotes a comparative material for organic electroluminescence element. In the column of phosphorescent compound, "Comp." denotes a comparative phosphorescent compound. In the column of discotic liquid-crystalline host compound, "NLC" denotes a non-liquid-crystalline host compound.)

As it is understood from Table 1, materials for organic electroluminescence element having an aspect ratio of phosphorescent compound of 3 or greater and having a size ratio of molecule core diameter of phosphorescent compound and molecular radius of discotic liquid-crystalline host compound of 0.8 to 1.2 have high order parameter and polarized emission ratio.

Example 13

Preparation of Evaluation Substrate 1

<<Confirmation of Horizontally Oriented Emission>>

A quartz glass substrate of 25 mm×25 mm×0.7 mm was washed and treated with UV-ozone. Then, the substrate was spin coated with an alignment film (a horizontal alignment film SE-130 manufactured by Nissan Chemical Co., Ltd.) and heated at 100° C. for 10 minutes and then at 180° C. for 1 hour, and thus a base substrate was obtained.

A THF solution having a solid content of 2% of Discotic Liquid-Crystalline Host Compound 1 (92 mg), Phosphorescent Compound 1 (7 mg) and Fluorine Atom Containing Compound 1 (1 mg) represented by the structural formula below was prepared and spin coated (500 rpm and 5 seconds followed by 2,000 rpm, 20 seconds) on the base substrate in a nitrogen atmosphere. This was vacuum-dried at 50° C., and Evaluation Substrate 1 was prepared. Evaluation Substrate 1 was observed with a polarizing microscope under crossed nicols, and it was dark field and confirmed that the substrate was horizontally oriented. In general, a discotic liquid crystal has no anisotropy in the refractive index of the molecular plane. Thus, under the above condition, it produces dark field when it is horizontally oriented, and it produces bright field when it is not horizontally oriented.

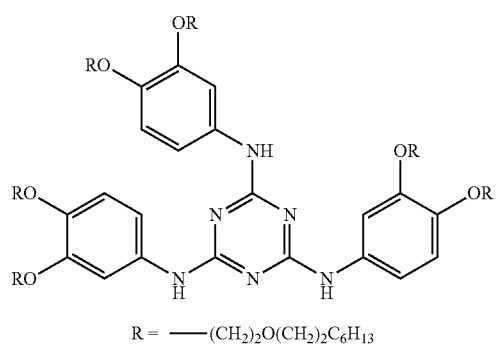

Fluorine Atom Containing Compound 1

Examples 14 to 18

Preparation of Evaluation Substrates 2 to 6

<<Confirmation of Horizontally Oriented Emission>>

Evaluation Substrates 2 to 6 were prepared in the same manner as Evaluation Substrate 1 except that discotic liquid-crystalline host compounds (92 mg) and phosphorescent compounds (7 mg) shown in Table 2 below were used. Evaluation Substrates 2 to 6 were observed with a polarizing microscope under crossed nicols, and they were dark field and confirmed that the substrates were horizontally oriented.

Comparative Example 10

Preparation of Comparative Evaluation Substrate 1

Comparative Evaluation Substrate 1 was prepared in the same manner as Example 13 except that Discotic Liquid-Crystalline Host Compound 1 in Example 13 was replaced by Discotic Liquid-Crystalline Host Compound 2 described in JP-A 10-321371.

Comparative Example 11

Preparation of Comparative Evaluation Substrate 2

Comparative Evaluation Substrate 2 was prepared in the same manner as Example 13 except that Phosphorescent Compound 1 in Example 13 was replaced by Comparative Phosphorescent Compound 1 described in JP-A 10-321371.

Comparative Example 12

Preparation of Comparative Evaluation Substrate 3

Comparative Evaluation Substrate 3 was prepared in the same manner as Example 13 except that Phosphorescent Compound 1 in Example 13 was replaced by Comparative Phosphorescent Compound 2 described in JP-A 2002-43056.

Comparative Example 13

Preparation of Comparative Evaluation Substrate 4

Comparative Evaluation Substrate 4 was prepared in the same manner as Comparative Example 12 except that Discotic Liquid-Crystalline Host Compound 1 in Comparative Example 12 was replaced by Discotic Liquid-Crystalline Host Compound 2 represented by the structural formula above.

Comparative Example 14

Preparation of Comparative Evaluation Substrate 5

Comparative Evaluation Substrate 5 was prepared in the same manner as Comparative Example 12 except that Discotic Liquid-Crystalline Host Compound 1 in Comparative Example 12 was replaced by Discotic Liquid-Crystalline Host Compound 3 described in JP-A 2002-43056.

Comparative Example 15

Preparation of Comparative Evaluation Substrate 6

Comparative Evaluation Substrate 6 was prepared in the same manner as Example 13 except that Phosphorescent Compound 1 in Example 13 was replaced by Comparative Phosphorescent Compound 3 represented by the structural formula above.

Comparative Example 16

Preparation of Comparative Evaluation Substrate 7

Comparative Evaluation Substrate 7 was prepared in the same manner as Example 13 except that Discotic Liquid-Crystalline Host Compound 1 in Example 13 was replaced by Non-Liquid-Crystalline Host Compound 1 (NPD) represented by the structural formula above.

Comparative Example 17

Preparation of Comparative Evaluation Substrate 8

Comparative Evaluation Substrate 8 was prepared in the same manner as Example 13 except that Phosphorescent Compound 1 in Example 13 was replaced by Comparative Phosphorescent Compound 4 represented by the structural formula above.

Comparative Example 18

Preparation of Comparative Evaluation Substrate 9

Comparative Evaluation Substrate 9 was prepared in the same manner as Example 10 except that Phosphorescent Compound 1 in Example 10 was replaced by Comparative Phosphorescent Compound 5 represented by the structural formula above.

(Evaluation of Evaluation Substrates 1 to 6 and Comparative Evaluation Substrates 1 to 9)

<Evaluation of PL Emission Distribution>

Prepared Evaluation Substrate 1 was measured for PL emission distribution (angle variation measurement) (using a motorized θ stage manufactured by Suruga Seiki Ltd.). The measurements were normalized using the sum of luminance obtained at each angle. The emission distribution was calculated as luminescence intensity ratio of the evaluation substrate in its 90° direction to Comparative Evaluation Substrate 7 which included a Non-Liquid-Crystalline Host Compound 1 and emitted light isotropically. The results are shown in Table 2. Measurements were performed similarly for Evaluation Substrates 2 to 6 and Comparative Evaluation Substrates 1 to 9.

TABLE 2

|  | Evaluation substrate | Phosphorescent compound | Aspect ratio | Discotic liquid-crystalline host compound | Size ratio | Emission distribution |
|---|---|---|---|---|---|---|
| Example 13 | Evaluation Substrate 1 | 1 | 12.3 | 1 | 1.06 | 1.4 |
| Example 14 | Evaluation Substrate 2 | 3 | 12.3 | 1 | 1.06 | 1.32 |
| Example 15 | Evaluation Substrate 3 | 4 | 12.3 | 1 | 1.06 | 1.36 |
| Example 16 | Evaluation Substrate 4 | 5 | 3.1 | 1 | 1.07 | 1.25 |
| Example 17 | Evaluation Substrate 5 | 6 | 3.1 | 1 | 0.96 | 1.28 |
| Example 18 | Evaluation Substrate 6 | 30 | 12.3 | 2 | 1.04 | 1.39 |
| Comp. Ex. 10 | Comparative Substrate 1 | 1 | 12.3 | 2 | 1.55 | 1.08 |
| Comp. Ex. 11 | Comparative Substrate 2 | Comp. 1 | 9.6 | 1 | 0.34 | 1.11 |
| Comp. Ex. 12 | Comparative Substrate 3 | Comp. 2 | 4.2 | 1 | 0.43 | 1.12 |
| Comp. Ex. 13 | Comparative Substrate 4 | Comp. 1 | 9.6 | 2 | 0.56 | 1.05 |
| Comp. Ex. 14 | Comparative Substrate 5 | Comp. 2 | 4.2 | 3 | 0.57 | 1.07 |
| Comp. Ex. 15 | Comparative Substrate 6 | Comp. 3 | 2.9 | 1 | 0.86 | 1.1 |
| Comp. Ex. 16 | Comparative Substrate 7 | 1 | 12.3 | NLC 1 | 1.05 | 1 |
| Comp. Ex. 17 | Comparative Substrate 8 | Comp. 4 | 4.2 | 1 | 0.77 | 1.14 |
| Comp. Ex. 18 | Comparative Substrate 9 | Comp. 5 | 4.2 | 2 | 1.23 | 1.1 |

(In Table 2, "comparative substrate" denotes a comparative evaluation substrate. In the column of phosphorescent compound, "Comp." denotes a comparative phosphorescent compound. In the column of discotic liquid-crystalline host compound, "NLC" denotes a non-liquid-crystalline host compound.)

It is understood from Table 2 that a material for organic electroluminescence element having an aspect ratio of a phosphorescent compound of 3 or greater and a size ratio of molecule core diameter of a phosphorescent compound and a molecular radius of a discotic liquid-crystalline host compound of 0.8 to 1.2 has increased luminance in the front direction since it has high emission distribution.

Example 19

Preparation of Organic Electroluminescence Element A

—Preparation of Coating Solution 1—

Methyl ethyl ketone (MEK) (99.0 wt %) was mixed with Phosphorescent Compound 1 represented by the structural formula above (0.1 wt %) and Discotic Liquid-Crystalline Host Compound 1 represented by the structural formula above (0.9 wt %), and a coating solution for organic electroluminescence element (Coating Solution 1) was obtained.

—Preparation of Organic Electroluminescence Element A—

ITO was vapor-deposited to form a film having a thickness of 150 nm on a glass substrate of 25 mm×25 mm×0.7 mm to obtain a transparent support substrate. This transparent support substrate was etched and washed.

In 98 parts by mass of cyclohexanone for electronics industry (manufactured by Kanto Chemical Co., Inc.), 2 parts by mass of PTPDES-2 represented by the structural formula below (manufactured by Chemipro Kasei Kaisha, Ltd.; Tg=205° C.) was dissolved, which was spin-coated (2,000 rpm, 20 seconds) on this ITO glass substrate such that the thickness was about 40 nm. This was dried at 120° C. for 30 minutes and then annealed at 160° C. for 10 minutes to form a hole injection layer.

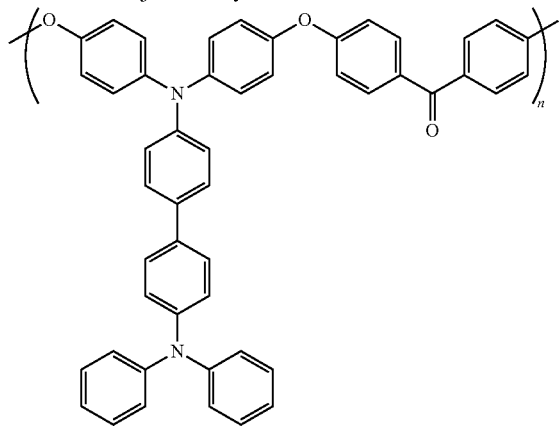

PTPDES-2

In a glove box (dew point: −68° C.; oxygen concentration: 10 ppm), Coating Solution 1 was spin-coated on this hole injection layer such that the thickness was about 40 nm to form a light-emitting layer.

Then, on the light-emitting layer, BAlq (bis-(2-methyl-8-quinolinolato)-4-(phenyl-phenolato)-aluminum(III)) represented by the structural formula below was vapor-deposited such that a thickness thereof was 40 nm to form a film as an electron transporting layer.

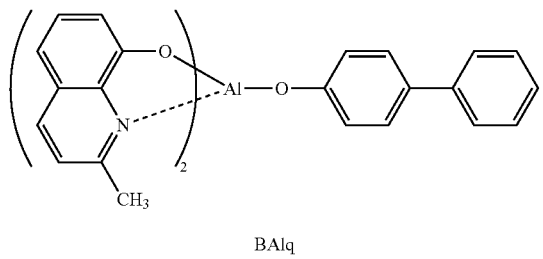

BAlq

On the electron transporting layer, lithium fluoride (LiF) was vapor-deposited such that a thickness thereof was 1 nm to form a film as an electron injection layer. Further, metallic aluminum was vapor-deposited such that a thickness thereof was 70 nm to form a cathode.

A laminated body prepared as above was placed in a glove box purged with argon gas and was sealed with a stainless-steel sealing can and an ultraviolet cure adhesive (XNR5516HV, manufactured by Nagase-CIBA Ltd.) to prepare an Organic Electroluminescence Element A.

Examples 20 to 24

Preparation of Organic Electroluminescence Elements B to F

Organic Electroluminescence Elements B to F were prepared in the same manner as Example 19 except that Phosphorescent Compound 1 and Discotic Liquid-Crystalline Host Compound 1 included in Coating Solution 1 in Example 19 was replaced by the combinations of phosphorescent compound and discotic liquid-crystalline host compounds shown in Table 3 below, respectively.

Comparative Examples 19 and 20

Preparation of Organic Electroluminescence Elements a and b

Organic Electroluminescence Elements a and b were prepared in the same manner as Example 19 except that Phosphorescent Compound 1 and Discotic Liquid-Crystalline Host Compound 1 included in Coating Solution 1 in Example 19 was replaced by the combinations of phosphorescent compounds and discotic liquid-crystalline host compounds shown in Table 3 below, respectively.

(Evaluation of Organic Electroluminescence Elements)

<External Quantum Efficiency>

A direct-current voltage was applied on each element using a source-measurement unit 2400 manufactured by Keithley Instruments, Inc., and the luminance was measured using a luminance meter BM-8 manufactured by Topcon Technohouse Corporation. Emission spectrum and emission wavelength were measured using spectral analyzer PMA-11 manufactured by Hamamatsu Photonics K. K. Based on these, external quantum efficiency when luminance was around 1,000 cd/m$^2$ was calculated by a luminance conversion method. Here, the calculated value is a relative value with respect to external quantum efficiency of Comparative Example 19 using Comparative Light-Emitting Material 1 as unity.

<Evaluation of Element Durability>

With initial luminance of 500 cd/m$^2$, a constant current is applied at a room temperature to Organic Electroluminescence Elements A to F and a to b for continuous driving, and time it took until the luminance was reduced to a half of the initial value was measured. Based on the measured value, luminance half-life of Organic Electroluminescence Elements A to F and b were evaluated with respect to luminance half-life of organic electroluminescence element as unity. The results are shown in Table 3.

TABLE 3

| Organic electro-luminescence element | Host material | Light-emitting material | Size ratio | Order parameter | Relative external quantum efficiency | Luminance half-life |
|---|---|---|---|---|---|---|
| Example 19 | A | 1 | 1 | 1.06 | 0.7 | 1.5 | 1.2 |
| Example 20 | B | 1 | 4 | 1.06 | 0.66 | 1.3 | 1.1 |
| Example 21 | C | 4 | 1 | 1.01 | 0.74 | 1.5 | 1.4 |
| Example 22 | D | 5 | 1 | 1.02 | 0.73 | 1.5 | 2.1 |
| Example 23 | E | 6 | 16 | 0.96 | 0.62 | 1.3 | 3.5 |
| Example 24 | F | 6 | 23 | 0.92 | 0.64 | 1.3 | 5.7 |
| Comp. Ex. 19 | a | 2 | 1 | 1.55 | 0.38 | 1 | 1 |
| Comp. Ex. 20 | b | 1 | Comp. 2 | 0.43 | 0.42 | 1.1 | 0.9 |

As it is understood from Table 3, compared to Organic Electroluminescence Elements a and b as comparative examples, Organic Electroluminescence Elements A to F of the present invention were superior in view of external quantum efficiency and element durability (luminance half-life). Since the Organic Electroluminescence Element A to F and Organic Electroluminescence Elements a and b had almost the same electron affinity and ionization potential, it is presumed that the difference of element durability is caused by improved light extraction efficiency due to the transition dipole moment of the phosphorescent compound being oriented horizontally with respect to the anode.

Examples 25 to 30 and Comparative Examples 21 and 22

Preparation of Organic Electroluminescence Elements G to L and Organic Electroluminescence Elements c and d Indium Tin Oxide (ITO) was sputter-deposited on a glass substrate, measuring 25 mm by 25 mm and a thickness of 0.7 mm to form an anode having a thickness of 150 nm, which was then etched and washed. The substrate with the film of ITO was placed in a washing container for ultrasonic cleaning in 2-propanol and then subjected to UV-ozone treatment for 30 minutes. On this glass substrate, the following layers were respectively formed.

Then, a hole injection layer coating solution that 5 parts by mass of Compound A represented by the structural formula below (Compound 1 described in US Patent Publication 2008/0220265 A1) was dissolved or dispersed in 99.5 parts by mass of cyclohexanone for electronics industry (manufactured by Kanto Chemical Co., Inc.) was spin-coated on the anode (ITO), which was dried at 200° C. for 30 minutes to form a hole injection layer having a thickness of 5 nm. Here, the spin-coating and drying were performed in a glove box (dew point: −60° C.; oxygen concentration: 1 ppm).

Then, 10 parts by mass of Compound B represented by the structural formula below (HTL-1 described in US 2008/0220265 A1) was dissolved in 99.0 parts by mass of toluene (dehydrated) (manufactured by Wako Pure Chemical Industries, Ltd.) to prepare a hole transporting layer coating solution. This hole transporting layer coating solution was spin-coated on the hole injection layer and dried at 200° C. for 30 minutes to form a hole transporting layer having a thickness of 18 nm.

Then, 9 parts by mass of the compound shown in Table 4 as a host material and 1 part by mass of the compound shown in Table 4 as a light-emitting material were dissolved or dispersed in 99.0 parts by mass of THF, to which molecular sieves (trade name: MOLECULAR SIEVES 3A 1/16, manufactured by Wako Pure Chemical Industries, Ltd.) were added. This was then filtered using a syringe filter having a pore diameter of 0.22 μm in a glove box to prepare a light-emitting layer coating solution. The coating solution was spin-coated on a hole transporting layer and dried at 100° C. for 30 minutes to form a light-emitting layer having a thickness of 30 nm.

Then, BAlq bis-(2-methyl-8-quinolinolato)-4-(phenyl-phenolato)-aluminum(III)) was vapor-deposited on the light-emitting layer to form an electron transporting layer having a thickness of 40 nm.

Then, lithium fluoride (LiF) was vapor-deposited on the electron transporting layer to form an electron injection layer having a thickness of 1 nm.

Then, metallic aluminum was vapor-deposited on the electron injection layer to form a cathode having a thickness of 70 nm.

A laminated body prepared as above was placed in a glove box purged with argon gas and was sealed with a stainless-steel sealing can and an ultraviolet cure adhesive (XNR5516HV, manufactured by Nagase-CIBA Ltd.).

Organic Electroluminescence Elements G to L as well as c and d prepared as above were evaluated similarly to Example 19. The results are shown in Table 4.

exchange resin LEWATIT® MP62WS (manufactured by LANXESS K.K.) were added and agitated for 1 hour to terminate a reaction. Here, the two ion-exchange resins were washed separately with deionized water before use until no color was observed in the water.

The ion-exchange resins were separated by filtering the dispersion as obtained above to obtain a water dispersion of PEDOT (poly(3,4-ethylenedioxythiophene))/NAFION.

The obtained water dispersion was added with a 1-N hydrochloric acid and subjected to centrifugation. Then, a solid content was recovered and added with deionized water, which was again subjected to centrifugation to recover a slurry including poly(3,4-ethylenedioxythiophene) (PEDOT) and an acid polymer.

By mixing 99.85 parts by mass of this slurry, 0.15 parts by mass of phenethyltrimethoxysilane as a curing agent and 400 parts by mass of non-aqueous solvent (9:1 combined solvent of isopropanol and ethylene glycol) which had already been subjected to a dehydration process using MOLECULAR SIEVES 3A 1/8 (Wako Pure Chemical Industries, Ltd.), a hole injection layer coating solution having a solid content of 20% by mass was prepared.

—Preparation of Organic Electroluminescence Elements M to R and Organic Electroluminescence Elements e and f—

Indium Tin Oxide (ITO) was sputter-deposited on a glass substrate, measuring 25 mm by 25 mm and a thickness of 0.7 mm to form an anode having a thickness of 150 nm, which was then etched and washed. The substrate with a film of ITO was placed in a washing container for ultrasonic clean-

TABLE 4

| Organic electro-luminescence element | Host material | Light-emitting material | Size ratio | Order parameter | Relative external quantum efficiency | Luminance half-life |
|---|---|---|---|---|---|---|
| Example 25 | G | 1 | 1 | 1.06 | 0.7 | 1.3 | 1.3 |
| Example 26 | H | 1 | 4 | 1.06 | 0.66 | 1.2 | 1.2 |
| Example 27 | I | 4 | 1 | 1.01 | 0.74 | 1.4 | 1.5 |
| Example 28 | J | 5 | 1 | 1.02 | 0.73 | 1.4 | 2.3 |
| Example 29 | K | 6 | 16 | 0.96 | 0.62 | 1.4 | 3.2 |
| Example 30 | L | 6 | 23 | 0.92 | 0.64 | 1.7 | 6.3 |
| Comp. Ex. 21 | c | 2 | 1 | 1.55 | 0.38 | 1 | 1 |
| Comp. Ex. 22 | d | 1 | Comp. 2 | 0.43 | 0.42 | 1 | 0.9 |

As it is understood from Table 4, compared to Organic Electroluminescence Elements c and d as comparative examples, Organic Electroluminescence Elements G to L of the present invention were superior in view of external quantum efficiency and element durability (luminance half-life).

Examples 31 to 36 and Comparative Examples 23 and 24

Synthesis of Hole Injection Layer (PEDOT/NAFION) Coating Solution

First, 60 g of aqueous colloidal dispersion (5.0%) of NAFION® (DE521), 240 g of deionized water and 1.0 g of sodium persulfate were weighed and placed in a 500-mL separable flask, which was agitated for 1 hour with N2 flow. Then, 350 μg of ferric sulfate(III) n-hydrates (091-02832, manufactured by Wako Pure Chemical Industries, Ltd.) was added. Further, 1.5 g of 3,4-ethylenedioxythiophene was added and agitated for 4 hours.

Then, 10 g of an ion-exchange resin, LEWATIT® 5100 (manufactured by LANXESS K.K.) and 10 g of an ioning in 2-propanol and then subjected to UV-ozone treatment for 30 minutes. On this glass substrate, the following layers were respectively formed.

Then, the hole injection layer coating solution was spin-coated on the anode (ITO), which was dried at 200° C. for 30 minutes to form a hole injection layer having a thickness of 40 nm. Here, the spin-coating and drying were performed in a glove box (dew point: −60° C.; oxygen concentration: 1 ppm).

Then, 4 parts by mass of Compound B represented by the structural formula below (HTL-1 described in US 2008/0220265 A1) was dissolved in 996 parts by mass of 2-butanone for electronic industries (manufactured by Kanto Chemical Co., Inc.) to prepare a hole transporting layer coating solution. This hole transporting layer coating solution was spin-coated on the hole injection layer and dried at 150° C. for 30 minutes to form a hole transporting layer having a thickness of 10 nm.

Then, 9 parts by mass of the compound shown in Table 5 as a host material and 1 part by mass of the compound shown in Table 5 as a light-emitting material were dissolved or dispersed in 990 parts by mass of THF (solvent), to which molecular sieves (trade name: MOLECULAR SIEVES 3A 1/16, manufactured by Wako Pure Chemical Industries, Ltd.) were then added. This was then filtered using a syringe filter having a pore diameter of 0.22 μm in a glove box to prepare a light-emitting layer coating solution. The coating solution was spin-coated on a hole transporting layer and dried at 100° C. for 30 minutes to form a light-emitting layer having a thickness of 30 nm.

Then, BAlq bis-(2-methyl-8-quinolinolato)-4-(phenyl-phenolato)-aluminum(III)) was vapor-deposited on the light-emitting layer to form an electron transporting layer having a thickness of 40 nm.

Then, lithium fluoride (LiF) was vapor-deposited on the electron transporting layer to form an electron injection layer having a thickness of 1 nm.

Then, metallic aluminum was vapor-deposited on the electron injection layer to form a cathode having a thickness of 70 nm.

A laminated body prepared as above was placed in a glove box purged with argon gas and was sealed with a stainless-steel sealing can and an ultraviolet cure adhesive (XNR5516HV, manufactured by Nagase-CIBA Ltd.).

Organic Electroluminescence Elements M to R as well as Organic Electroluminescence Elements e and f prepared as above were evaluated similarly to Example 19. The results are shown in Table 5.

TABLE 5

| Organic electro-luminescence element | Host material | Light-emitting material | Size ratio | Order parameter | Relative external quantum efficiency | Luminance half-life |
|---|---|---|---|---|---|---|
| Example 31 | M | 1 | 1 | 1.06 | 0.7 | 1.3 | 1.3 |
| Example 32 | N | 1 | 4 | 1.06 | 0.66 | 1.2 | 1.2 |
| Example 33 | O | 4 | 1 | 1.01 | 0.74 | 1.4 | 1.6 |
| Example 34 | P | 5 | 1 | 1.02 | 0.73 | 1.3 | 2.3 |
| Example 35 | Q | 6 | 16 | 0.96 | 0.62 | 1.4 | 3.1 |
| Example 36 | R | 6 | 23 | 0.92 | 0.64 | 1.7 | 6.1 |
| Comp. Ex. 23 | e | 2 | 1 | 1.55 | 0.38 | 1 | 1 |
| Comp. Ex. 24 | f | 1 | Comp. 2 | 0.43 | 0.42 | 0.8 | 0.7 |

As it is understood from Table 5, compared to Organic Electroluminescence Elements e and f as comparative examples, Organic Electroluminescence Elements M to R of the present invention were superior in view of external quantum efficiency and element durability (luminance half-life).

INDUSTRIAL APPLICABILITY

A material for organic electroluminescence element of the present invention is able to support high light extraction efficiency, high luminous efficiency, high polarized emission ratio and high luminescent quantum yield at the same time. Thus, it may be preferably used for display element, display, backlight, electrophotography, illumination light source, recording light source, exposure light source, reading light source, indicator, signboard, interior decoration and optical communication.

An organic electroluminescence element of the present invention is able to support high light extraction efficiency, high luminous efficiency, high polarized emission ratio and high luminescent quantum yield at the same time since it includes the material for organic electroluminescence element in a light-emitting layer. Thus, it may be preferably used for display element, display, backlight, electrophotography, illumination light source, recording light source, exposure light source, reading light source, indicator, signboard, interior decoration and optical communication.

REFERENCE SIGNS LIST

1 Substrate
2 Anode
3 Hole injection layer
4 Hole transporting layer
5 Light-emitting layer
6 Electron transporting layer
7 Electron injection layer
8 Cathode
10 Organic electroluminescence element

The invention claimed is:

1. A material for organic electroluminescence element, comprising:
   a phosphorescent compound; and
   a discotic liquid-crystalline host compound,
   wherein the phosphorescent compound has an aspect ratio of molecule core diameter to molecule core thickness (molecule core diameter/molecule core thickness) of at least 3, and
   wherein a size ratio of a molecular radius of the phosphorescent compound to a molecular radius of the discotic liquid-crystalline host compound (molecular radius of the phosphorescent compound/molecular radius of the discotic liquid-crystalline host compound) is 0.8 to 1.2,
   wherein the discotic liquid-crystalline host compound is capable of developing a discotic-nematic liquid-crystalline phase; and
   wherein the discotic liquid-crystalline host compound is represented by General Formula (1):

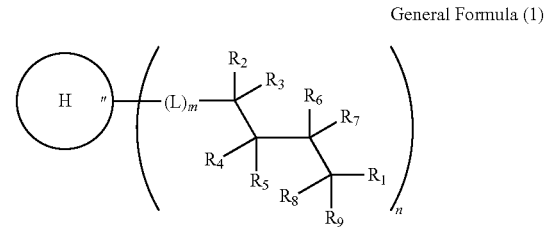

General Formula (1)

wherein H represents a mother nucleus portion of liquid crystal; L represents a divalent linking group; $R_1$ to $R_9$ represent a hydrogen atom or a substituent; n represents an integer of 1 to 12; and m represents an integer of 0 to 3;

and wherein the mother nucleus portion of liquid crystal is represented by one of General Formula (H-1) to (H-3)

General Formula (H-1)

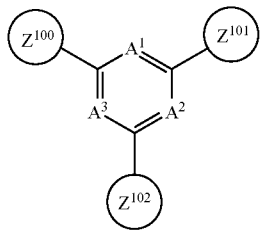

wherein in General Formula (H-1), $Z^{100}$ to $Z^{102}$ each independently represents an aromatic ring containing substituted or unsubstituted five-membered or six-membered ring, and $A^1$ to $A^3$ each independently represents a carbon atom or a nitrogen atom;

General Formula (H-2)

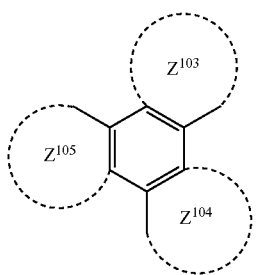

wherein in General Formula (H-2), $Z^{103}$ to $Z^{105}$ each independently optionally represents an aromatic ring containing substituted or unsubstituted five-membered or six-membered ring;

General Formula (H-3)

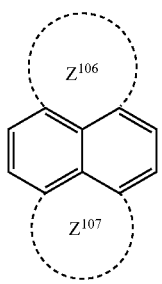

wherein in General Formula (H-3), $Z^{106}$ to $Z^{107}$ each independently optionally represents an aromatic ring containing substituted or unsubstituted five-membered or six-membered ring.

2. The material for organic electroluminescence element according to claim 1, wherein the phosphorescent compound is a platinum complex.

3. The material for organic electroluminescence element according to claim 1, wherein the phosphorescent compound is at least any one compound represented by any one selected from Structural Formulae (1) to (5):

Structural Formula (1)

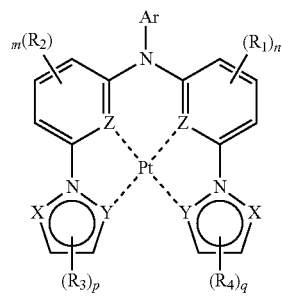

where, in Structural Formula (1), each of X, Y and Z represents a carbon atom or a nitrogen atom; at least one of Z and Y is a nitrogen atom, and X is a carbon atom when Y is a nitrogen atom; each of m, n, p and q represents an integer of 0 to 3; $R_1$ to $R_4$ represent any one of an alkyl group, an aryl group, an alkoxy group, an aryloxy group, a fluorine atom, a cyano group, a silyl group and a heterocyclic group; when m, n, p or q is two or more, neighboring $R_1$, $R_2$, $R_3$ or $R_4$ may connect to each other to form a ring structure; and Ar represents a substituted or unsubstituted aryl group, Structural Formula (2)

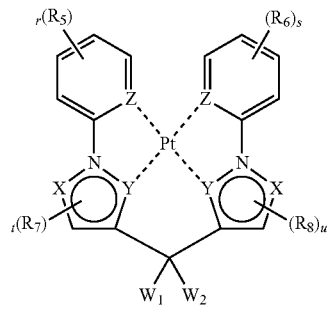

where, in Structural Formula (2), each of X, Y and Z represents any one of a carbon atom and a nitrogen atom; at least one of Z and Y is a nitrogen atom, and X is a carbon atom when Y is a nitrogen atom; each of r, s, t and u represents an integer of 0 to 3; $R_5$ to $R_8$ represent any one of an alkyl group, an aryl group, an alkoxy group, an aryloxy group, a fluorine atom, a cyano group, a silyl group and a heterocyclic group; when r, s, t or u is two or more, neighboring $R_5$, $R_6$, $R_7$ or $R_8$ may connect to each other to form a ring structure; and $W_1$ and $W_2$ represent an alkyl group and may bind with each other to form a ring structure, Structural Formula (3)

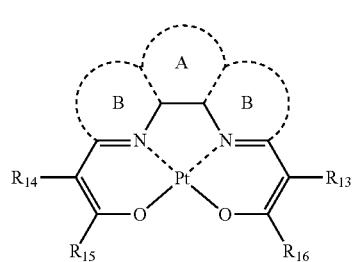

where, in Structural Formula (3), at least one of A and B represents a ring structure; when A forms a ring, B may or may not form a ring; when A does not form a ring, B forms a ring; when A forms a ring, A represents any one of an aromatic ring and a hetero ring, and when B forms a ring, B represents any one of a hetero ring and a heteroaryl; $R_{13}$ to $R_{16}$ represent any one of a hydrogen atom, an alkyl group, an aryl group, a silyl group and a heterocyclic ring; and $R_{14}$ and $R_{15}$, or $R_{13}$ and $R_{16}$, may bind with each other to form a ring structure;

Structural Formula (4)

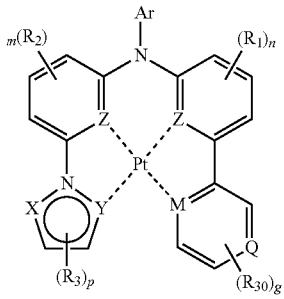

where, in Structural Formula (4), $R_1$ to $R_3$, X, Y, Z, Ar, m, n and p are synonymous to those in Structural Formula (1); M and Q independently represent any one of a carbon atom and a nitrogen atom; $R_{30}$ represents any one of an alkyl group, an aryl group, an alkoxy group, an aryloxy group, a fluorine atom, a cyano group, a silyl group and a heterocyclic group; and g represents an integer of 0 to 3, Structural Formula (5)

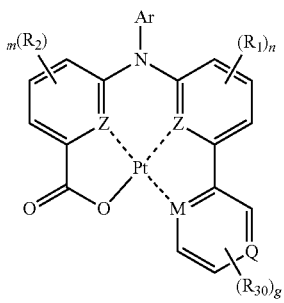

where, in Structural Formula (5), $R_1$ to $R_2$, Z, Ar, m and n are synonymous to those in Structural Formula (1), and M, Q, $R_{30}$ and g are synonymous to those in Structural Formula (4).

4. The material for organic electroluminescence element according to claim 1, wherein the phosphorescent compound is represented by Structural Formula (6):

Structural Formula (6)

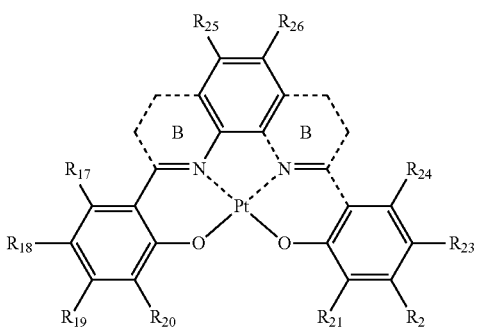

where, in Structural Formula (6), B optionally forms any one of an aromatic ring and non-aromatic six-membered ring; $R_{17}$ to $R_{26}$ represent any one of an alkyl group, an aryl group, an alkoxy group, an aryloxy group, a fluorine atom, a cyano group, a silyl group and a heterocyclic group; $R_{17}$ and $R_{18}$, or $R_{18}$ and $R_{19}$, or $R_{19}$ and $R_{20}$, or $R_{21}$ and $R_{22}$, or $R_{22}$ and $R_{23}$, or $R_{23}$ and $R_{24}$, or $R_{25}$ and $R_{26}$, may bind with each other to form a ring structure.

5. An organic electroluminescence element, comprising:
an anode,
a cathode, and
a light-emitting layer between the anode and the cathode,
wherein the light-emitting layer comprises the material for organic electroluminescence element according to claim 1,
wherein the phosphorescent compound has a transition dipole moment oriented horizontally with respect to the anode.

6. The organic electroluminescence element according to claim 5, wherein the light-emitting layer comprises a fluorine atom containing compound, wherein the amount of the fluorine atom containing compound in the light-emitting layer is 0.0001% by mass to 10% by mass.

7. The organic electroluminescence element according to claim 6, wherein the fluorine atom containing compound comprises 3 or more alkyl groups or acyl groups each having 4 or more fluorine atoms.

8. The organic electroluminescence element according to claim 6, wherein the fluorine atom containing compound is represented by any one of Structural Formulae (A) and (B):

Structural Formula (A)

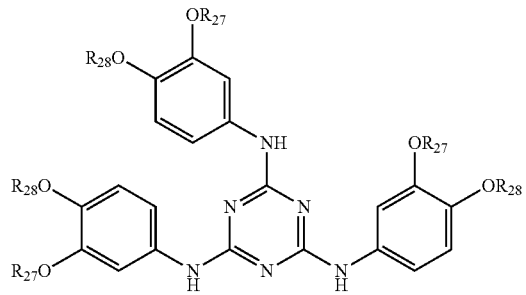

where, in Structural Formula (A), $R_{27}$ and $R_{28}$ independently represent a substituted or unsubstituted alkyl group having 4 or more fluorine atoms, Structural Formula (B)

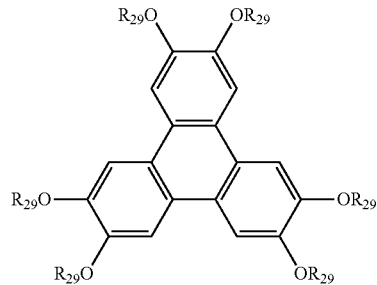

where, in Structural Formula (B), $R_{29}$ represents any one of a substituted or unsubstituted alkyl group and an acyl group each having 4 or more fluorine atoms.

9. A method for manufacturing an organic electroluminescence element, comprising:
forming a light-emitting layer by a solution method using the material for organic electroluminescence element according to claim 1.

10. A material for organic electroluminescence element, comprising:
a phosphorescent compound; and
a discotic liquid-crystalline host compound, wherein the discotic liquid-crystalline host compound is capable of developing a discotic-nematic liquid-crystalline phase,
wherein the phosphorescent compound has an aspect ratio of molecule core diameter to molecule core thickness (molecule core diameter/molecule core thickness) of at least 3, and
wherein a size ratio of a molecular radius of the phosphorescent compound to a molecular radius of the discotic liquid-crystalline host compound (molecular radius of the phosphorescent compound/molecular radius of the discotic liquid-crystalline host compound) is 0.8 to 1.2; and
wherein the phosphorescent compound is at least any one compound represented by any one selected from Structural Formulae (1) to (5):

Structural Formula (1)

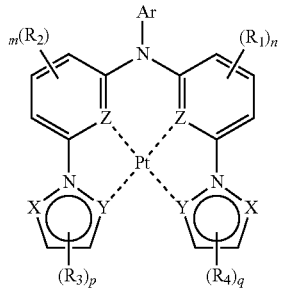

where, in Structural Formula (1), each of X, Y and Z represents a carbon atom or a nitrogen atom; at least one of Z and Y is a nitrogen atom, and X is a carbon atom when Y is a nitrogen atom; each of m, n, p and q represents an integer of 0 to 3; $R_1$ to $R_4$ represent any one of an alkyl group, an aryl group, an alkoxy group, an aryloxy group, a fluorine atom, a cyano group, a silyl group and a heterocyclic group; when m, n, p or q is two or more, neighboring $R_1$, $R_2$, $R_3$ or $R_4$ may connect to each other to form a ring structure; and Ar represents a substituted or unsubstituted aryl group, Structural Formula (2)

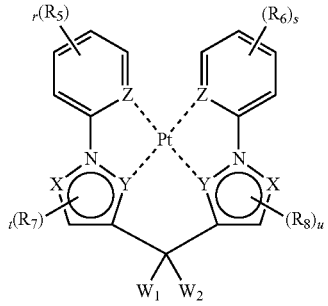

where, in Structural Formula (2), each of X, Y and Z represents any one of a carbon atom and a nitrogen atom; at least one of Z and Y is a nitrogen atom, and X is a carbon atom when Y is a nitrogen atom; each of r, s, t and u represents an integer of 0 to 3; $R_5$ to $R_8$ represent any one of an alkyl group, an aryl group, an alkoxy group, an aryloxy group, a fluorine atom, a cyano group, a silyl group and a heterocyclic group; when r, s, t or u is two or more, neighboring $R_5$, $R_6$, $R_7$ or $R_8$ may connect to each other to form a ring structure; and $W_1$ and $W_2$ represent an alkyl group and may bind with each other to form a ring structure, Structural Formula (3)

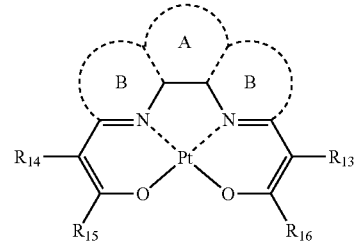

where, in Structural Formula (3), at least one of A and B represents a ring structure; when A forms a ring, B may or may not form a ring; when A does not form a ring, B forms a ring; when A forms a ring, A represents any one of an aromatic ring and a hetero ring, and when B forms a ring, B represents any one of a hetero ring and a heteroaryl; $R_{13}$ to $R_{16}$ represent any one of a hydrogen atom, an alkyl group, an aryl group, a silyl group and a heterocyclic ring; and $R_{14}$ and $R_{15}$, or $R_{13}$ and $R_{16}$, may bind with each other to form a ring structure;

Structural Formula (4)

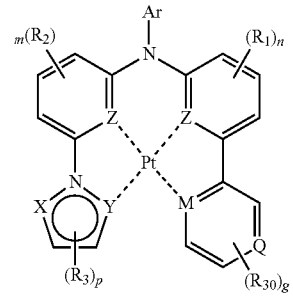

where, in Structural Formula (4), $R_1$ to $R_3$, X, Y, Z, Ar, m, n and p are synonymous to those in Structural Formula (1); M and Q independently represent any one of a carbon atom and a nitrogen atom; $R_{30}$ represents any one of an alkyl group, an aryl group, an alkoxy group, an aryloxy group, a fluorine atom, a cyano group, a silyl group and a heterocyclic group; and g represents an integer of 0 to 3, Structural Formula (5)

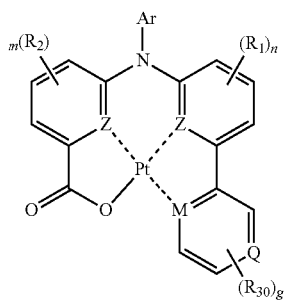

Structural Formula (6)

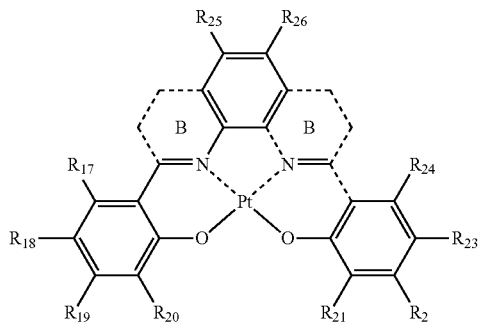

where, in Structural Formula (5), $R_1$ to $R_2$, Z, Ar, m and n are synonymous to those in Structural Formula (1), and M, Q, $R_{30}$ and g are synonymous to those in Structural Formula (4).

11. The material for organic electroluminescence element according to claim 10, wherein the phosphorescent compound is represented by Structural Formula (6):

where, in Structural Formula (6), B optionally forms any one of an aromatic ring and non-aromatic six-membered ring; $R_{17}$ to $R_{26}$ represent any one of an alkyl group, an aryl group, an alkoxy group, an aryloxy group, a fluorine atom, a cyano group, a silyl group and a heterocyclic group; $R_{17}$ and $R_{18}$, or $R_{18}$ and $R_{19}$, or $R_{19}$ and $R_{20}$, or $R_{21}$ and $R_{22}$, or $R_{22}$ and $R_{23}$, or $R_{23}$ and $R_{24}$, or $R_{25}$ and $R_{26}$, may bind with each other to form a ring structure.

* * * * *